(12) United States Patent
Yeh et al.

(10) Patent No.: US 12,148,684 B2
(45) Date of Patent: Nov. 19, 2024

(54) PACKAGE STRUCTURE AND METHOD

(71) Applicant: Taiwan Semiconductor Manufacturing Co., Ltd., Hsinchu (TW)

(72) Inventors: Shu-Shen Yeh, Taoyuan (TW); Che-Chia Yang, Taipei (TW); Chin-Hua Wang, New Taipei (TW); Chia-Kuei Hsu, Hsinchu (TW); Po-Yao Lin, Zhudong Township (TW); Shin-Puu Jeng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 176 days.

(21) Appl. No.: 17/126,598

(22) Filed: Dec. 18, 2020

(65) Prior Publication Data
US 2022/0037243 A1     Feb. 3, 2022

Related U.S. Application Data

(60) Provisional application No. 63/059,228, filed on Jul. 31, 2020.

(51) Int. Cl.
*H01L 23/498* (2006.01)
*H01L 21/48* (2006.01)
*H01L 23/00* (2006.01)

(52) U.S. Cl.
CPC .... *H01L 23/49822* (2013.01); *H01L 21/4857* (2013.01); *H01L 24/16* (2013.01); *H01L 2224/16227* (2013.01)

(58) Field of Classification Search
CPC ......... H01L 2224/023–024; H01L 2224/0235; H01L 2224/02372; H01L 2224/02373;
(Continued)

(56) References Cited

U.S. PATENT DOCUMENTS

| 8,361,842 B2 | 1/2013 | Yu et al. |
| 8,680,647 B2 | 3/2014 | Yu et al. |

(Continued)

FOREIGN PATENT DOCUMENTS

| CN | 1276090 A | 12/2000 |
| CN | 101211914 A | 7/2008 |

(Continued)

OTHER PUBLICATIONS

Wikipedia, "Oval", Oct. 18, 2022, 4 pages.

*Primary Examiner* — Younes Boulghassoul
*Assistant Examiner* — Quinton A Brasfield
(74) *Attorney, Agent, or Firm* — Slater Matsil, LLP

(57) ABSTRACT

A package structure and a method of forming the same are provided. The package structure includes an integrated circuit die and a redistribution structure bonded to the integrated circuit die. The redistribution structure includes a first insulating layer, a second insulating layer interposed between the first insulating layer and the integrated circuit die, and a first metallization pattern in the first insulating layer and the second insulating layer. The first metallization pattern includes a first conductive line and a first conductive via coupled to the first conductive line. The first conductive line is in the second insulating layer. The first conductive via is in the first insulating layer. The first conductive line includes a first conductive pad coupled to the first conductive via, a second conductive pad, and a curved portion connecting the first conductive pad to the second conductive pad.

20 Claims, 38 Drawing Sheets

(58) Field of Classification Search
CPC ........... H01L 23/49822; H01L 23/5383; H01L 2224/0401; H01L 2224/0501; H01L 2224/05012; H01L 2224/05015; H01L 2224/0555; H01L 2224/05552; H01L 24/04–09; H01L 23/49838–49844; H01L 23/5386

See application file for complete search history.

(56) References Cited

U.S. PATENT DOCUMENTS

| | | |
|---|---|---|
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,640,498 B1 | 5/2017 | Huang et al. |
| 9,741,690 B1 | 8/2017 | Hsieh et al. |
| 9,773,753 B1 * | 9/2017 | Lin ................... H01L 24/20 |
| 9,812,414 B1 | 11/2017 | Lin |
| 10,062,648 B2 | 8/2018 | Hsieh et al. |
| 10,157,871 B1 | 12/2018 | Yu et al. |
| 10,204,852 B2 | 2/2019 | Hsu et al. |
| 10,475,768 B2 | 11/2019 | Hsieh et al. |
| 10,522,488 B1 | 12/2019 | Chen et al. |
| 10,566,288 B2 | 2/2020 | Kao et al. |
| 10,629,560 B2 | 4/2020 | Chen et al. |
| 11,101,209 B2 * | 8/2021 | Liu ................... H01L 23/3157 |
| 11,264,359 B2 | 3/2022 | Hsu et al. |
| 11,508,656 B2 | 11/2022 | Pan et al. |
| 11,508,695 B2 | 11/2022 | Hsieh et al. |
| 11,527,474 B2 | 12/2022 | Tsai et al. |
| 2004/0040855 A1 | 3/2004 | Batinovich |
| 2005/0046041 A1 | 3/2005 | Tsai |
| 2006/0076679 A1 | 4/2006 | Batchelor et al. |
| 2007/0182004 A1 | 8/2007 | Rinne |
| 2008/0157913 A1 | 7/2008 | Kim |
| 2009/0184424 A1 | 7/2009 | Furusawa et al. |
| 2009/0278263 A1 | 11/2009 | McCarthy et al. |
| 2011/0291288 A1 | 12/2011 | Wu et al. |
| 2012/0286416 A1 | 11/2012 | Sato et al. |
| 2013/0009307 A1 | 1/2013 | Lu et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0207241 A1 | 8/2013 | Lee et al. |
| 2013/0280861 A1 | 10/2013 | Ma et al. |
| 2013/0307140 A1 | 11/2013 | Huang et al. |
| 2014/0021600 A1 | 1/2014 | Daubenspeck et al. |
| 2014/0124940 A1 * | 5/2014 | Bhagavat ............... H01L 24/05 257/773 |
| 2014/0203429 A1 | 7/2014 | Yu et al. |
| 2014/0225222 A1 | 8/2014 | Yu et al. |
| 2014/0252594 A1 | 9/2014 | Meng et al. |
| 2014/0252646 A1 | 9/2014 | Hung et al. |
| 2014/0264930 A1 | 9/2014 | Yu et al. |
| 2015/0123266 A1 | 5/2015 | Wu et al. |
| 2015/0125993 A1 | 5/2015 | Lee et al. |
| 2015/0162256 A1 | 6/2015 | Hsu et al. |
| 2015/0228594 A1 | 8/2015 | Alvarado et al. |
| 2016/0141213 A1 | 5/2016 | Bishop et al. |
| 2016/0163578 A1 | 6/2016 | Yu et al. |
| 2017/0005054 A1 | 1/2017 | Chiu et al. |
| 2017/0062383 A1 * | 3/2017 | Yee ................... H01L 23/3675 |
| 2017/0125317 A1 | 5/2017 | Kuo et al. |
| 2017/0250138 A1 | 8/2017 | Hsieh et al. |
| 2018/0012837 A1 | 1/2018 | Chen et al. |
| 2018/0068978 A1 * | 3/2018 | Jeng ................... H01L 25/50 |
| 2018/0076175 A1 * | 3/2018 | Hsieh ................... H01L 21/56 |
| 2018/0233474 A1 | 8/2018 | Yu et al. |
| 2019/0074195 A1 | 3/2019 | Hu |
| 2019/0115294 A1 | 4/2019 | Lu |
| 2019/0164882 A1 | 5/2019 | Chen et al. |
| 2019/0189552 A1 | 6/2019 | Kelly et al. |
| 2019/0326241 A1 | 10/2019 | Chen et al. |
| 2019/0333862 A1 | 10/2019 | Wang et al. |
| 2020/0006220 A1 | 1/2020 | Pan et al. |
| 2020/0043842 A1 | 2/2020 | Kim et al. |
| 2020/0091097 A1 | 3/2020 | Hung et al. |
| 2020/0135677 A1 | 4/2020 | Chang et al. |
| 2020/0176432 A1 | 6/2020 | Huang et al. |
| 2020/0185357 A1 * | 6/2020 | Byun ................... H01L 24/05 |
| 2021/0057352 A1 * | 2/2021 | Agarwal ............ H01L 21/4857 |
| 2021/0134750 A1 | 5/2021 | Manack et al. |

FOREIGN PATENT DOCUMENTS

| | | | |
|---|---|---|---|
| CN | 102867776 A | 1/2013 | |
| CN | 105720038 A | 6/2016 | |
| CN | 107808870 A | 3/2018 | |
| CN | 109659292 A | 4/2019 | |
| CN | 109671694 A | 4/2019 | |
| CN | 110660753 A | 1/2020 | |
| CN | 111128750 A | 5/2020 | |
| CN | 111128762 A | 5/2020 | |
| EP | 3038150 A1 * | 6/2016 | ........... H01L 21/768 |
| KR | 20150057787 A | 5/2015 | |
| KR | 20180028920 A | 3/2019 | |
| KR | 20200036771 A | 4/2020 | |
| TW | 201618626 A | 5/2016 | |
| TW | 201715681 A | 5/2017 | |
| TW | 201729364 A | 8/2017 | |
| TW | 201916304 A | 4/2019 | |
| TW | 202002110 A | 1/2020 | |

* cited by examiner

PACKAGE STRUCTURE AND METHOD

PRIORITY CLAIM AND CROSS-REFERENCE

This application claims the benefit of U.S. Provisional Application No. 63/059,228, filed on Jul. 31, 2020, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
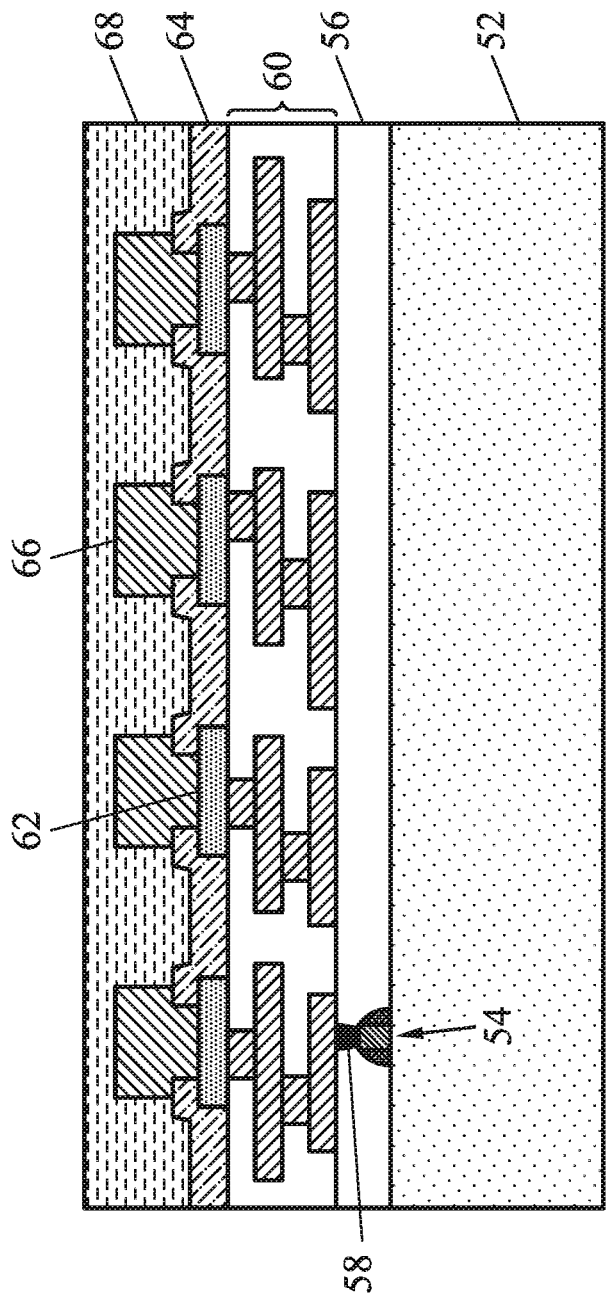
FIG. 1 illustrates a cross-sectional view of an integrated circuit die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Redistribution and under-bump metallization (UBM) structures and methods of forming the same are provided in accordance to some embodiments. In particular, the redistribution structures include metallization patterns with shapes that provide more flexibility for the metallization patterns to deal with bending and other deformations without breaking. Bending and other deformations may be due to stress caused by coefficient of thermal expansion (CTE) mismatch of materials in a semiconductor package. For example, the metallization patterns can have a curved, "C"-like shape or a "U"-like shape in a plan view. These flexibly-shaped metallization patterns are surrounded by conforming dielectric layers, such as polymer layers. The combination of the flexibly-shaped metallization patterns and the surrounding conforming dielectric layers provide a buffer to release the stress in the redistribution structure and the package structure. Furthermore, UBM structures comprise via portions, pad portions and column portions that have shapes and arrangements to reduce stress transmitted to the metallization patterns of redistribution structures from, for example, bumps bonded to UBM structures due to CTE mismatch. For example, widths of the pad portions of UBM structures are greater than widths of corresponding pillar portions of UBM structures. In addition, centers of via portions and column portions of UBM structures are laterally shifted with respect to centers of corresponding pad portions of UBM structures in a plan view. Furthermore, redistribution structures can have stacked vias, such that centers of stacked vias are laterally shifted with respect to centers of corresponding pad portions of UBM structures in a plan view. The CTE mismatch can cause the metallization patterns to endure high stress due to the bending and deformation. However, the disclosed shapes of the metallization patterns, the disclosed arrangements of stacked vias, and the disclosed shapes and arrangements of various components of UBM structures increase the reliability of the redistribution structures. The disclosed shapes and structures of redistribution and UBM structures may be used in interposers, chip-on-wafer-on-substrate (CoWoS) structures, packages, such as integrated fan-out (InFO) packages, or the like.

FIG. 1 illustrates a cross-sectional view of an integrated circuit die 50 in accordance with some embodiments. The integrated circuit die 50 will be packaged in subsequent processing to form an integrated circuit package. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side and an inactive surface (e.g., the surface facing downwards in FIG. 1), sometimes called a back side.

Devices (represented by a transistor) 54 may be formed at the front surface of the semiconductor substrate 52. The devices 54 may be active devices (e.g., transistors, diodes, etc.), capacitors, resistors, etc. An inter-layer dielectric (ILD) 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more low-k dielectric layers. The metallization patterns of the interconnect structure 60 are electrically coupled to the devices 54 by the conductive plugs 58.

The integrated circuit die 50 further includes pads 62, such as aluminum pads, to which external connections are made. The pads 62 are on the active side of the integrated circuit die 50, such as in and/or on the interconnect structure 60. One or more passivation films 64 are on the integrated circuit die 50, such as on portions of the interconnect structure 60 and pads 62. Openings extend through the passivation films 64 to the pads 62. Die connectors 66, such as conductive pillars (for example, formed of a metal such as copper), extend through the openings in the passivation films 64 and are physically and electrically coupled to respective ones of the pads 62. The die connectors 66 may be formed by, for example, plating, or the like. The die connectors 66 electrically couple the respective integrated circuits of the integrated circuit die 50.

Optionally, solder regions (e.g., solder balls or solder bumps) may be disposed on the pads 62. The solder balls may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing and are packaged, and dies, which fail the CP testing, are not packaged. After testing, the solder regions may be removed in subsequent processing steps.

An insulating layer 68 may (or may not) be on the active side of the integrated circuit die 50, such as on the passivation films 64 and the die connectors 66. The insulating layer 68 laterally encapsulates the die connectors 66, and the insulating layer 68 is laterally coterminous with the integrated circuit die 50. Initially, the insulating layer 68 may bury the die connectors 66, such that the topmost surface of the insulating layer 68 is above the topmost surfaces of the die connectors 66. In some embodiments where solder regions are disposed on the die connectors 66, the insulating layer 68 may bury the solder regions as well. Alternatively, the solder regions may be removed prior to forming the insulating layer 68.

The insulating layer 68 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like, or a combination thereof. The insulating layer 68 may be formed, for example, by spin coating, lamination, chemical vapor deposition (CVD), or the like. In some embodiments, the die connectors 66 are exposed through the insulating layer 68 during formation of the integrated circuit die 50. In some embodiments, the die connectors 66 remain buried and are exposed during a subsequent process for packaging the integrated circuit die 50. Exposing the die connectors 66 may remove any solder regions that may be present on the die connectors 66.

In some embodiments, the integrated circuit die 50 is a stacked device that includes multiple semiconductor substrates 52. For example, the integrated circuit die 50 may be a memory device such as a hybrid memory cube (HMC) module, a high bandwidth memory (HBM) module, or the like that includes multiple memory dies. In such embodiments, the integrated circuit die 50 includes multiple semiconductor substrates 52 interconnected by through-substrate vias (TSVs). Each of the semiconductor substrates 52 may (or may not) have an interconnect structure 60.

FIGS. 2 through 11 illustrate cross-sectional views of intermediate steps during a process for forming a package component 100, in accordance with some embodiments. A first package region 100A and a second package region 100B are illustrated, and one or more of the integrated circuit dies 50 are packaged to form an integrated circuit package in each of the package regions 100A and 100B. The integrated circuit packages may also be referred to as integrated fan-out (InFO) packages.

Figure 2:
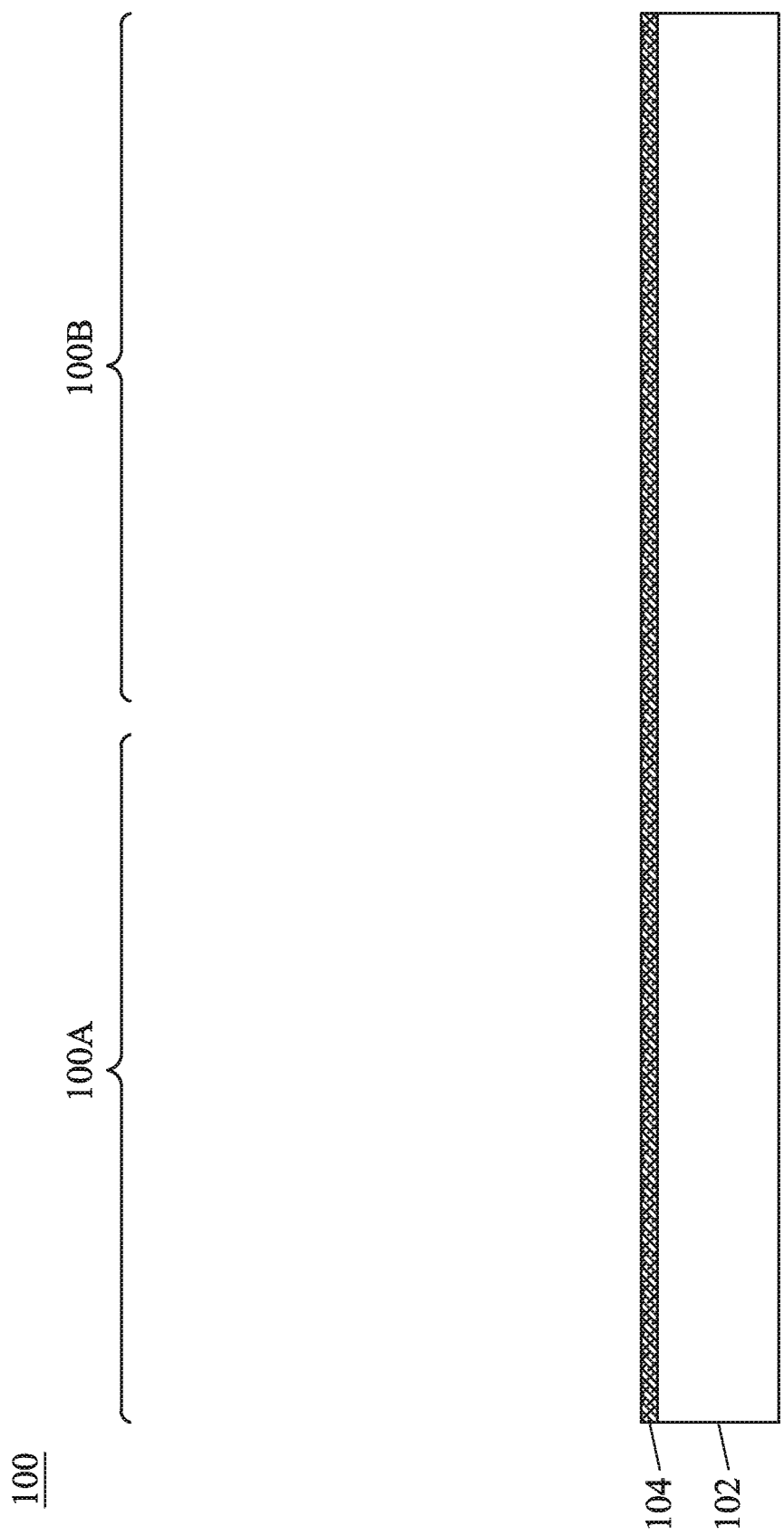
FIGS. 2 through 11 illustrate cross-sectional views of intermediate steps during a process for forming a package component in accordance with some embodiments.

In FIG. 2, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously.

The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

Figure 3:
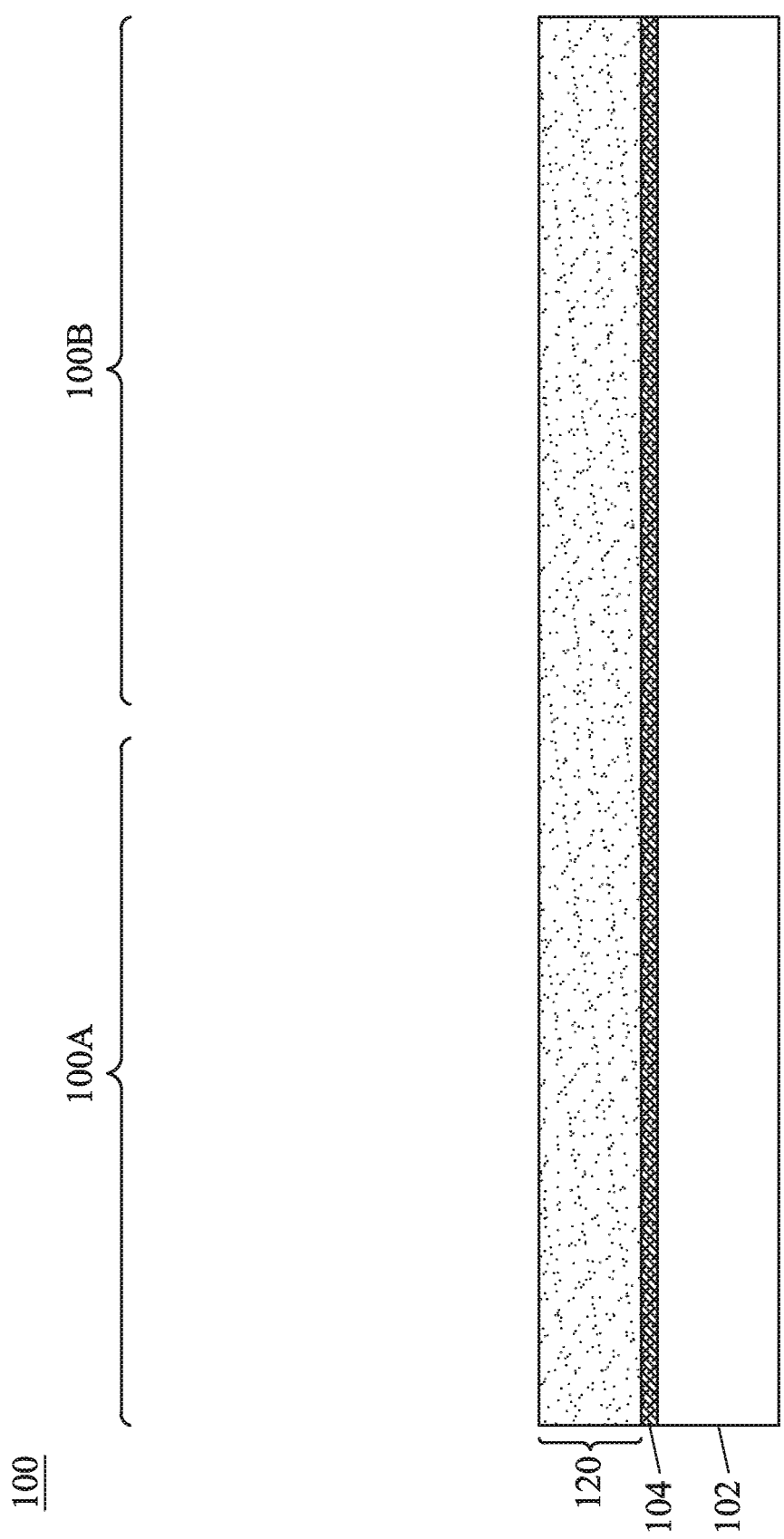

In FIG. 3, a redistribution structure 120 is formed over the release layer 104. The redistribution structure 120 may comprise a plurality of insulating layers and a plurality of metallization patterns (not individually shown) formed in an alternating manner over the release layer 104. In some embodiments, the redistribution structure 120 may be formed as described below with reference to FIGS. 12-15, and the detailed description is provided at that time.

Figure 4:
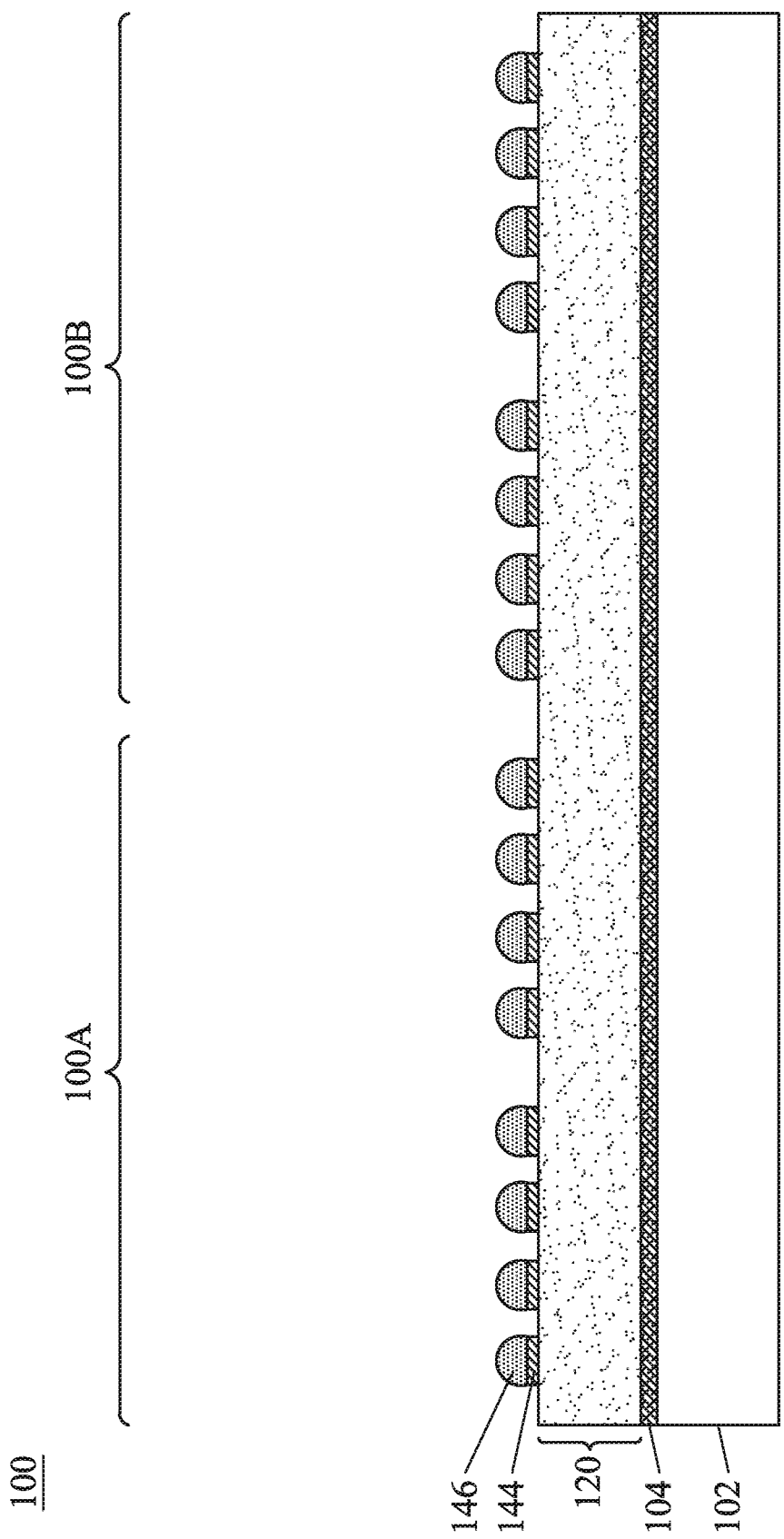

In FIG. 4, under-bump metallization (UBM) structures 144 are formed over and in electrical contact with the redistribution structure 120. In some embodiments, the UBM structures 144 may have via portions extending into the redistribution structure 120, pad portions on and extending along the major surface of the redistribution structure 120, and column portions over the pad portions. In some embodiments, the UBM structures 144 may be formed as described below with reference to FIGS. 15-21, and the detailed description is provided at that time.

After forming the UBM structures 144, conductive connectors 146 are formed on the UBM structures 144. The conductive connectors 146 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 146 may include a conductive material such as solder, copper, aluminum, gold, nickel, silver, palladium, tin, the like, or a combination thereof. In some embodiments, the conductive connectors 146 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 146 comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 5:
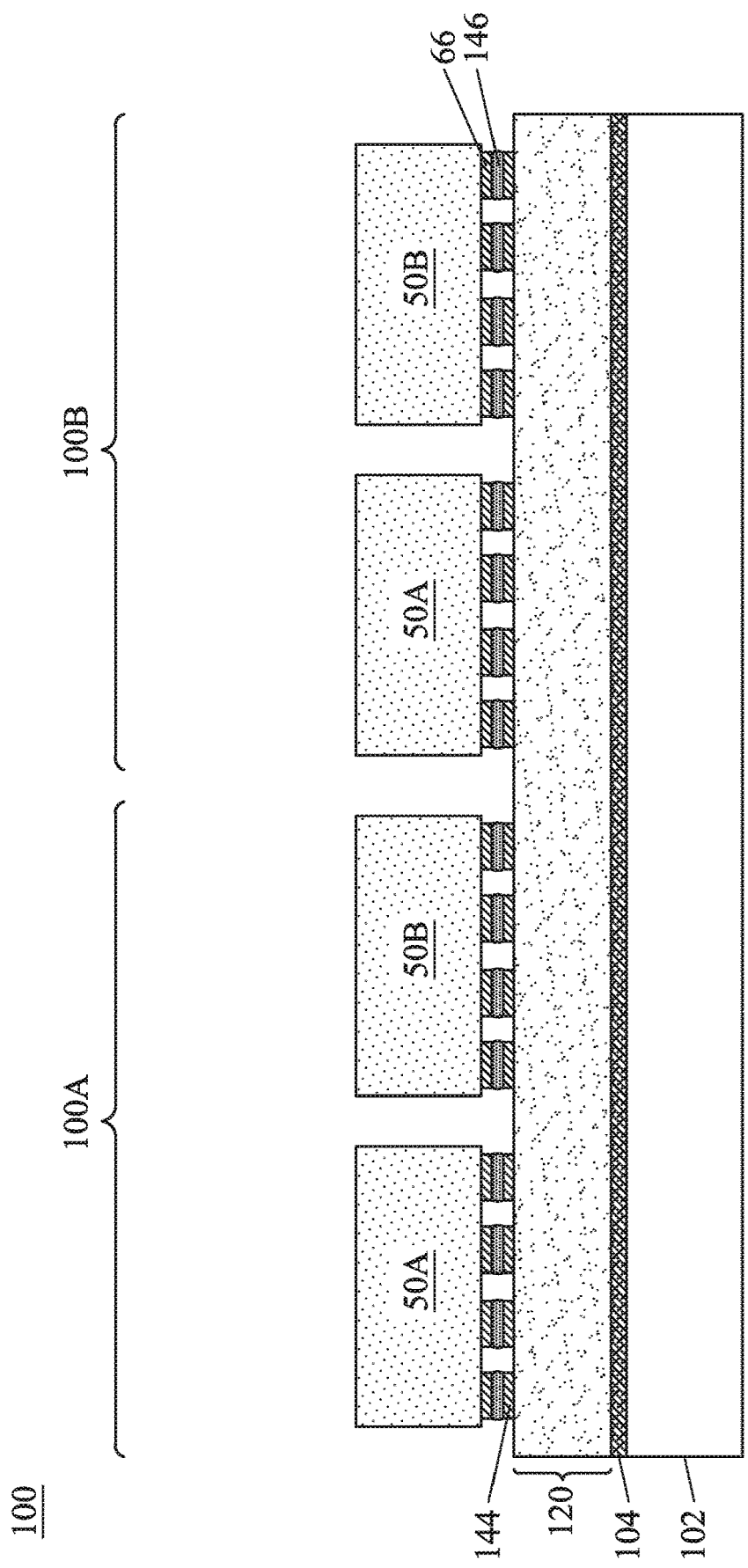

In FIG. 5, integrated circuit dies 50 (e.g., first integrated circuit dies 50A and second integrated circuit dies 50B) are attached to the structure of FIG. 4. A desired type and quantity of integrated circuit dies 50 are adhered in each of the package regions 100A and 100B. The integrated circuit dies 50 may be referred to as package modules 50. In the embodiment shown, multiple integrated circuit dies 50 are adhered adjacent one another, including the first integrated circuit die 50A and the second integrated circuit die 50B in each of the first package region 100A and the second package region 100B. The first integrated circuit die 50A may be a logic device, such as a central processing unit (CPU), a graphics processing unit (GPU), a system-on-a-chip (SoC), a microcontroller, or the like. The second integrated circuit die 50B may be a memory device, such as a dynamic random access memory (DRAM) die, a static random access memory (SRAM) die, a hybrid memory cube (HMC) module, a high bandwidth memory (HBM) module, or the like. In some embodiments, the integrated circuit dies 50A and 50B may be the same type of dies, such as SoC dies. The first integrated circuit die 50A and second integrated circuit die 50B may be formed in processes of a same technology node, or may be formed in processes of different technology nodes. For example, the first integrated circuit die 50A may be of a more advanced process node than the second integrated circuit die 50B. The integrated circuit dies 50A and 50B may have different sizes (e.g., different heights and/or surface areas), or may have the same size (e.g., same heights and/or surface areas).

The integrated circuit dies 50 are attached to the conductive connectors 146. That is, the die connectors 66 of the integrated circuit dies 50A and 50B are connected to the conductive connectors 146. In some embodiments, the conductive connectors 146 are reflowed to attach the integrated circuit dies 50 to the UBM structures 144. The conductive connectors 146 electrically and/or physically couple the redistribution structure 120, including metallization patterns in the redistribution structure 120, to the integrated circuit dies 50. In some embodiments, a solder resist (not shown) is formed on the redistribution structure 120. The conductive connectors 146 may be disposed in openings in the solder resist to be electrically and mechanically coupled to the UBM structures 144. The solder resist may be used to protect areas of the redistribution structure 120 from external damage.

The conductive connectors 146 may have an epoxy flux (not shown) formed thereon before they are reflowed with at least some of the epoxy portion of the epoxy flux remaining after the integrated circuit dies 50 are attached to the redistribution structure 120. This remaining epoxy portion may act as an underfill to reduce stress and protect the joints resulting from reflowing the conductive connectors 146.

Figure 6:
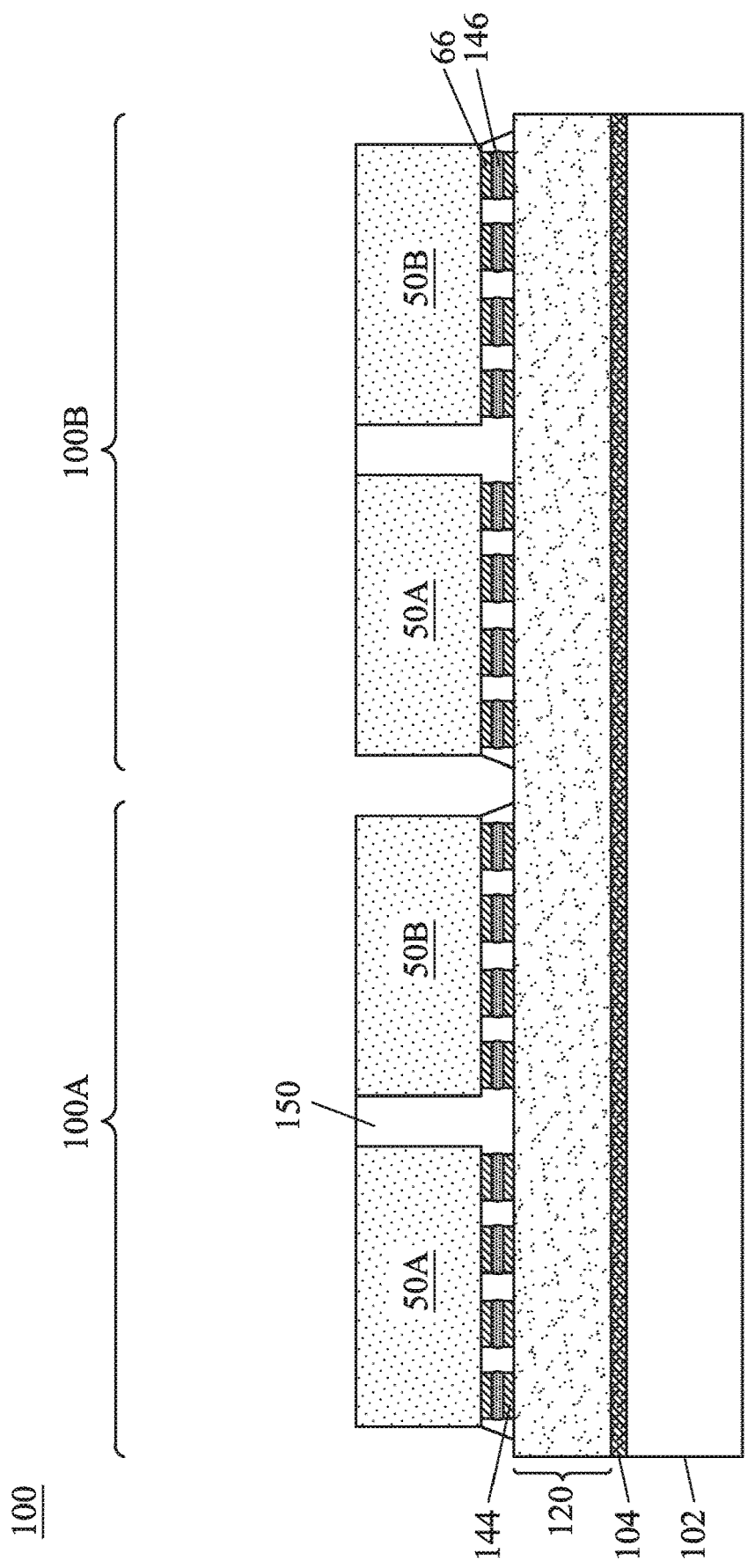

In FIG. 6, an underfill 150 is formed between the integrated circuit dies 50A and 50B in each of the regions 100A and 100B and the redistribution structure 120, including between and around the UBM structures 144, the conductive connectors 146, and the die connectors 66. The underfill 150 may be formed by a capillary flow process after the integrated circuit dies 50 are attached or may be formed by a suitable deposition method before the integrated circuit dies 50 are attached. Although not shown in FIG. 6 and subsequent figures, in some embodiments, the underfill 150 is also between the integrated circuit dies 50 in adjacent regions 100A and 100B.

Figure 7:
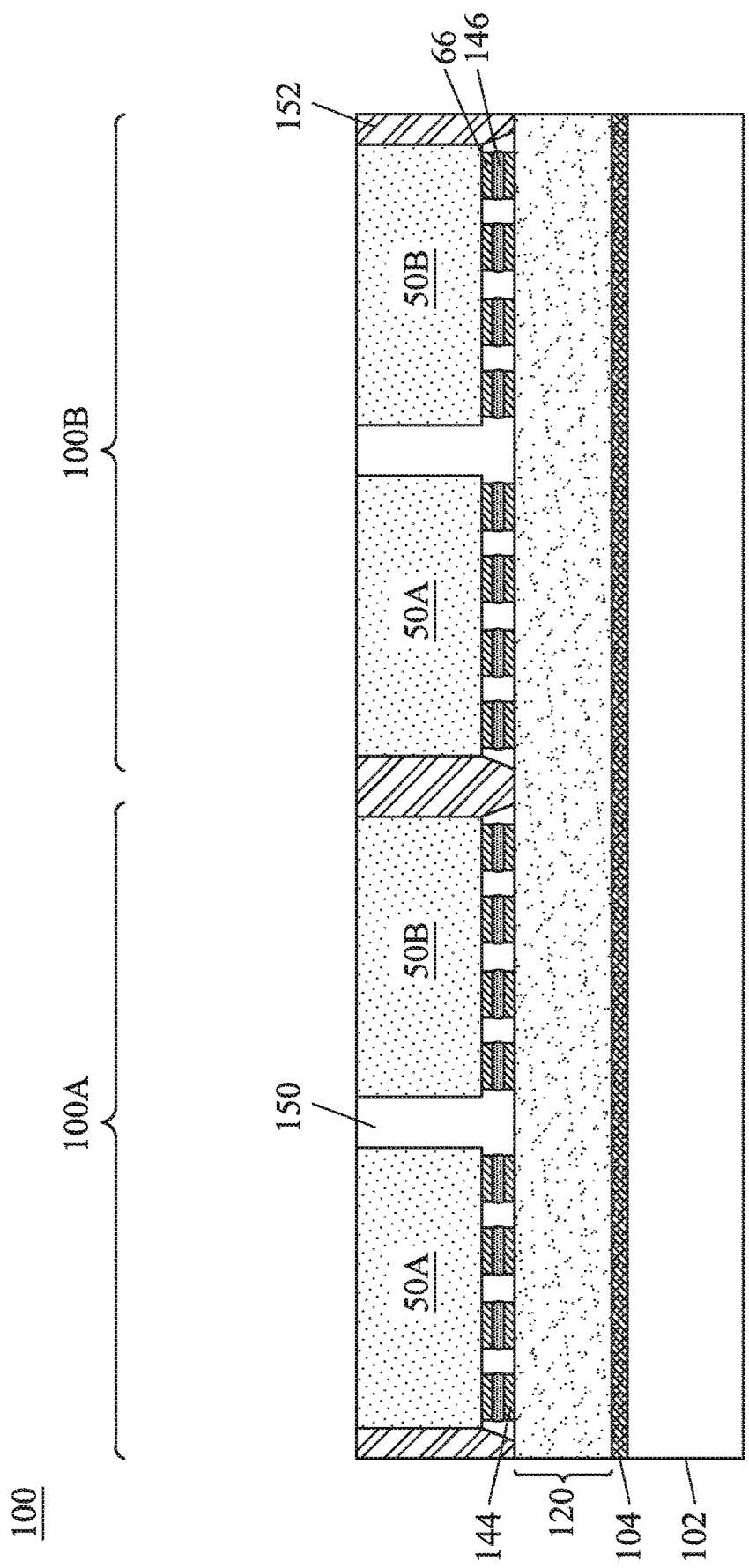

In FIG. 7, an encapsulant 152 is formed around the integrated circuit dies 50 and the underfill 150. After formation, the encapsulant 152 encapsulates the integrated circuit dies 50. The encapsulant 152 may be a molding compound, epoxy, or the like. The encapsulant 152 may be applied by compression molding, transfer molding, or the like. The encapsulant 152 may be applied in liquid or semi-liquid form and then subsequently cured. In some embodiments, a planarization step may be performed to remove and planarize an upper surface of the encapsulant 152. The planarization step may comprise a chemical-mechanical polish (CMP) process, a grinding process, an etching process, the like, or a combination thereof. In some embodiments, surfaces of the underfill 150, the encapsulant 152, and the integrated circuits dies 50 are coplanar (within process variation).

Figure 8:
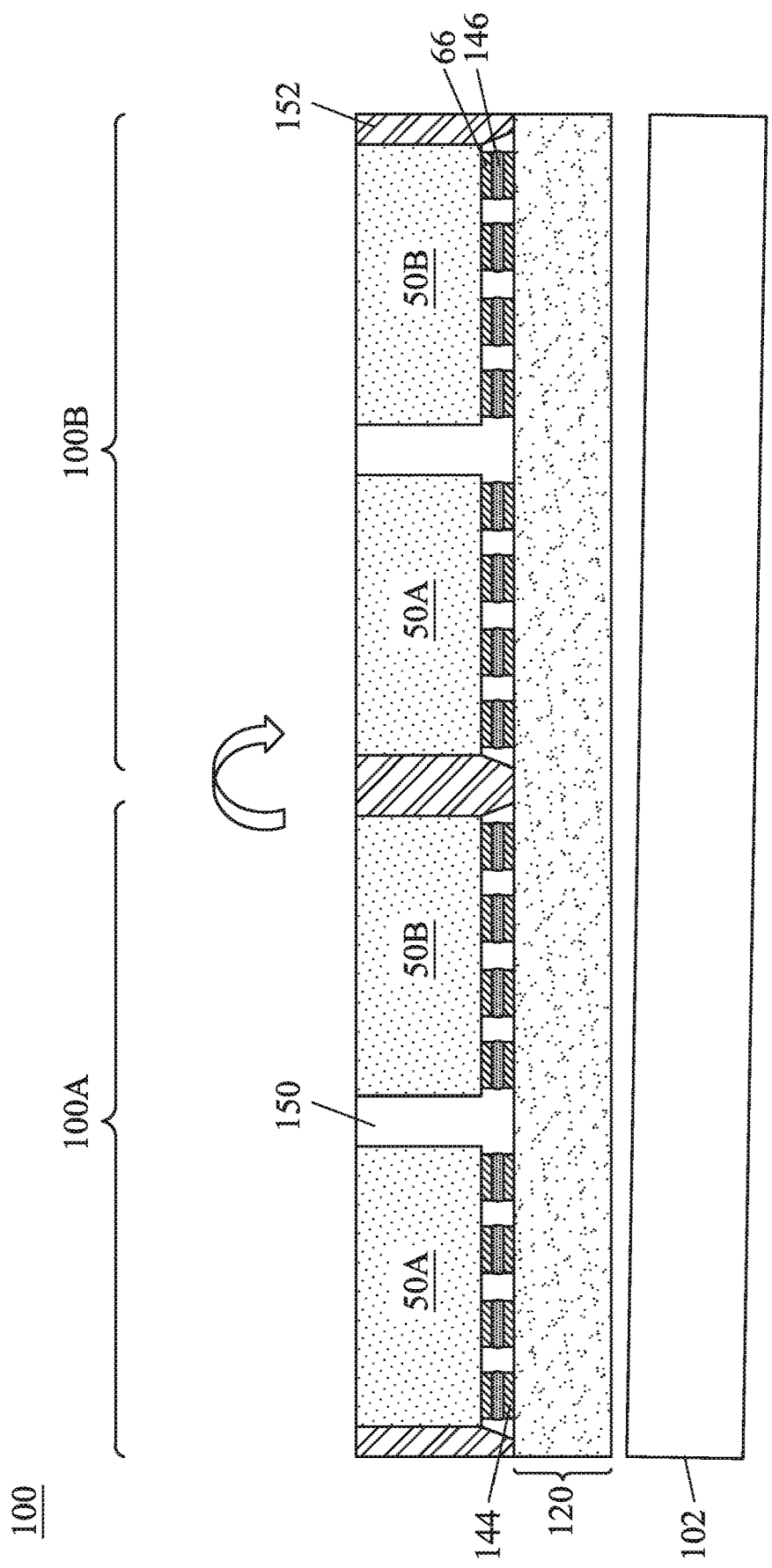

In FIG. 8, a carrier substrate de-bonding is performed to detach (or "de-bond") the carrier substrate 102 from the redistribution structure 120. In accordance with some embodiments, the de-bonding includes projecting a light such as a laser light or an UV light on the release layer 104 so that the release layer 104 decomposes under the heat of the light and the carrier substrate 102 can be removed. The structure is then flipped over and placed on a tape (not shown).

Figure 9:
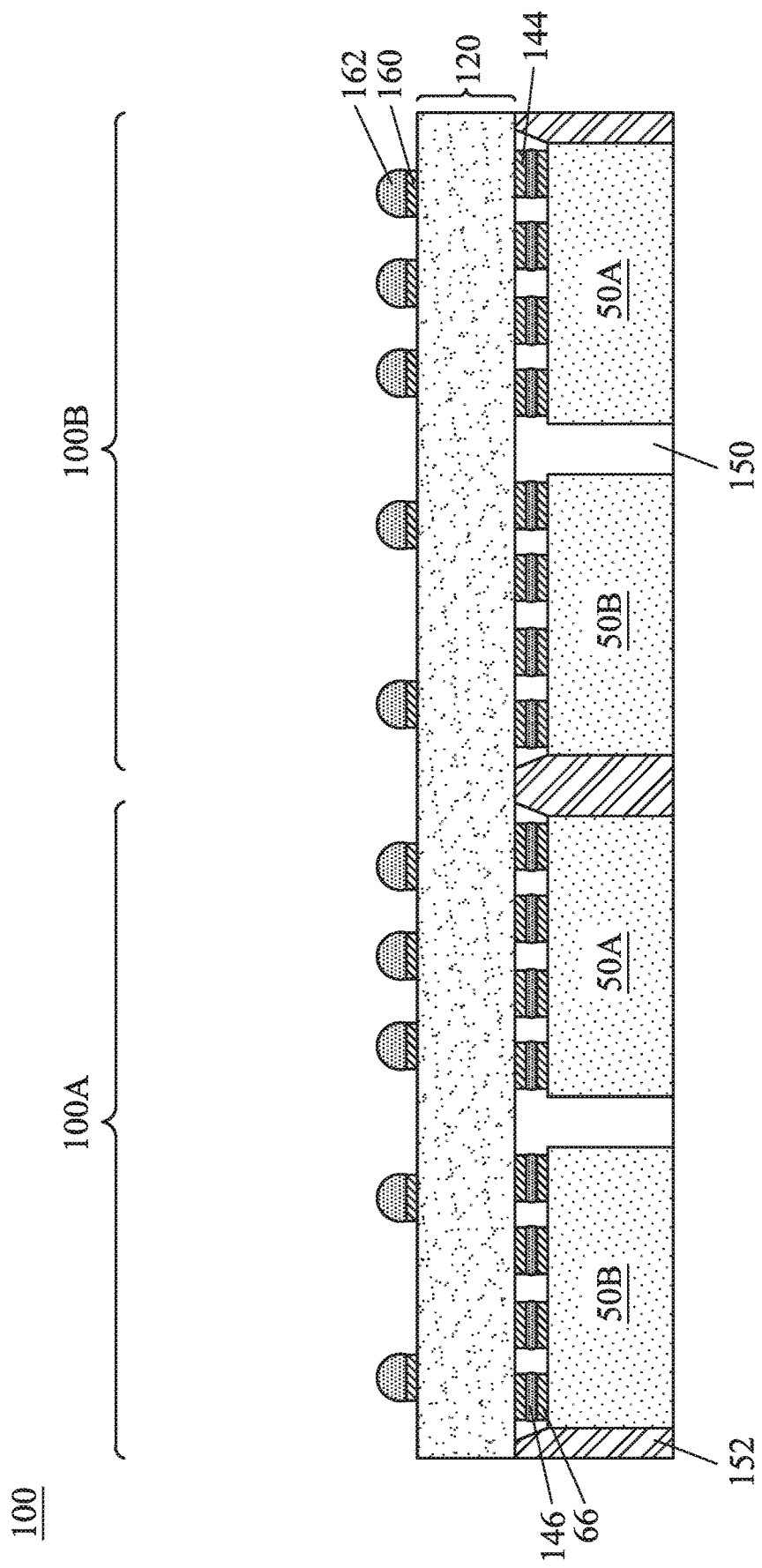

In FIG. 9, UBM structures 160 are formed for external connection to the redistribution structure 120. In some embodiments, the UBM structures 160 may be formed using similar materials and methods as the UBM structures 144 described above with reference to FIG. 4, and the description is not repeated herein. The UBM structures 160 may have via portions extending into the redistribution structure 120, pad portions on and extending along the major surface of the redistribution structure 120, and column portions over the pad portions.

Subsequently, conductive connectors 162 are formed on the UBM structures 160. The conductive connectors 162 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. In some embodiments, the conductive connectors 162 may be formed using similar materials and methods as the conductive connectors 146 described above with reference to FIG. 4, and the description is not repeated herein.

Figure 10:
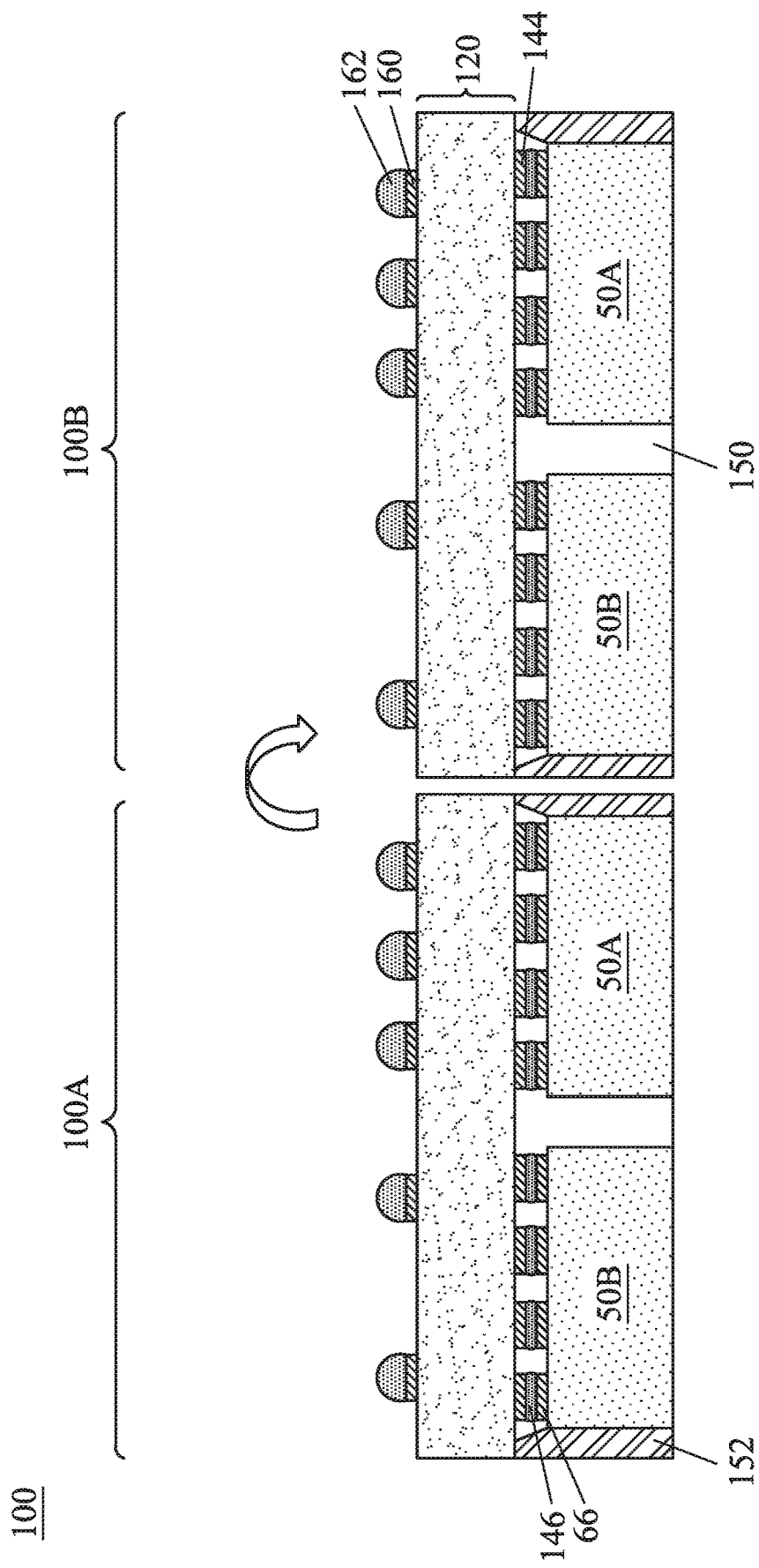

In FIG. 10, a singulation process is performed by sawing along scribe line regions, e.g., between the first package region 100A and the second package region 100B. The sawing singulates the first package region 100A from the second package region 100B. The resulting, singulated device stack is from one of the first package region 100A or the second package region 100B. The singulated structures are then each flipped over and mounted on a package substrate 200 (see FIG. 11).

Figure 11:
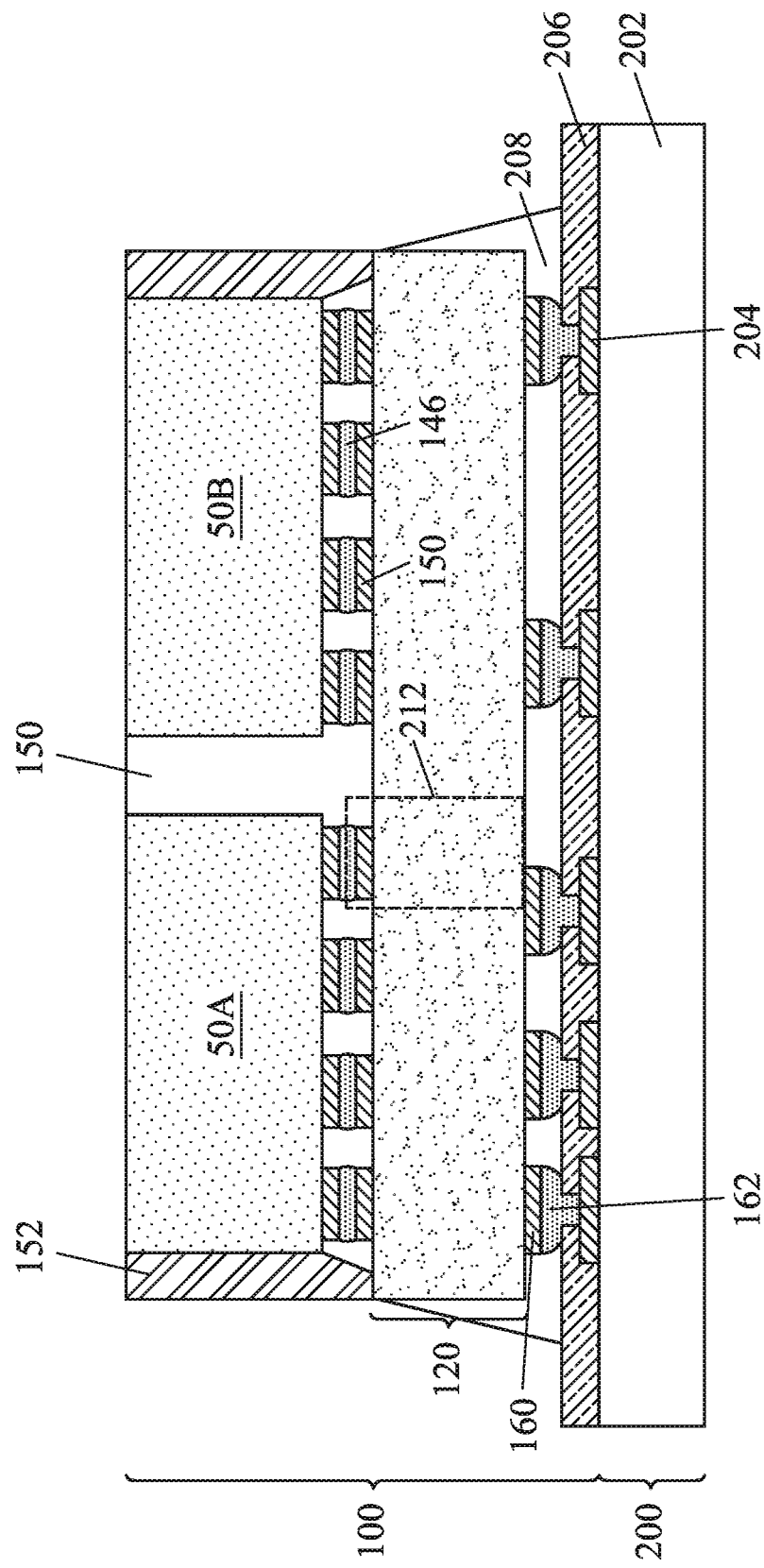

In FIG. 11, the package component 100 may be mounted to the package substrate 200 using the conductive connectors 162. The package substrate 200 includes a substrate core 202 and bond pads 204 over the substrate core 202. The substrate core 202 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 202 may be a semiconductor-on-insulator (SOI) substrate. Generally, an SOI substrate includes a layer of a semiconductor material such as epitaxial silicon, germanium, silicon germanium, SOI, SGOI, or combinations thereof. The substrate core 202 is, in one alternative embodiment, based on an insulating core such as a fiberglass reinforced resin core. One example core material is fiberglass resin such as FR4. Alternatives for the core material include bismaleimide-triazine (BT) resin, or alternatively, other PCB materials or films. Build up films such as ABF or other laminates may be used for substrate core 202.

The substrate core 202 may include active and passive devices (not shown). A wide variety of devices such as transistors, capacitors, resistors, combinations of these, and the like may be used to generate the structural and functional requirements of the design for the device stack. The devices may be formed using any suitable methods.

The substrate core 202 may also include metallization layers and vias (not shown), with the bond pads 204 being physically and/or electrically coupled to the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate core 202 is substantially free of active and passive devices.

In some embodiments, the conductive connectors 162 are reflowed to attach the package component 100 to the bond pads 204. The conductive connectors 162 electrically and/or physically couple the package substrate 200, including metallization layers in the substrate core 202, to the package component 100. In some embodiments, a solder resist 206 is formed on the substrate core 202. The conductive connectors 162 may be disposed in openings in the solder resist 206 to be electrically and mechanically coupled to the bond pads 204. The solder resist 206 may be used to protect areas of the substrate core 202 from external damage.

The conductive connectors 162 may have an epoxy flux (not shown) formed thereon before they are reflowed with at least some of the epoxy portion of the epoxy flux remaining after the package component 100 is attached to the package substrate 200. This remaining epoxy portion may act as an underfill to reduce stress and protect the joints resulting from reflowing the conductive connectors 162. In some embodiments, an underfill 208 may be formed between the package component 100 and the package substrate 200 and surrounding the conductive connectors 162. The underfill 208 may be formed by a capillary flow process after the package component 100 is attached or may be formed by a suitable deposition method before the package component 100 is attached.

FIGS. 12 through 21 illustrate cross-sectional views of intermediate steps during a process for forming a redistribution structure 1200, a UBM structure 144, and a conductive connector 146 in accordance with some embodiments. In some embodiments, the redistribution structure 1200 may be implemented as the redistribution structure 120 of the package component 100. In such embodiments, FIGS. 12 through 21 illustrate a region 212 of the package component 100 (see FIG. 11) including a portion of the redistribution structure 120 (as implemented by the redistribution structure 1200), the UBM structure 144, and the conductive connector 146.

FIGS. 12 through 15 illustrate cross-sectional views of intermediate steps during a process for forming the redistribution structure 1200 in accordance with some embodiments. The redistribution structure 1200 includes insulating layers 1202, 1206, 1210, 1214 and 1218; and metallization patterns 1204, 1208, 1212 and 1216. The metallization patterns may also be referred to as redistribution layers or redistribution lines. The redistribution structure 1200 is shown as an example having four layers of metallization patterns. More or fewer insulating layers and metallization patterns may be formed in the redistribution structure 1200. If fewer insulating layers and metallization patterns are to be formed, steps and processes discussed below may be omitted. If more insulating layers and metallization patterns are to be formed, steps and processes discussed below may be repeated.

Figure 12:
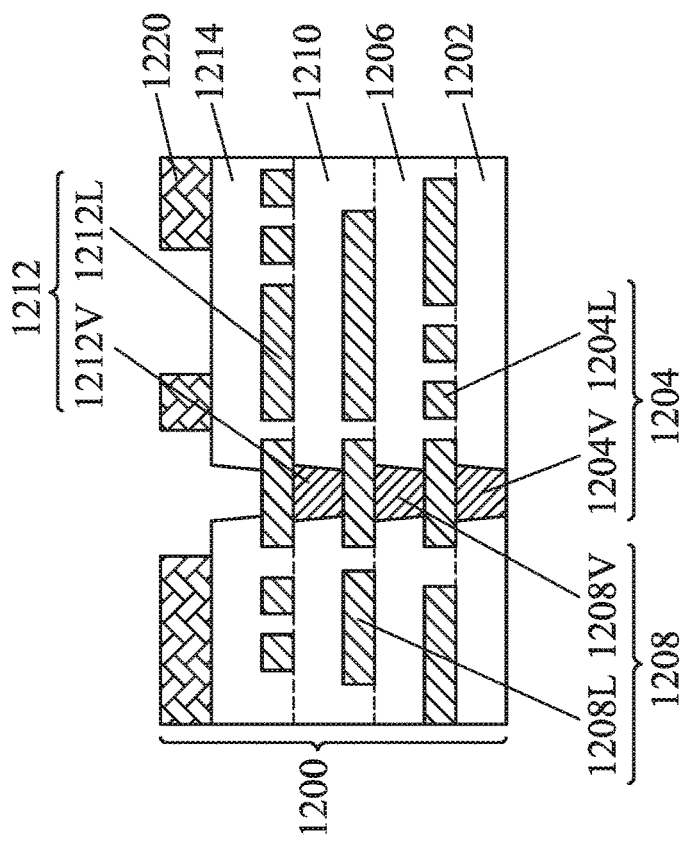

In FIG. 12, in some embodiments, the formation of the redistribution structure 1200 starts with depositing the insulating layer 1202 over the release layer 104 (see FIG. 2). In some embodiments, the insulating layer 1202 is formed of a photo-sensitive material such as PBO, polyimide, BCB, the like, or a combination thereof, which may be patterned using a lithography mask. The insulating layer 1202 may be formed by spin coating, lamination, CVD, the like, or a combination thereof. The insulating layer 1202 is then patterned. The patterning may be by an acceptable process, such as by exposing and developing the insulating layer 1202 to light when the insulating layer 1202 is a photo-sensitive material or by etching using, for example, an anisotropic etch.

After forming the insulating layer 1202, the metallization pattern 1204 is formed. The metallization pattern 1204 includes portions (such as conductive lines or traces 1204L) on and extending along the major surface of the insulating layer 1202. The metallization pattern 1204 further includes portions (such as conductive vias 1204V) extending through the insulating layer 1202.

As an example to form the metallization pattern 1204, a seed layer is formed over the insulating layer 1202 and in the openings extending through the insulating layer 1202. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photo-resist may be formed by spin coating or the like and may be exposed to light for patterning. The pattern of the photoresist corresponds to the metallization pattern 1204. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, such as copper, titanium, tungsten, aluminum, or the like. The combination of the conductive material and underlying portions of the seed layer form the metallization pattern 1204. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

After forming the metallization pattern 1204, the insulating layer 1206 is deposited on the metallization pattern 1204 and the insulating layer 1202. The insulating layer 1206 may be formed using similar materials and methods as the insulating layer 1202, and the description is not repeated herein.

After forming the insulating layer 1206, the metallization pattern 1208 is formed. The metallization pattern 1208 includes portions (such as conductive lines or traces 1208L) on and extending along the major surface of the insulating layer 1206. The metallization pattern 1208 further includes portions (such as conductive vias 1208V) extending through the insulating layer 1206 to physically and electrically couple to the metallization pattern 1204. The metallization pattern 1208 may be formed using similar materials and methods as the metallization pattern 1204 and the description is not repeated herein.

After forming the metallization pattern 1208, the insulating layer 1210 is deposited on the metallization pattern 1208 and the insulating layer 1206. The insulating layer 1210 may be formed using similar materials and methods as the insulating layer 1202 and the description is not repeated herein.

After forming the insulating layer 1210, the metallization pattern 1212 is formed. The metallization pattern 1212 includes portions (such as conductive lines or traces 1212L) on and extending along the major surface of the insulating layer 1210. The metallization pattern 1212 further includes portions (such as conductive vias 1212V) extending through the insulating layer 1210 to physically and electrically couple to the metallization pattern 1208. The metallization pattern 1212 may be formed using similar materials and methods as the metallization pattern 1204 and the description is not repeated herein.

After forming the metallization pattern 1212, the insulating layer 1214 is deposited on the metallization pattern 1212 and the insulating layer 1210. The insulating layer 1214 may be formed using similar materials and methods as the insulating layer 1202 and the description is not repeated herein.

After forming the insulating layer 1214, the insulating layer 1214 is patterned. The patterning may be by an acceptable process, such as by exposing and developing the insulating layer 1214 to light when the insulating layer 1214 is a photo-sensitive material or by etching using, for example, an anisotropic etch. Subsequently, a seed layer is formed over the insulating layer 1214 and in the openings extending through the insulating layer 1214. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like.

After forming the seed layer, a photoresist 1220 is then formed and patterned on the seed layer. The photoresist 1220 may be formed by spin coating or the like and may be exposed to light for patterning. The pattern of the photoresist 1220 corresponds to the metallization pattern 1216. The patterning forms openings through the photoresist 1220 to expose the seed layer.

Figure 13:
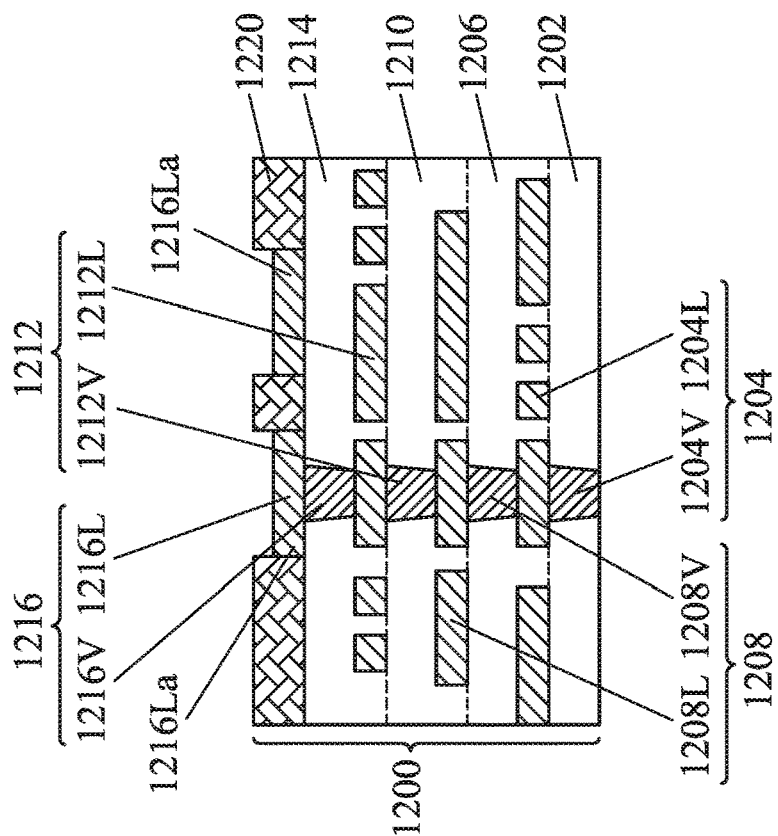
FIGS. 12 through 21 illustrate cross-sectional views of intermediate steps during a process for forming redistribution and under-bump metallization structures in accordance with some embodiments.

In FIG. 13, a conductive material is then formed in the openings of the photoresist 1220 and on the exposed portions of the seed layer. The conductive material may be formed by plating, such as electroplating or electroless plating, or the like. The conductive material may comprise a metal, such as copper, titanium, tungsten, aluminum, or the like. In some embodiments, the conductive material is formed in a conformal manner such that the conductive material partially fills the openings through the photoresist. The combination of the conductive material and underlying portions of the seed layer form the metallization pattern 1216. The metallization pattern 1216 includes portions (such as conductive lines or traces 1216L) on and extending along the major surface of the insulating layer 1214. The metallization pattern 1216 further includes portions (such as conductive vias 1216V) extending through the insulating layer 1214 to physically and electrically couple to the metallization pattern 1212. As described below in greater detail, the conductive lines 1216L comprises a conductive line 1216La, which has a "C"-like or "U"-like shape in a plan view.

Figure 14:
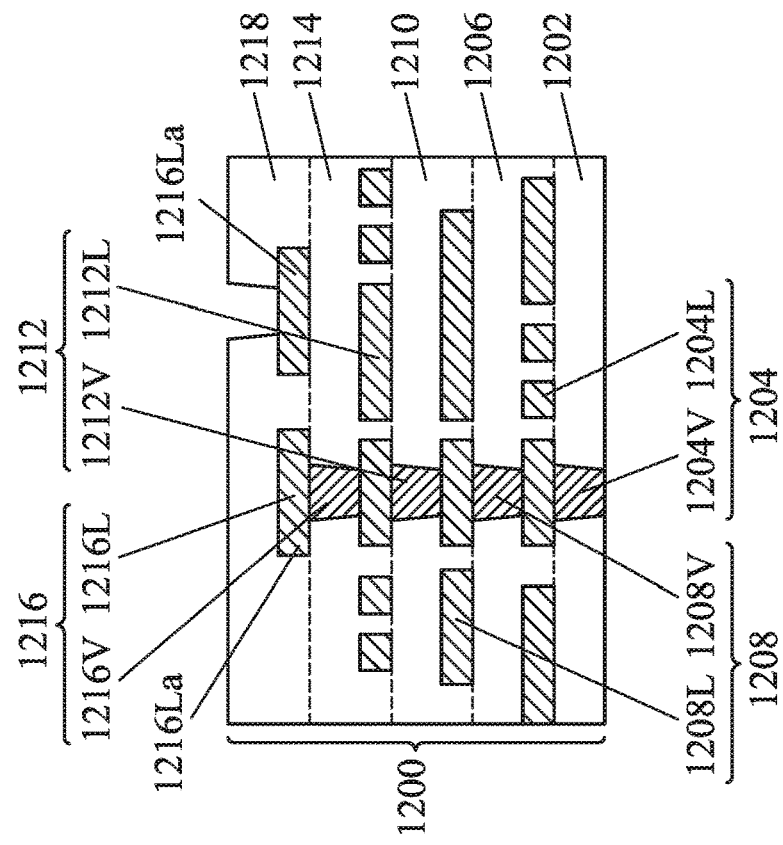

In FIG. 14, the photoresist 1220 (see FIG. 13) and portions of the seed layer on which the conductive material is not formed are removed. The photoresist 1220 may be removed by an acceptable ashing or stripping process, such as using an oxygen plasma or the like. Once the photoresist 1220 is removed, exposed portions of the seed layer are removed, such as by using an acceptable etching process, such as by wet or dry etching.

Figure 15:
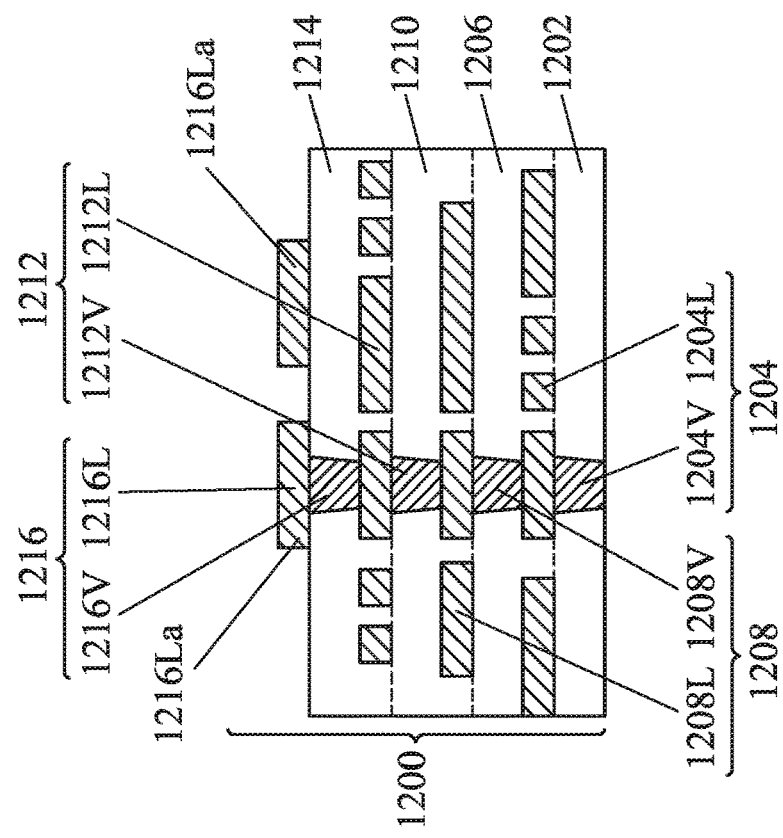

In FIG. 15, after forming the metallization pattern 1216, the insulating layer 1218 is deposited on the metallization pattern 1216 and the insulating layer 1214. The insulating layer 1218 may be formed using similar materials and methods as the insulating layer 1202 and the description is not repeated herein. In the illustrated embodiment, vias 1204V, 1208V, 1212V, and 1216V that are disposed below the conductive line 1216La are vertically stacked.

In some embodiments, the metallization pattern 1216 may have a different size than the metallization patterns 1204, 1208, and 1212. For example, in some embodiments, the conductive lines and/or vias of the metallization pattern 1216 may be wider or thicker than the conductive lines and/or vias of the metallization patterns 1204, 1208, and 1212. In other embodiments, the conductive lines and/or vias of the metallization pattern 1216 may be the same width and/or thickness as the conductive lines and/or vias of the metallization patterns 1204, 1208, and 1212.

In some embodiments, the insulating layer 1218 has a different thickness than the insulating layers 1202, 1206, 1210, and 1214. For example, in some embodiments, the insulating layer 1218 may be thicker than the insulating layers 1202, 1206, 1210, and 1214. In other embodiments, the insulating layer 1218 may be the same thickness as the insulating layers 1202, 1206, 1210, and 1214.

FIGS. 15 through 21 illustrate cross-sectional views of intermediate steps during a process for forming a UBM structure 144 in accordance with some embodiments. In FIG. 15, after forming the insulating layer 1218, the insulating layer 1218 is patterned. The patterning may be by an acceptable process, such as by exposing and developing the insulating layer 1218 to light when the insulating layer 1218 is a photo-sensitive material or by etching using, for example, an anisotropic etch. The patterned insulating layer 1218 exposes a portion of the metallization pattern 1216, i.e., a portion of the conductive line 1216La.

Figure 16:
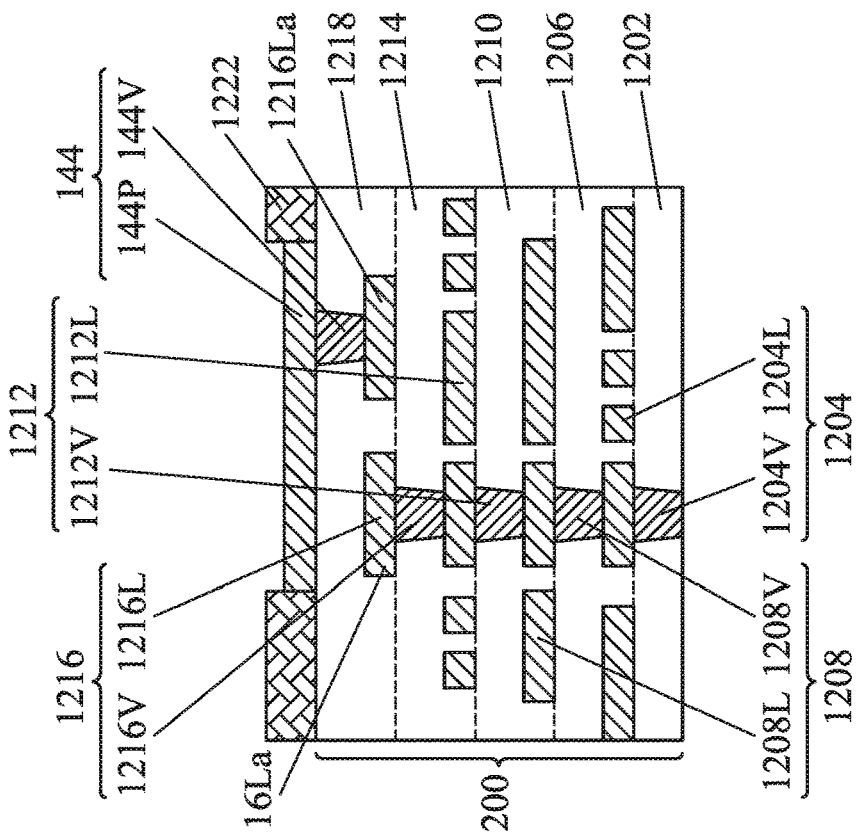

In FIG. 16, a seed layer (not shown) is formed over the insulating layer 1218 and in the openings extending through the insulating layer 1218. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like.

After forming the seed layer, a photoresist 1222 is then formed and patterned on the seed layer. The photoresist 1222 may be formed by spin coating or the like and may be exposed to light for patterning. The pattern of the photoresist 1222 corresponds to the via portion 144V and the pad portion 144P of the UBM structure 144 (see FIG. 17). The patterning forms openings through the photoresist 1222 to expose the seed layer.

Figure 17:
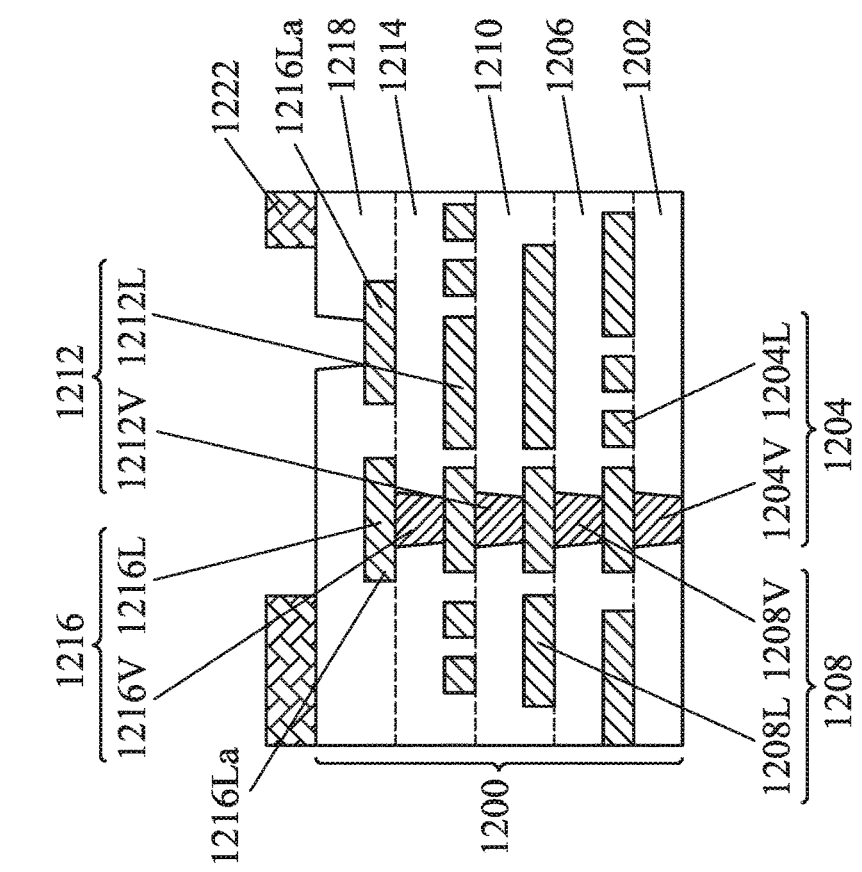

In FIG. 17, a conductive material is then formed in the openings of the photoresist 1222 and on the exposed portions of the seed layer. The conductive material may be formed by plating, such as electroplating or electroless plating, or the like. The conductive material may comprise a metal, such as copper, titanium, tungsten, aluminum, or the like. In some embodiments, the conductive material is formed in a conformal manner such that the conductive material partially fills the openings through the photoresist. The combination of the conductive material and underlying portions of the seed layer form the via portion 144V and the pad portion 144P of the UBM structure 144. The pad portion 144P of the UBM structure 144 extends along the major surface of the insulating layer 1218. The via portion 144V of the UBM structure 144 extends through the insulating layer 1218 to physically and electrically couple to the metallization pattern 1216. The pad portion 144P of the UBM structure 144 may be also referred to as a UBM pad 144P. The via portion 144V of the UBM structure 144 may be also referred to as a UBM via 144V.

Figure 18:
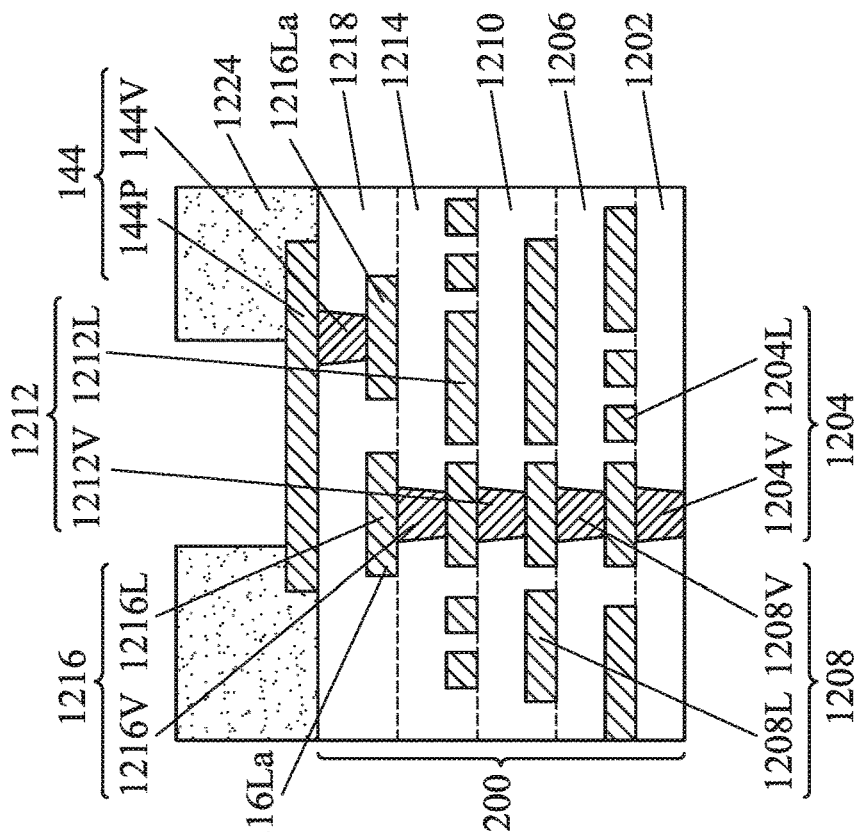

In FIG. 18, the photoresist 1222 (see FIG. 17) and portions of the seed layer on which the conductive material is not formed are removed. The photoresist 1222 may be removed by an acceptable ashing or stripping process, such as using an oxygen plasma or the like. Once the photoresist 1222 is removed, exposed portions of the seed layer are removed, such as by using an acceptable etching process, such as by wet or dry etching.

Figure 19:
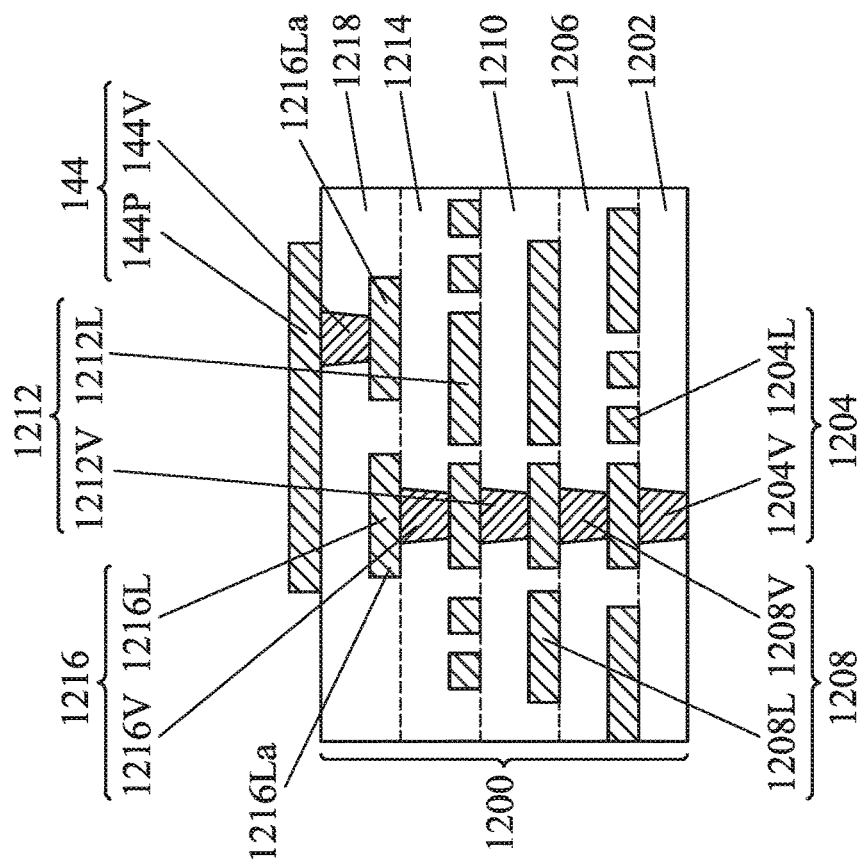

In FIG. 19, after forming the UBM via 144V and the UBM pad 144P, a photoresist 1224 is then formed and patterned on the insulating layer 1218 and the UBM pad 144P. The photoresist 1224 may be formed by spin coating or the like and may be exposed to light for patterning. The pattern of the photoresist 1224 corresponds to the column portion 144C of the UBM structure 144 (see FIG. 20). The patterning forms openings through the photoresist 1224 to expose the UBM pad 144P.

Figure 20:
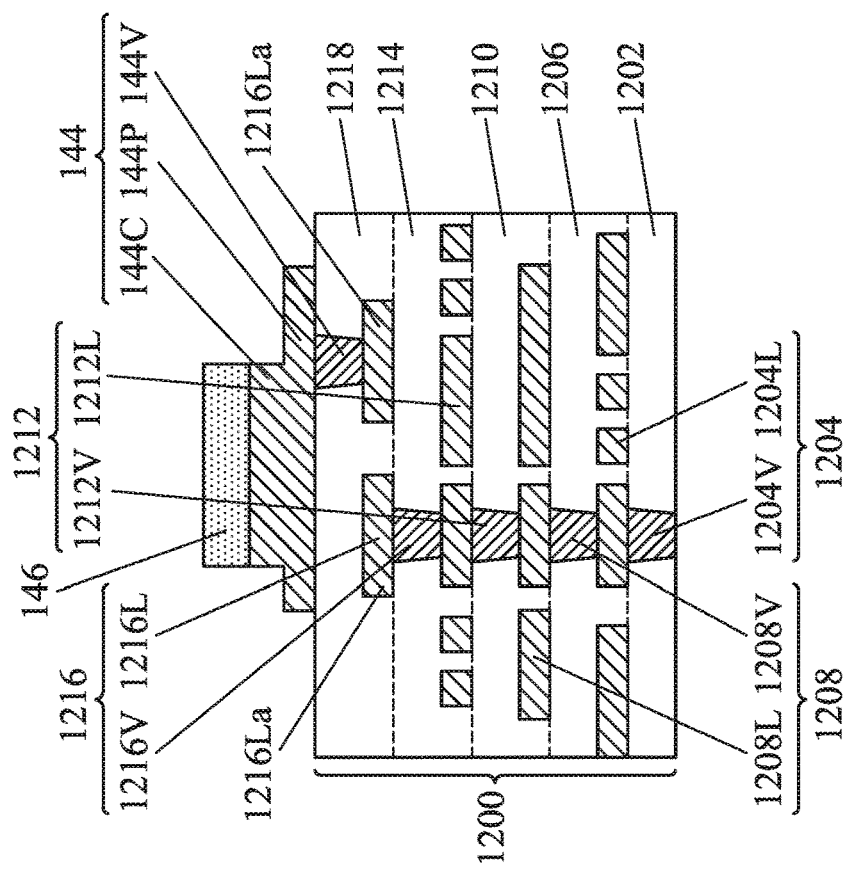

In FIG. 20, a conductive material is then formed in the openings of the photoresist 1224 and on the exposed portions of the UBM pad 144P to form the column portion 144C of the UBM structure 144. The conductive material may be formed by plating, such as electroplating or electroless plating, or the like. The conductive material may comprise a metal, such as copper, titanium, tungsten, aluminum, or the like. The column portion 144C of the UBM structure 144 may be also referred to a UBM column 144C.

Subsequently, a conductive connector 146 is formed over the UBM column 144C. In some embodiments where the conductive connector 146 comprises a solder material, the solder material may be formed in the openings of the photoresist 1224 and on the UBM column 144C by plating, such as electroplating or electroless plating, or the like.

Figure 21:
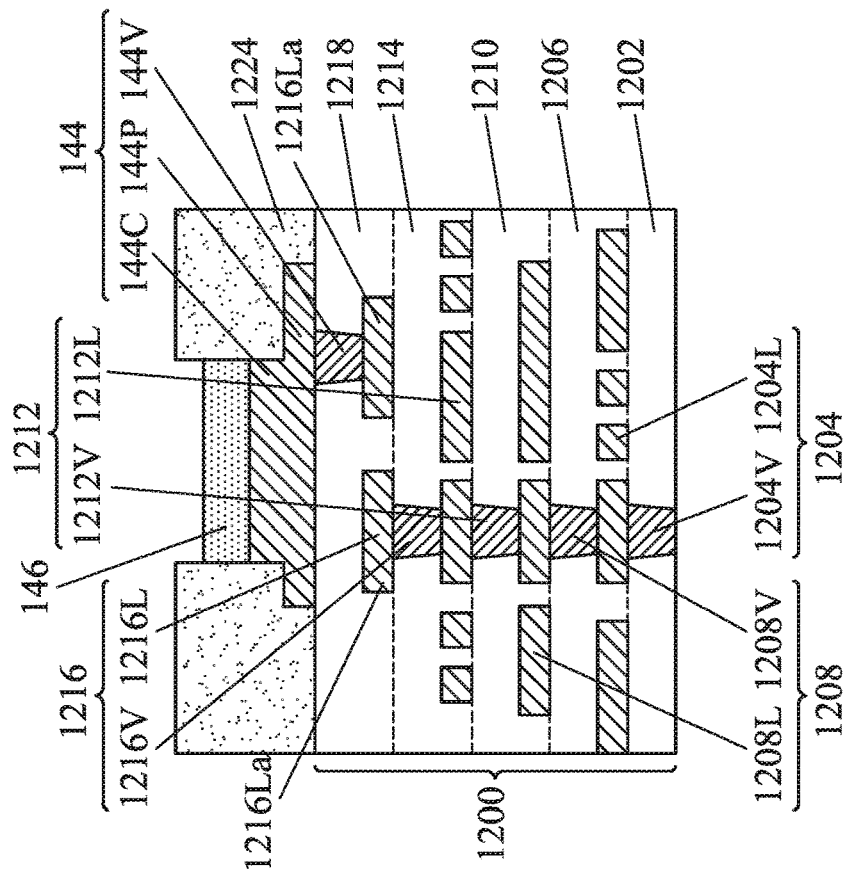

In FIG. 21, after forming the conductive connector 146, the photoresist 1224 (see FIG. 20) is removed. The photoresist 1224 may be removed by an acceptable ashing or stripping process, such as using an oxygen plasma or the like.

Figure 22B:
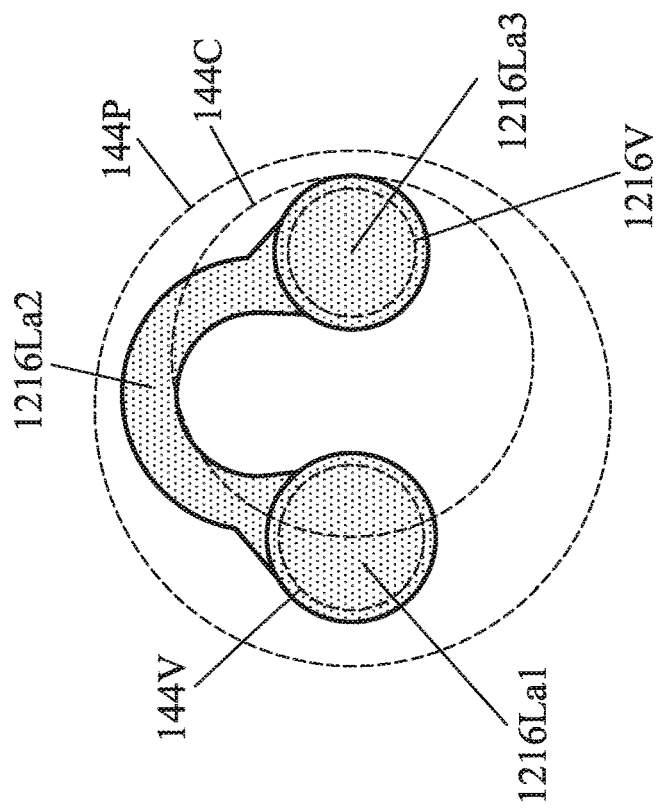
FIG. 22B is a plan view of conductive features in accordance with some embodiments.
Figure 22A:
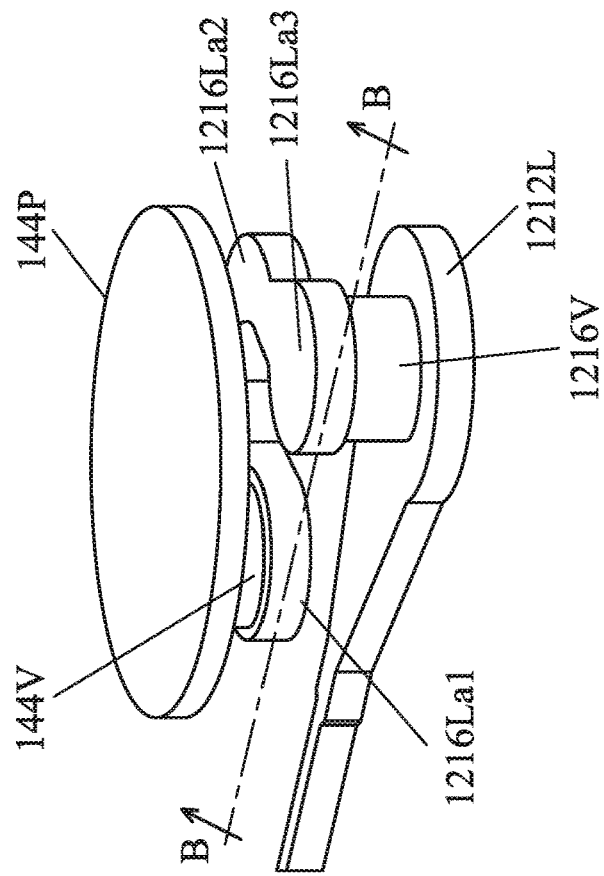
FIG. 22A is a perspective view of conductive features in accordance with some embodiments.

FIG. 22A is a perspective view of various conductive features of the structure illustrated in FIG. 21 in accordance with some embodiments. FIG. 22B is a plan view of the structure illustrated in FIG. 22A along a cross-section BB in accordance with some embodiments. Referring to FIGS. 22A and 22B, in some embodiment, the conductive line 1216La has a curved, "C"-like or "U"-like shape in a plan view in which the UBM via 144V is located at a first end of the curved shape and the via 1216V is located at a second end of the curved shape. In some embodiments, the whole conductive line 1216La is disposed below the UBM pad 144P and within a perimeter of the UBM pad 144P in a plan view. The curved, "C"-like or "U"-like shape can act like a coil of a spring and flex and deform without breaking. Metallization patterns in redistribution structures may bend or deform due to CTE mismatch of materials in a semiconductor package. This CTE mismatch can cause the metallization patterns to endure high stress due to the bending and deformation. However, the disclosed shapes of the metallization patterns with the increased flexibility increase the reliability of the redistribution structure. The flexibly-shaped metallization pattern 1216 and the flexible insulating layer 1218 (see FIG. 21) may be referred to as stress buffer films as they provide a buffer to safely release the stress in the redistribution structure and the package structure.

In some embodiments, the conductive line 1216La comprises a first portion 1216La1 directly below the UBM via 144V, a third portion 1216La3 directly over the via 1216V, and a second portion 1216La2 connecting the first portion 1216La1 to the third portion 1216La3. The first and third portions 1216La1 and 1216La3 are the pad portions that are coupled to the overlying and underlying vias 144V and 1216V, and the second portion 1216La2 has a curved or detour pattern and connects the first and third portions 1216La1 and 1216La3. A first terminal of the second portion 1216La2 connected to the first portion 1216La1 does not extend toward the third portion 1216La3. A second terminal of the second portion 1216La2 connected to the third portion 1216La3 does not extend toward the first portion 1216La1. The second portion 1216La2 does not overlap the shortest straight path between the first and third portions 1216La1 and 1216La3. The detour pattern of the second portion 1216La2 helps the conductive features of the metallization pattern 1216 to safely release the stress in the redistribution structure and/or the package structure.

In some embodiments, the pad portions 1216La1 and 1216La3 are wider, in a plan view, than the curved portion 1216La2. This allows for the pad portions 1216La1 and 1216La1 to make better connections to the overlying and underlying vias and to improve the reliability of the redistribution structure. Centers of the pad portions 1216La1 and 1216La3 are laterally shifted with respect to a center of the UBM pad 144P, such that the center of the pad portion 1216La1 is shifted in a first direction and the center of the pad portion 1216La3 is shifted in a second direction different from the first direction. In some embodiments, the first direction is opposite to the second direction.

In some embodiments, the UBM pad 144P has a circular shape in a plan view. In other embodiments, the UBM pad 144P may have any desired shape based on design requirements. In some embodiments, the UBM pad 144P has a diameter less than about 60 µm. In some embodiments, the UBM column 144C has a circular shape in a plan view. In other embodiments, the UBM column 144C may have any desired shape based on design requirements. In some embodiments, the UBM column 144C has a diameter less than about 60 µm. In some embodiments, the diameter of the UBM pad 144P is greater than the diameter of the UBM column 144C. The center of the UBM column 144C is shifted with respect to the center of the UBM pad 144P in a plan view. In some embodiments, the UBM column 144C fully covers the via 1216V and partially covers the UBM via 144V in a plan view.

By forming UBM structures 144 comprising UBM vias 144V, UBM pads 144P, and UBM columns 144C with shapes and arrangements as described above, stress transmitted to the metallization patterns 1204, 1208, 1212, and 1216 of redistribution structure 1200 from conductive connectors 146 bonded to the UBM structures 144 due to CTE mismatch of materials in a semiconductor package is reduced.

Figure 23:
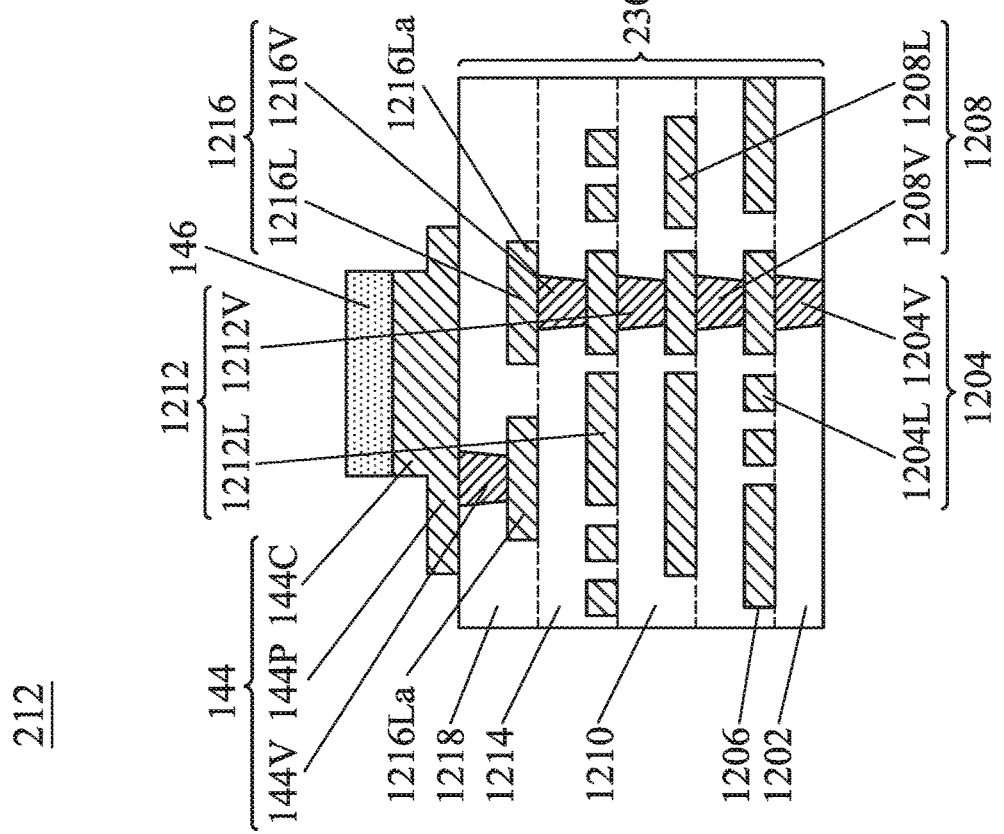
FIG. 23 is a cross-sectional view of redistribution and under-bump metallization structures in accordance with some embodiments.

FIG. 23 is a cross-sectional view a region 212 of the package component 100 (see FIG. 11) in accordance with some embodiments. In the illustrated embodiment, the redistribution structure 2300 is implemented as the redistribution structure 120 of the package component 100 (see FIG. 11). The structure of FIG. 23 is similar to the structure of FIG. 21, with similar features being labeled with similar numerical references, and descriptions of the similar features are not repeated herein. The redistribution structure 2300 includes insulating layers 1202, 1206, 1210, 1214 and 1218, and metallization patterns 1204, 1208, 1212 and 1216. In some embodiments, the redistribution structure 2300 may be formed in a similar manner as the redistribution structure 1200 described above with reference to FIGS. 12-15, and the description is not repeated herein. The metallization patterns 1204, 1208, 1212 and 1216 of the redistribution structure 2300, the UBM via 144V, the UBM pad 144P, and the UBM column 144C are arranged such that the structure of FIG. 23 is a mirror image of the structure of FIG. 21.

Figure 24:
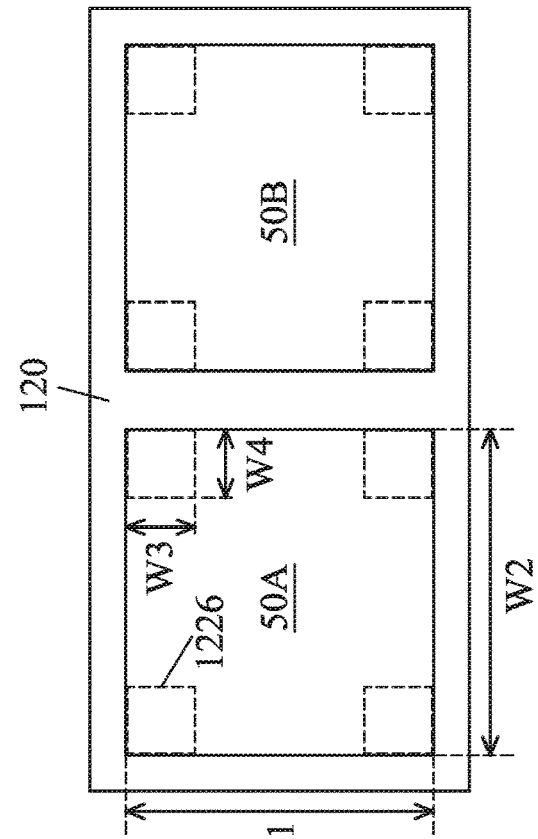
FIG. 24 is a plan view of a package component in accordance with some embodiments.

FIG. 24 is a plan view of the package component 100 (see FIG. 11) in accordance with some embodiments. In some embodiments, redistribution and UBM structures as described above with reference to FIGS. 21 and 23 may be formed below conductive connectors 146 (see FIG. 11) bonded to regions of the integrated circuit dies 50A and 50B that are prone to increased strain (for example, corner regions 1226 of the integrated circuit dies 50A and 50B) to reduce or eliminate the strain. The integrated circuit dies 50A and 50B have a first width W1 and a second width W2 in a plan view. In some embodiment, the width W1 is between about 10 mm and about 50 mm. In some embodiment, the width W2 is between about 10 mm and about 50 mm. The corner regions 1226 have a third width W3 and a fourth width W4 in a plan view. In some embodiment, the width W3 is between about 1 µm and about 500 µm. In some embodiment, the width W4 is between about 1 μm and about 500 μm. In some embodiment, a ratio of W3/W1 is between about ⅟50000 and about ½. In some embodiment, a ratio of W4/W2 is between about ⅟50000 and about ½. In some embodiments, depending on the size of the corner region 1226, one or more conductive connectors 146 (see FIG. 11) may be bonded to the corner region 1226 of the integrated circuit dies 50A and 50B.

Figure 25:
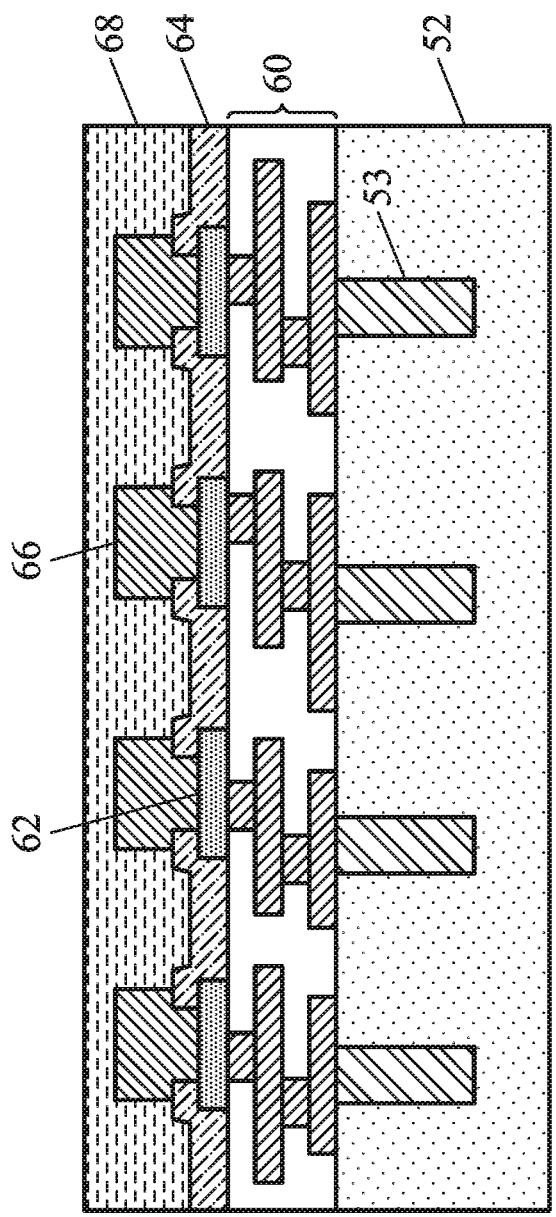
FIG. 25 illustrates a cross-sectional view of an interposer die in accordance with some embodiments.

FIG. 25 illustrates a cross-sectional view of an interposer die 51 in accordance with some embodiments. The interposer die 51 will be packaged in subsequent processing to form an integrated circuit package. In some embodiments, the interposer die 51 die may be similar to the integrated circuit die 50 illustrated in FIG. 1, with similar features being labeled by similar numerical references, and the descriptions of the similar features are not repeated herein. The interposer die 51 may be formed in a wafer, which is singulated in subsequent steps to form a plurality of interposer dies. The interposer die 51 may be processed according to applicable manufacturing processes. In the illustrated embodiment, the interposer die 51 comprises an interconnect structure 60. In other embodiments, the interconnect structure 60 may be omitted. In the illustrated embodiment, the interposer die 51 does not comprise active and/or passive devices. In other embodiments, the active and/or passive devices may be formed on or in the semiconductor substrate 52 of the interposer die 51. In some embodiments, the interposer die comprises through vias (TVs) 53 extending through the semiconductor substrate 52. TVs 53 may comprise a conductive material such as, for example, copper, or the like.

FIGS. 26 through 38 illustrate cross-sectional views of intermediate steps during a process for forming a package component 300 in accordance with some embodiments. A first package region 300A and a second package region 300B are illustrated, and one or more of the integrated circuit dies 50 (see FIG. 1) and one or more interposer dies 51 (see FIG. 25) are packaged to form an integrated circuit package in each of the package regions 300A and 300B. The integrated circuit packages may also be referred to as integrated fan-out (InFO) packages. In some embodiments, some of the features and the process steps described below with reference to FIGS. 26-38 are similar to the features and the process steps described above with reference to FIGS. 2-11, and descriptions of the similar features and process steps are not repeated herein.

Figure 26:
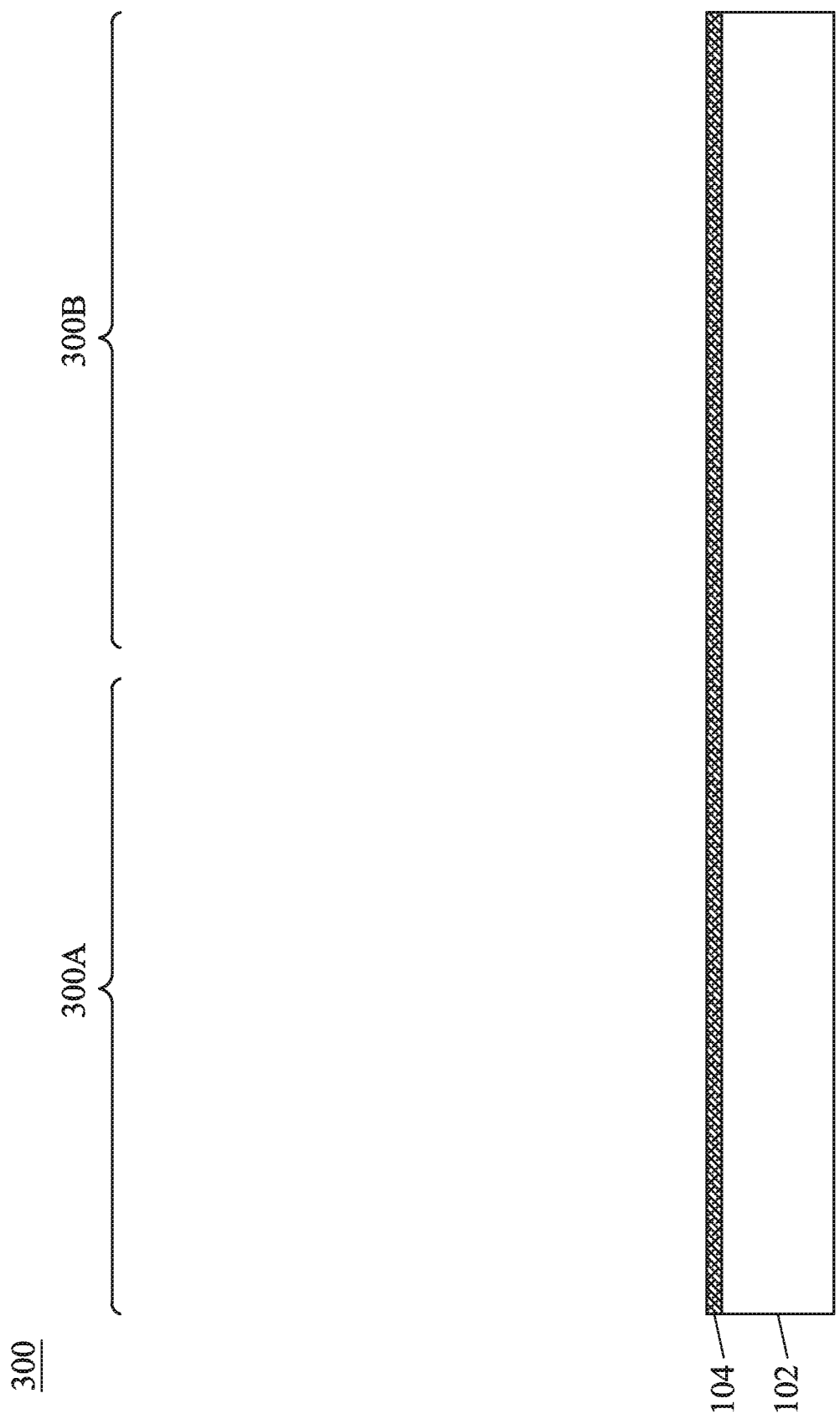
FIGS. 26 through 38 illustrate cross-sectional views of intermediate steps during a process for forming a package component in accordance with some embodiments.

In FIG. 26, a carrier substrate 102 is provided, and a release layer 104 is formed on the carrier substrate 102 as described above with reference to FIG. 2, and the description is not repeated herein.

Figure 27:
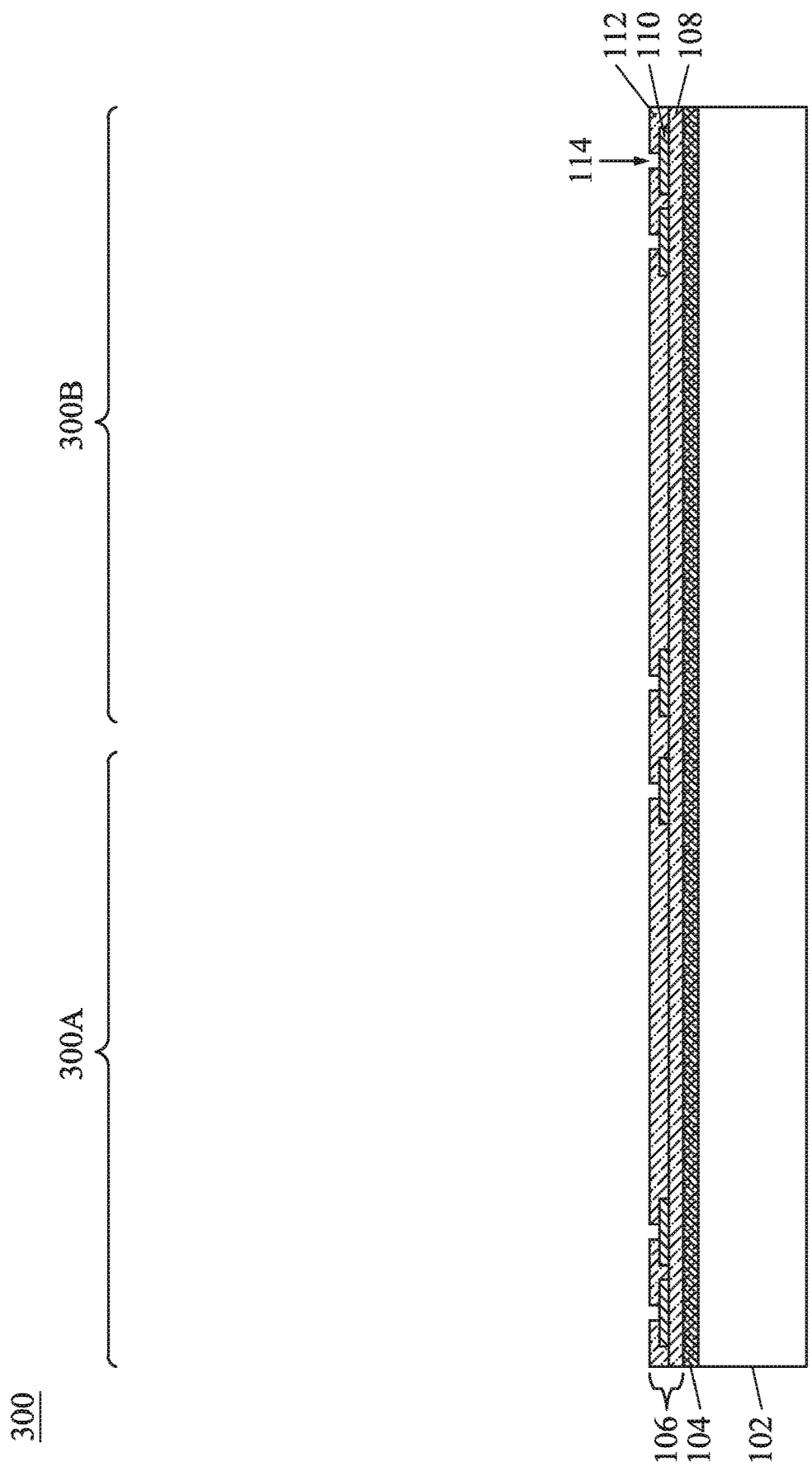

In FIG. 27, a redistribution structure 106 may be formed on the release layer 104. The redistribution structure 106 may be also referred to as back-side redistribution structure. In the embodiment shown, the redistribution structure 106 includes an insulating layer 108, a metallization pattern 110 (sometimes referred to as redistribution layers or redistribution lines), and an insulating layer 112. The redistribution structure 106 is optional and may be omitted. In some embodiments, an insulating layer without metallization patterns is formed on the release layer 104 in lieu of the redistribution structure 106.

The insulating layer 108 may be formed on the release layer 104. The bottom surface of the insulating layer 108 may be in contact with the top surface of the release layer 104. In some embodiments, the insulating layer 108 is formed of a polymer, such as PBO, polyimide, BCB, or the like. In other embodiments, the insulating layer 108 is formed of a nitride such as silicon nitride; an oxide such as silicon oxide, PSG, BSG, BPSG, or the like; or the like. The insulating layer 108 may be formed by any acceptable deposition process, such as spin coating, CVD, laminating, the like, or a combination thereof.

The metallization pattern 110 may be formed on the insulating layer 108. As an example to form metallization pattern 110, a seed layer is formed over the insulating layer 108. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 110. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 110.

The insulating layer 112 may be formed on the metallization pattern 110 and the insulating layer 108. The insulating layer 112 may be formed using similar materials and methods as the insulating layer 108. The insulating layer 112 is then patterned to form openings 114 exposing portions of the metallization pattern 110. The patterning may be performed by an acceptable process, such as by exposing the insulating layer 112 to light when the insulating layer 112 is a photo-sensitive material or by etching using, for example, an anisotropic etch. If the insulating layer 112 is a photo-sensitive material, the insulating layer 112 can be developed after the exposure.

FIG. 27 illustrates a redistribution structure 106 having a single metalization pattern 110 for illustrative purposes. In some embodiments, the redistribution structure 106 may include any number of dielectric layers and metallization patterns. If more dielectric layers and metallization patterns are to be formed, steps and processes discussed above may be repeated.

Figure 28:
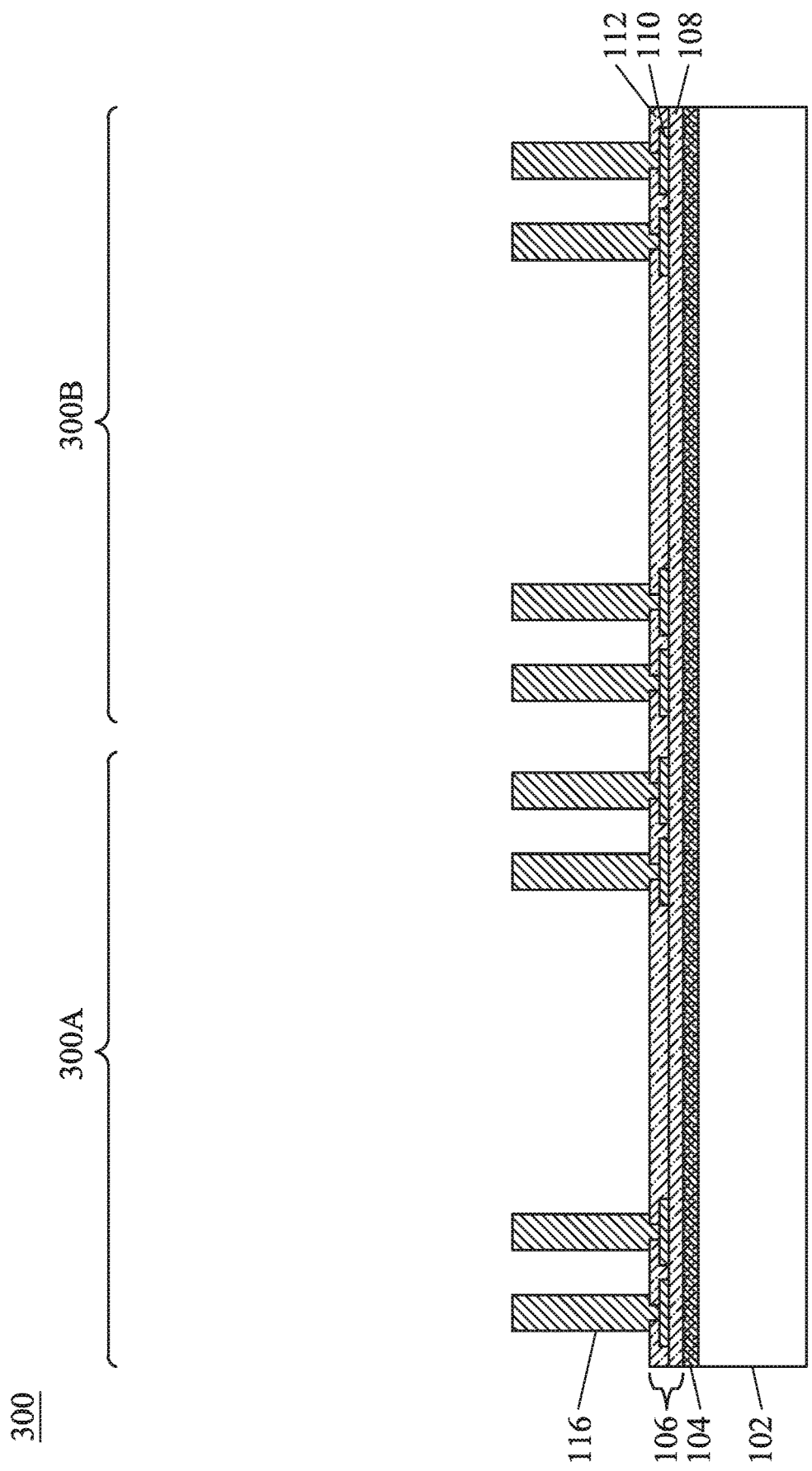

In FIG. 28, through vias (TVs) 116 are formed in the openings 114 and extending away from the topmost insulating layer of the redistribution structure 106 (e.g., the insulating layer 112). As an example to form the TVs 116, a seed layer (not shown) is formed over the redistribution structure 106, e.g., on the insulating layer 112 and portions of the metallization pattern 110 exposed by the openings 114. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to TVs. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the TVs 116.

Figure 29:
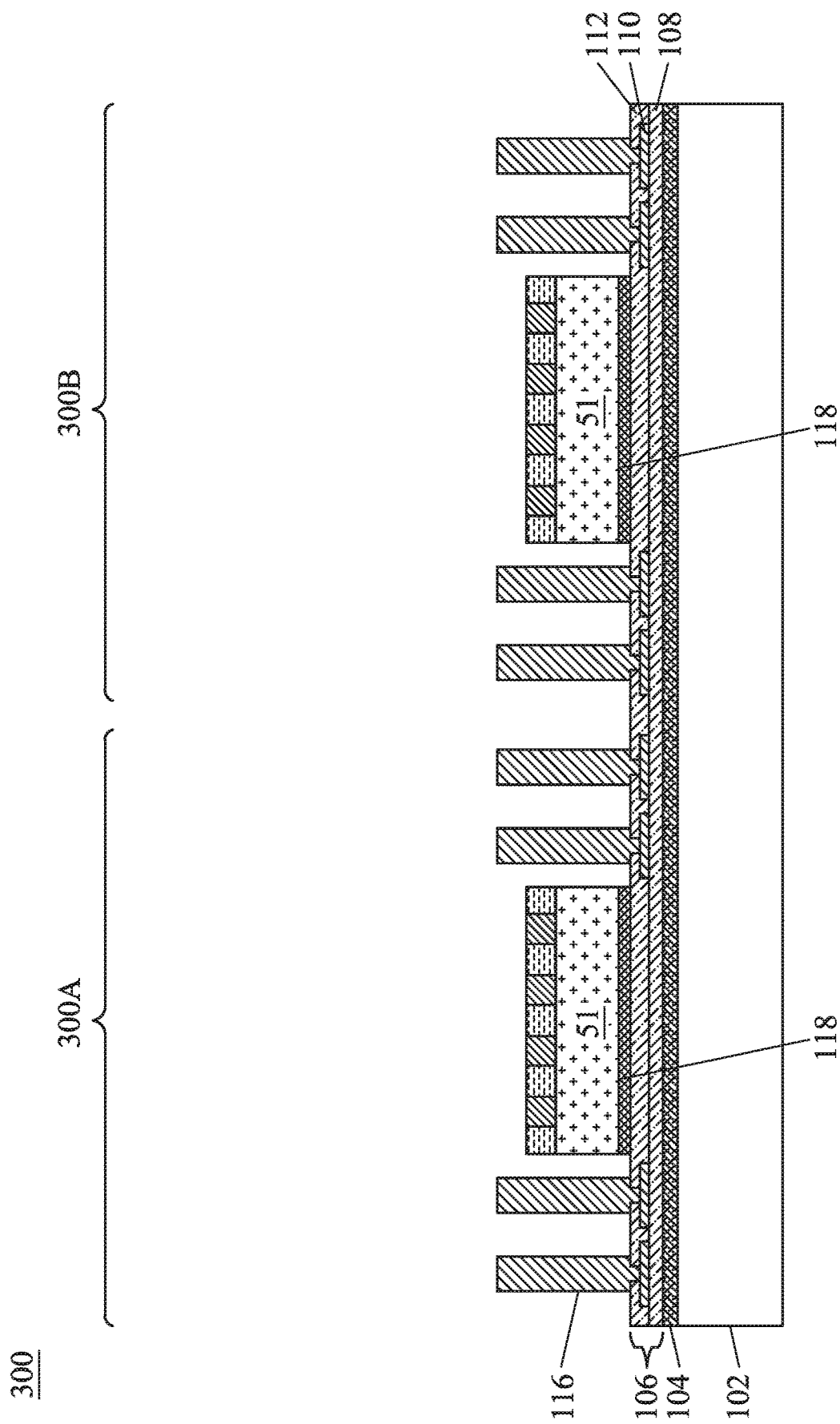

In FIG. 29, the interposer dies 51 are adhered to the insulating layer 112 of the redistribution structure 106 by adhesives 118. In the embodiment shown, a single interposer die 51 is adhered in each of the first package region 300A and the second package region 300B. In other embodiments, two or more interposer dies 51 may be adhered in each of the first package region 300A and the second package region 300B. The adhesive 118 is on back-sides of the interposer dies 51 and adheres the interposer dies 51 to the back-side redistribution structure 106, such as to the insulating layer 112. The adhesive 118 may be any suitable adhesive, epoxy, die attach film (DAF), or the like. The adhesives 118 may be applied to back-sides of the interposer dies 51, may be applied over the surface of the carrier substrate 102 if no redistribution structure 106 is utilized, or may be applied to an upper surface of the redistribution structure 106 if applicable. For example, the adhesives 118 may be applied to the back-sides of the interposer dies 51 before singulating to separate the interposer dies 51.

Figure 30:
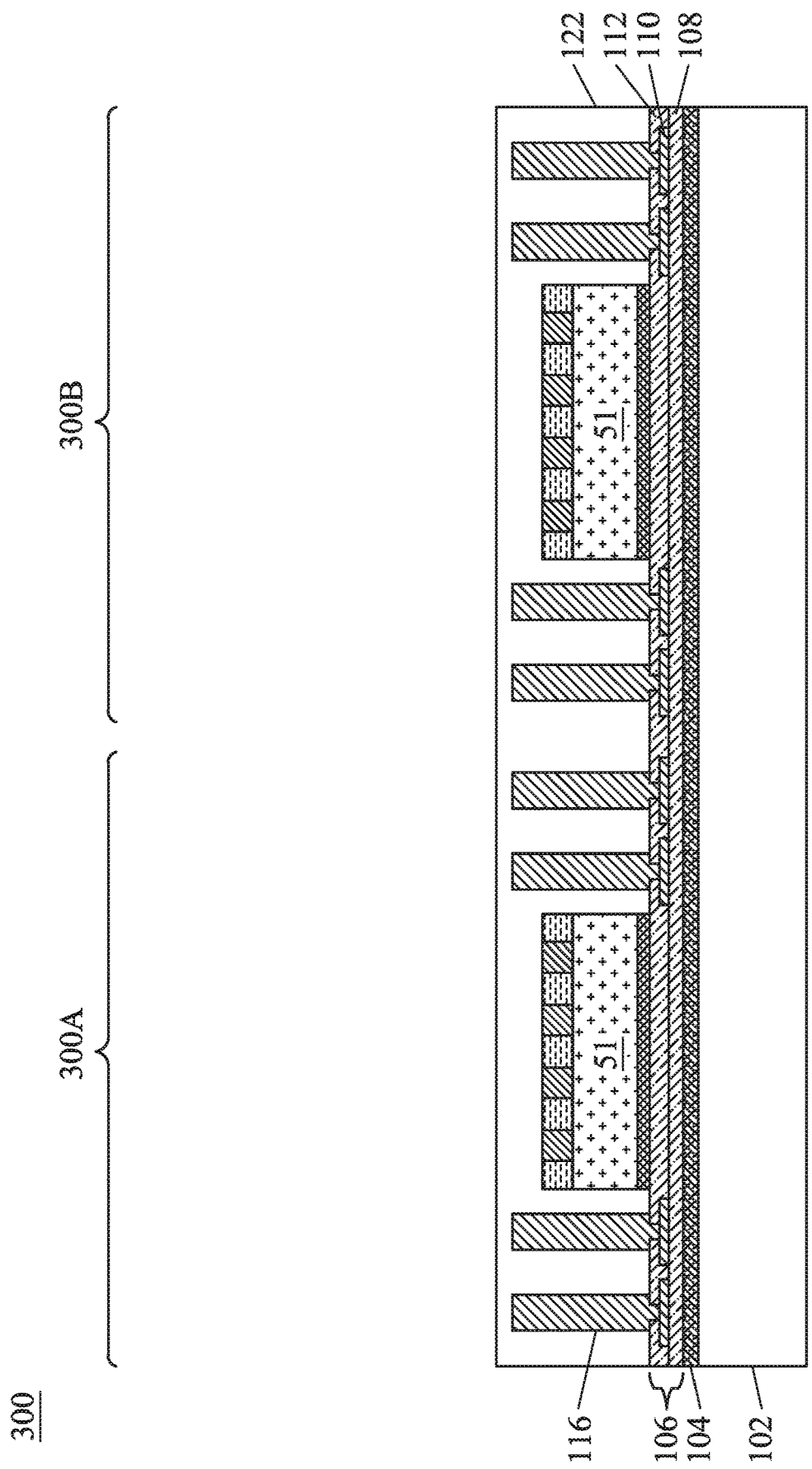

In FIG. 30, an encapsulant 122 is formed on and around the various components. After formation, the encapsulant 122 encapsulates the TVs 116 and interposer dies 51. The encapsulant 122 may be a molding compound, epoxy, or the like. The encapsulant 122 may be applied by compression molding, transfer molding, or the like, and may be formed over the carrier substrate 102 such that the TVs 116 and/or the interposer dies 51 are buried or covered. The encapsulant 122 may be applied in liquid or semi-liquid form and then subsequently cured.

Figure 31:
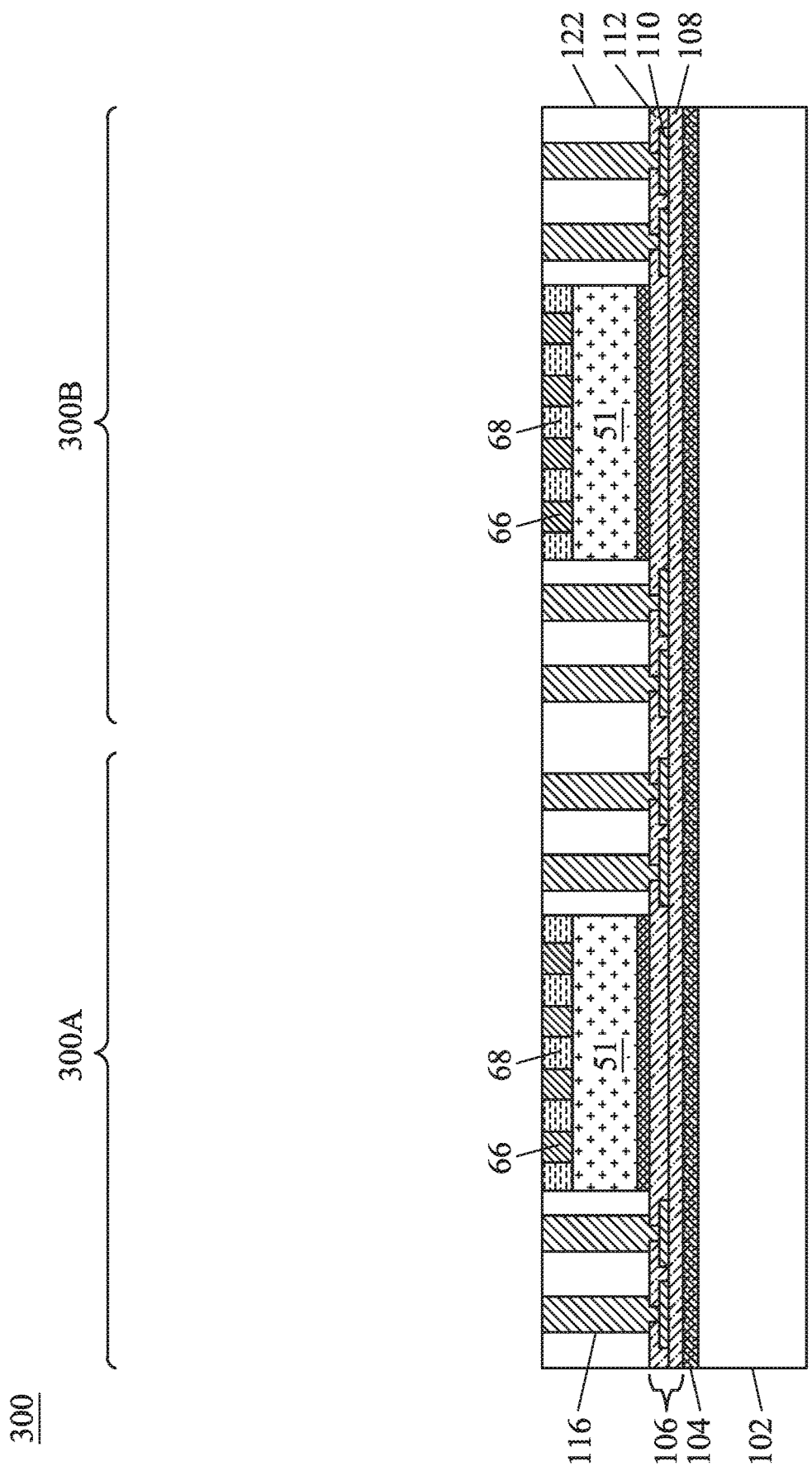

In FIG. 31, a planarization process is performed on the encapsulant 122 to expose the TVs 116 and the die connectors 66. The planarization process may also remove material of the TVs 116, the insulating layers 68, and/or the die connectors 66 until the die connectors 66 and TVs 116 are exposed. Top surfaces of the TVs 116, die the die connectors 66, the insulating layers 68, and the encapsulant 122 are substantially coplanar after the planarization process (within process variations). The planarization process may be, for example, a CMP process, a grinding process, an etching process, the like, or a combination thereof. In some embodiments, the planarization may be omitted, for example, if the TVs 116 and/or the die connectors 66 are already exposed.

Figure 32:
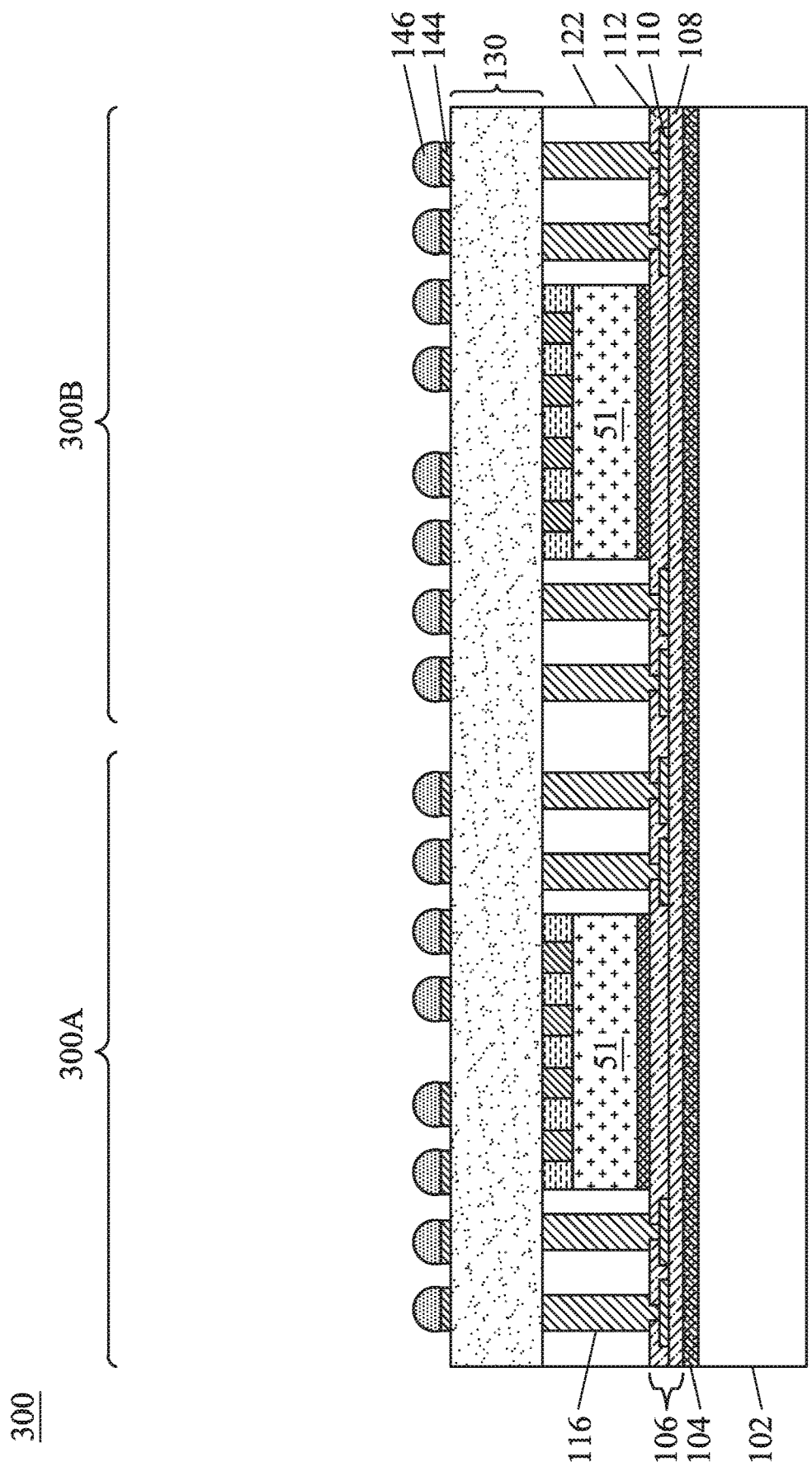

In FIG. 32, a redistribution structure 130 is formed over the encapsulant 122, TVs 116, and interposer dies 51. The redistribution structure 130 may comprise a plurality of insulating layers and a plurality of metallization patterns (not individually shown) formed in an alternating manner. In some embodiments, the redistribution structure 130 may be formed as described below with reference to FIG. 39A, and the detailed description is provided at that time.

Subsequently, UBM structures 144 are formed over and in electrical contact with the redistribution structure 130. In some embodiments, the UBM structures 144 may have via portions extending into the redistribution structure 130, pad portions on and extending along the major surface of the redistribution structure 130, and column portions over the pad portions. In some embodiments, the UBM structures 144 may be formed as described below with reference to FIG. 39A, and the detailed description is provided at that time. After forming the UBMs 144, conductive connectors 146 are formed on the UBMs 144 as described above with reference to FIG. 4 and the description is not repeated herein.

Figure 33:
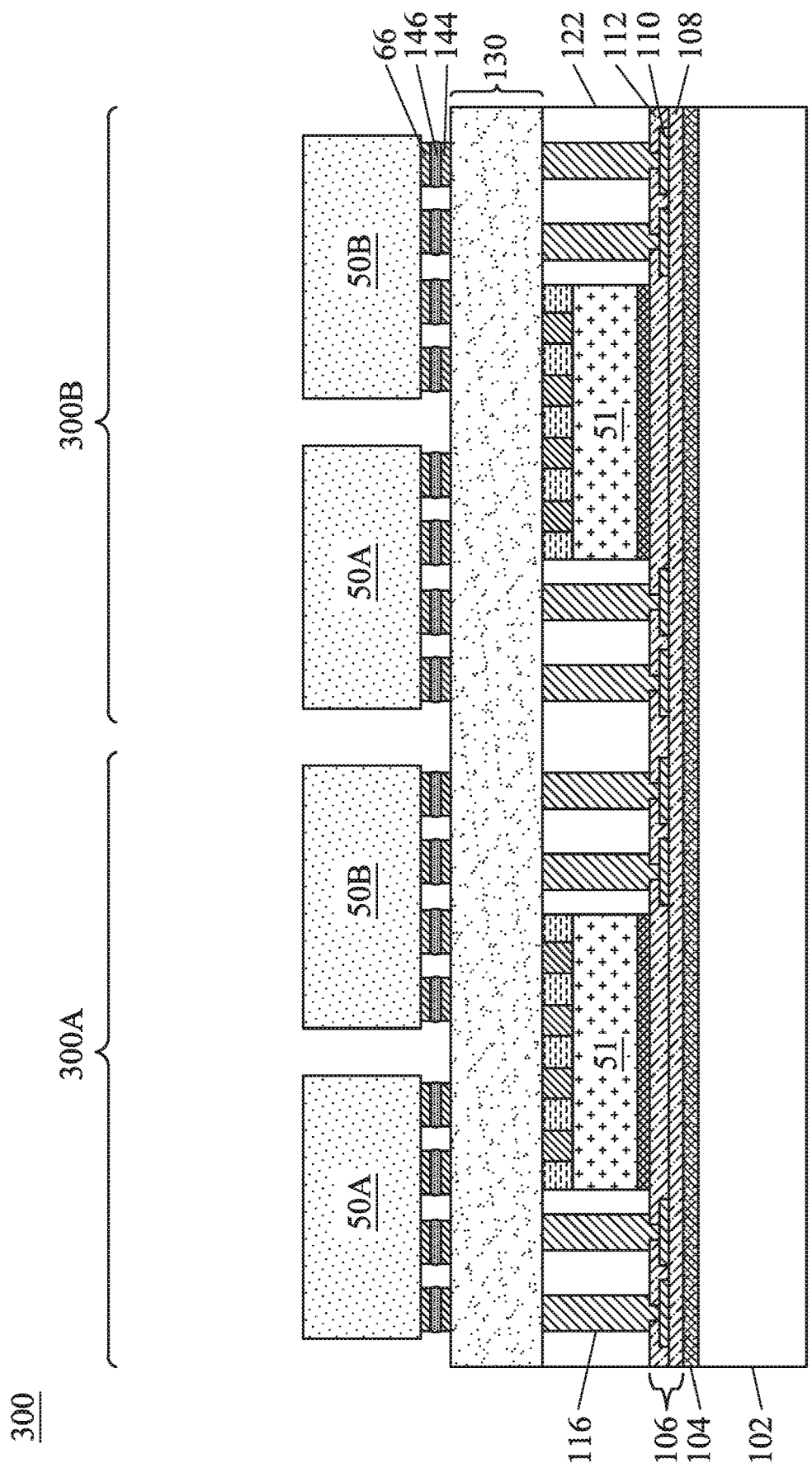

In FIG. 33, integrated circuit dies 50 (e.g., first integrated circuit dies 50A and second integrated circuit dies 50B) are attached to the structure of FIG. 32. A desired type and quantity of integrated circuit dies 50 are adhered in each of the package regions 300A and 300B. The integrated circuit dies 50 may be referred to as package modules 50. In the embodiment shown, multiple integrated circuit dies 50 are adhered adjacent one another, including the first integrated circuit die 50A and the second integrated circuit die 50B in each of the first package region 300A and the second package region 300B. In some embodiments, the integrated circuit dies 50 are attached to the conductive connectors 146 as described above with reference to FIG. 5, and the description is not repeated herein.

Figure 34:
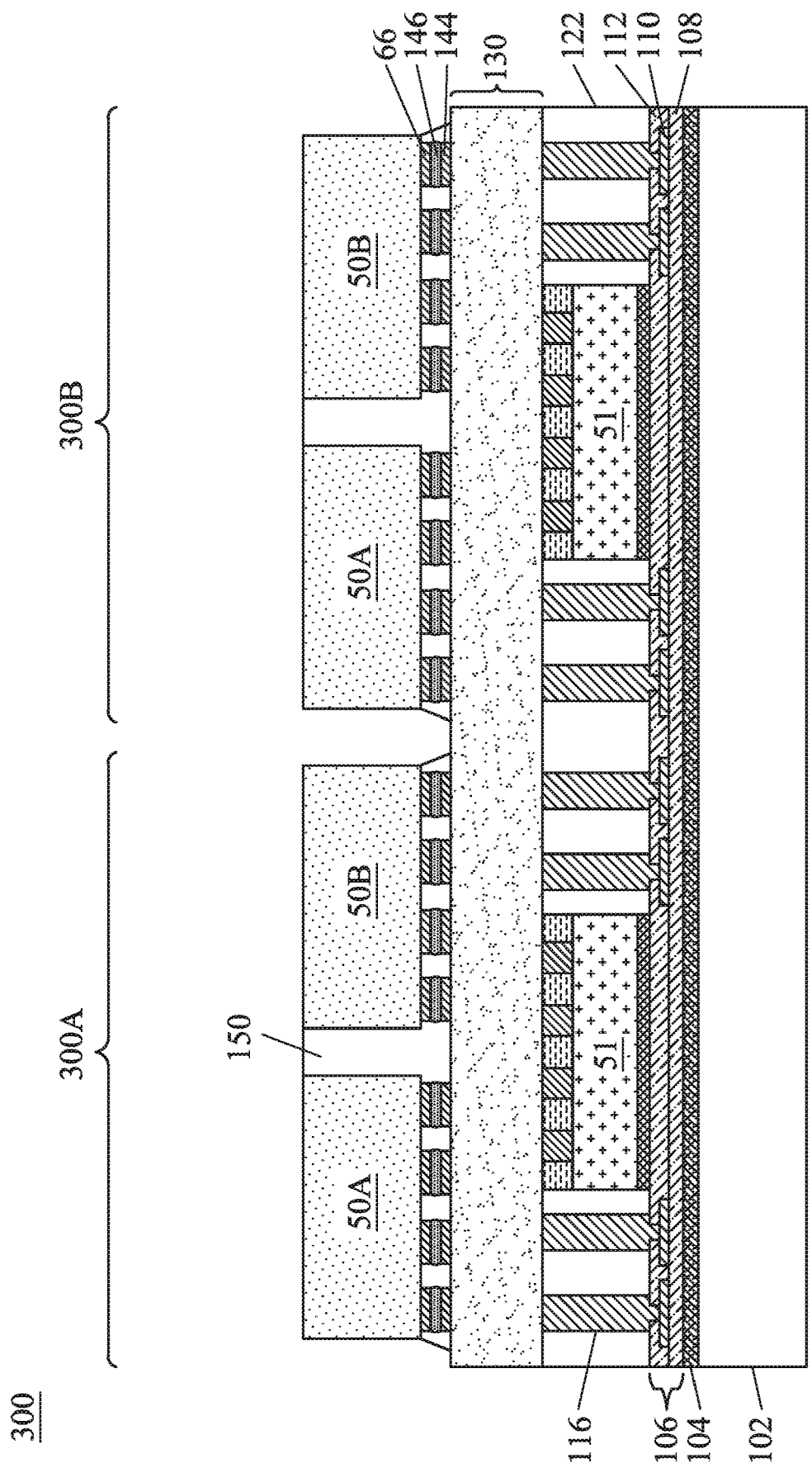

In FIG. 34, an underfill 150 is formed between the integrated circuit dies 50A and 50B in each of the regions 300A and 300B and the redistribution structure 130, including between and around the UBM structures 144, the conductive connectors 146, and the die connectors 66 as described above with reference to FIG. 6, and the description is not repeated herein.

Figure 35:
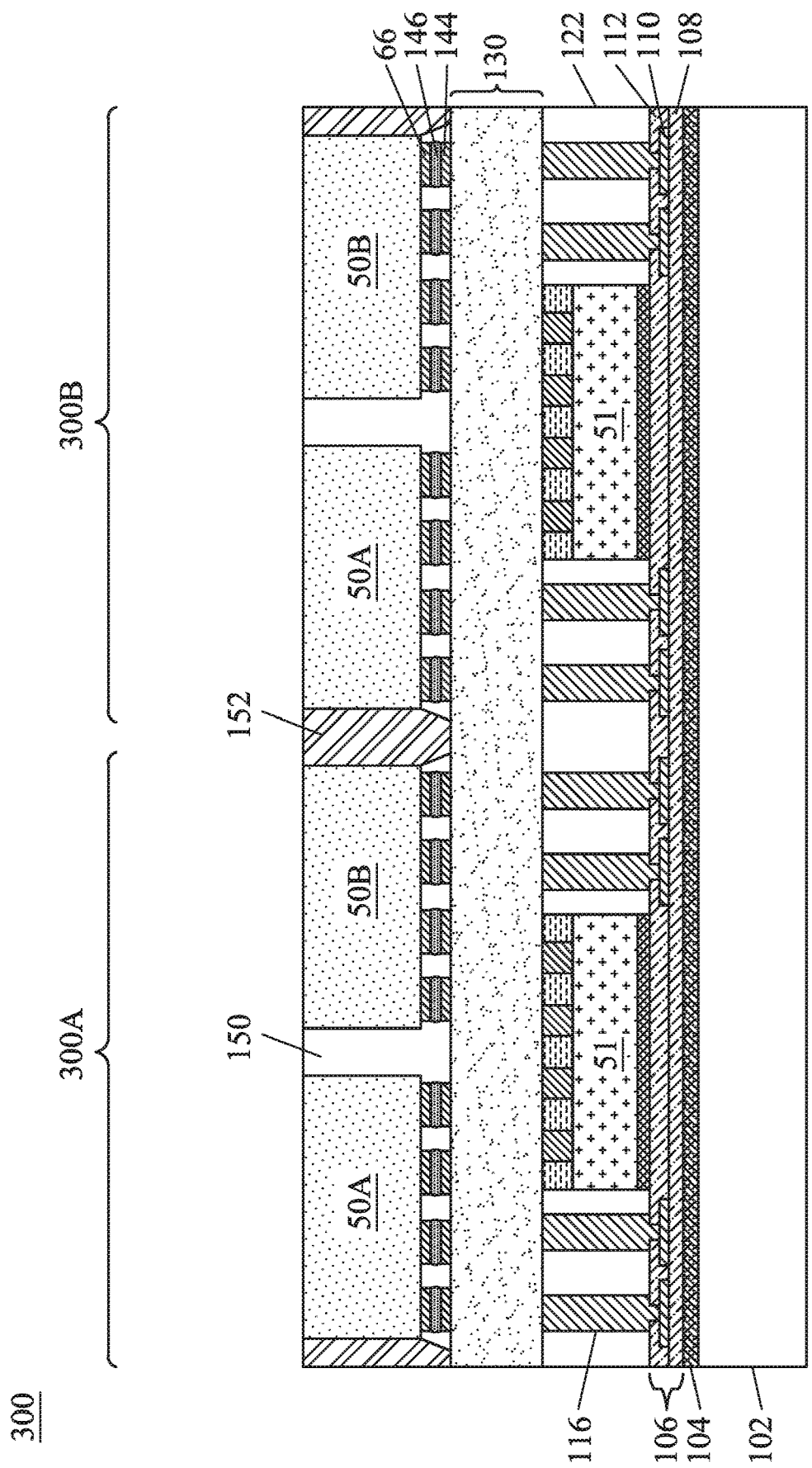

In FIG. 35, an encapsulant 152 is formed around the integrated circuit dies 50, the conductive connectors 146, and the underfill 150 as described above with reference to FIG. 7, and the description is not repeated herein. In some embodiments, a planarization step may be performed to remove and planarize an upper surface of the encapsulant 152. The planarization step may comprise a CMP process, a grinding process, an etching process, the like, or a combination thereof. In some embodiments, surfaces of the underfill 150, the encapsulant 152, and the integrated circuits dies 50 are coplanar (within process variation).

Figure 36:
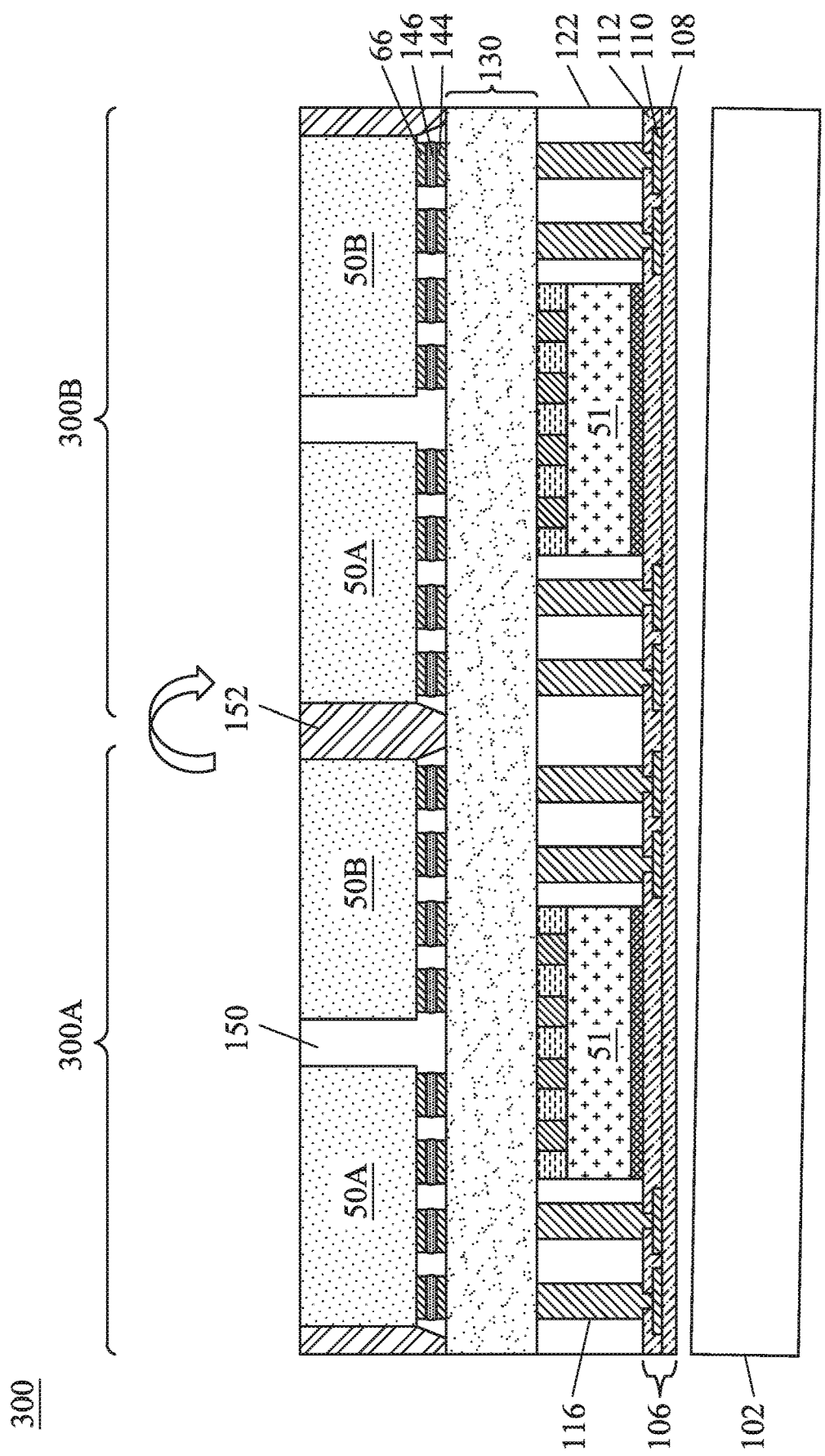

In FIG. 36, a carrier substrate de-bonding is performed to detach (or "de-bond") the carrier substrate 102 from the redistribution structure 106. In accordance with some embodiments, the de-bonding includes projecting a light such as a laser light or an UV light on the release layer 104 so that the release layer 104 decomposes under the heat of the light and the carrier substrate 102 can be removed. The structure is then flipped over and placed on a tape (not shown).

Figure 37:
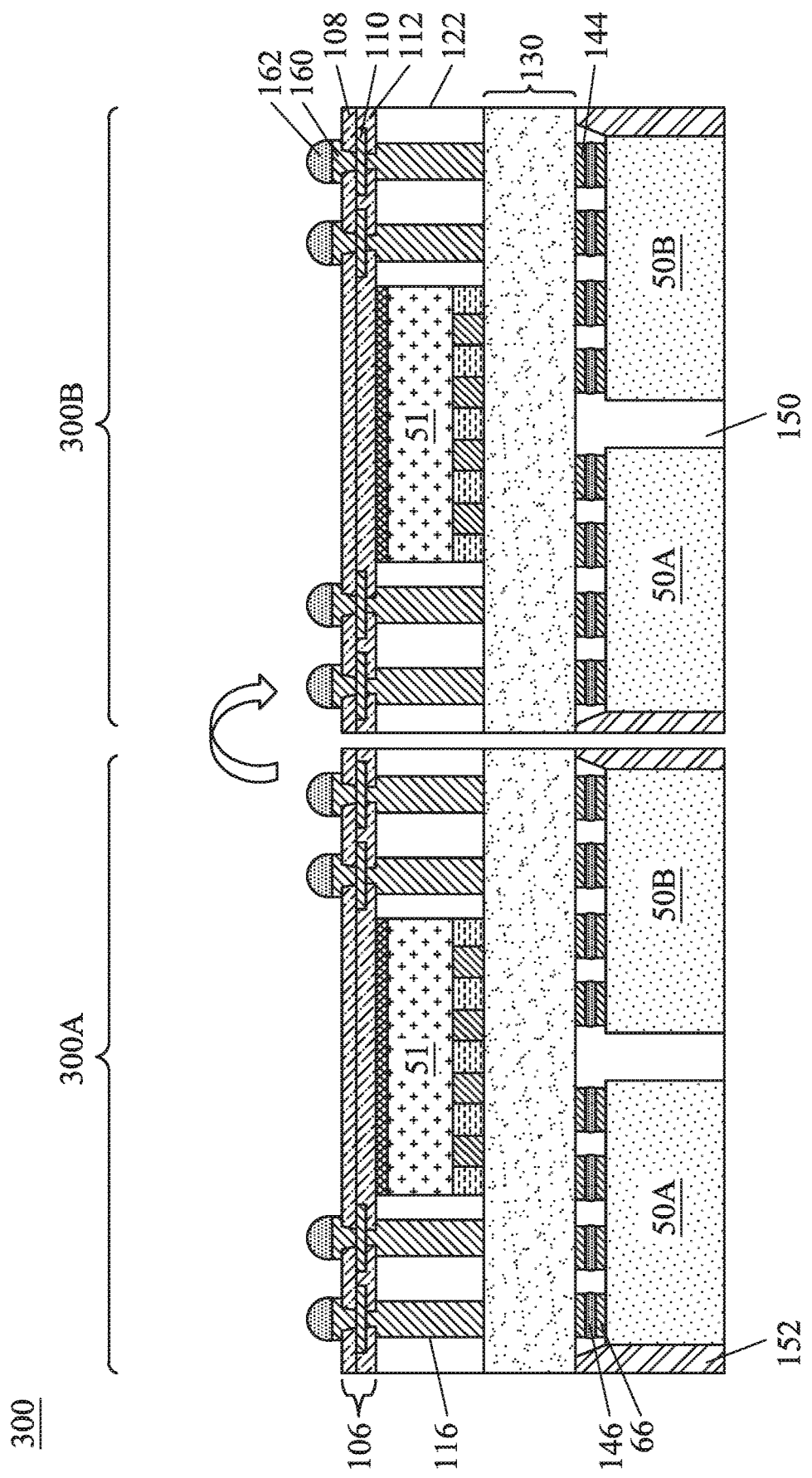

In FIG. 37, UBM structures 160 are formed for external connection to the redistribution structure 106 as described above with reference to FIG. 9, and the description is not repeated herein. Subsequently, conductive connectors 162 are formed on the UBM structures 160 as described above with reference to FIG. 9, and the description is not repeated herein.

Further in FIG. 37, a singulation process is performed by sawing along scribe line regions, e.g., between the first package region 300A and the second package region 300B. The sawing singulates the first package region 300A from the second package region 300B. The resulting, singulated device stack is from one of the first package region 300A or the second package region 300B. The singulated structures are then each flipped over and mounted on a package substrate 200 (see FIG. 38).

Figure 38:
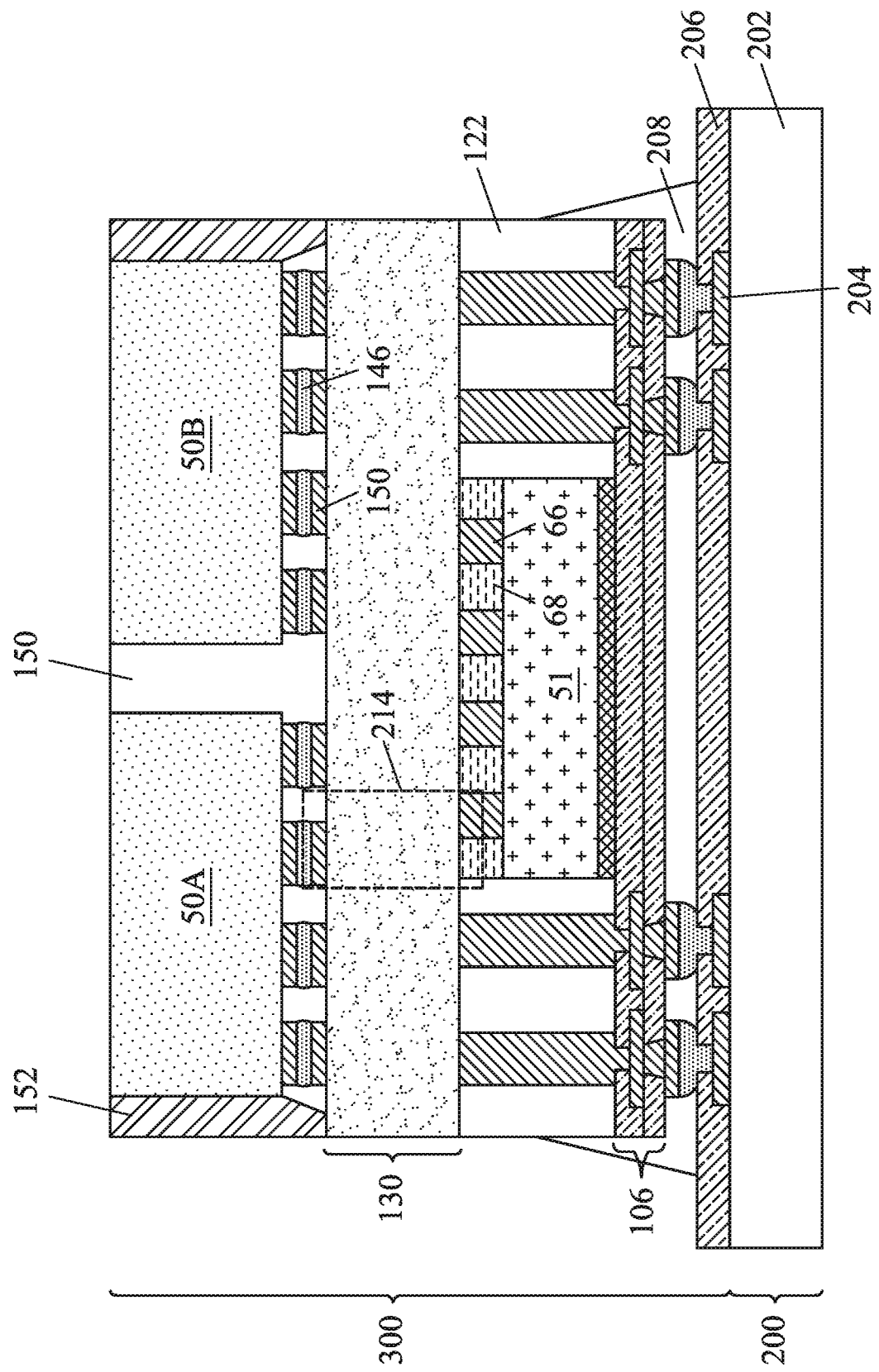

In FIG. 38, the package component 300 may be mounted to the package substrate 200 using the conductive connectors 162 as described above with reference to FIG. 11, and the description is not repeated herein. In some embodiments, an underfill 208 may be formed between the package component 300 and the package substrate 200 and surrounding the conductive connectors 162 as described above with reference to FIG. 11, and the description is not repeated herein.

Figures 39A, 39B:
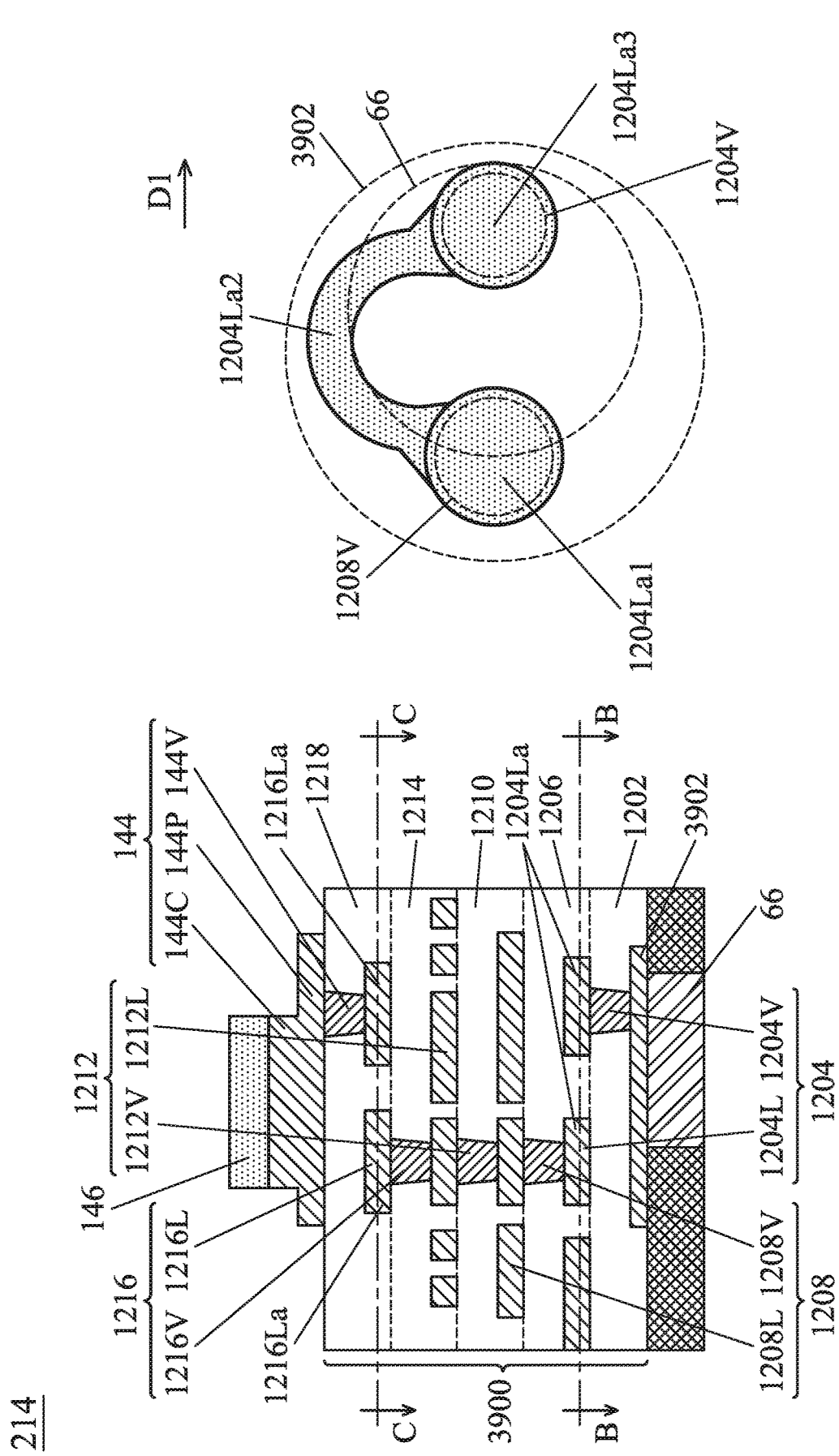
FIG. 39A is a cross-sectional view of redistribution and under-bump metallization structures in accordance with some embodiments.
FIG. 39B is a plan view of conductive features in accordance with some embodiments.

FIG. 39A is a cross-sectional view a region 214 of the package component 300 (see FIG. 38) in accordance with some embodiments. In the illustrated embodiment, the redistribution structure 3900 is implemented as the redistribution structure 130 of the package component 300 (see FIG. 38). The structure of FIG. 39A is similar to the structure of FIG. 21, with similar features being labeled with similar numerical references, and descriptions of the similar features are not repeated herein.

In some embodiments, the redistribution structure 3900 is formed over the die connectors 66 and the insulating layers 68 of the interposer dies 51 (see FIG. 38). The redistribution structure 3900 includes insulating layers 1202, 1206, 1210, 1214 and 1218; and metallization patterns 1204, 1208, 1212 and 1216. In some embodiments, the redistribution structure 3900 may be formed in a similar manner as the redistribution structure 1200 described above with reference to FIGS. 12-15, and the description is not repeated herein. Subsequently, UBM 144 and the conductive connector 146 is formed over the redistribution structure as described above with reference to FIGS. 15-21, and the description is not repeated herein. As described below in greater detail, the conductive lines 1216L comprises a conductive line 1216La, which has a "C"-like or "U"-like shape in a plan view. Furthermore, the conductive lines 1204L comprises a conductive line 1204La, which has a "C"-like or "U"-like shape in a plan view In some embodiments, before forming the redistribution structure 3900, a pad 3902 is formed over the die connector 66. In some embodiments, the pad 3902 may be formed using similar materials and methods as the UBM pad 144P described above with reference to FIGS. 15-21, and the description is not repeated herein. The pad 3902 may also be referred to as a UBM pad 3902.

FIG. 39B is a plan view of conductive features of the structure illustrated in FIG. 39A along a cross-section BB in accordance with some embodiments. In some embodiment, the conductive line 1204La has a curved, "C"-like or "U"-like shape in a plan view in which the via 1208V is located at a first end of the curved shape and the via 1204V is located at a second end of the curved shape. In some embodiments, the conductive line 1204La is disposed above the pad 3902 and within a perimeter of the pad 3902 in a plan view. The curved, "C"-like or "U"-like shape can act like a coil of a spring and flex and deform without breaking. Metallization patterns in redistribution structures may bend or deform due to CTE mismatch of materials in a semiconductor package. This CTE mismatch can cause the metallization patterns to endure high stress due to the bending and deformation. However, the disclosed shapes of the metallization patterns with the increased flexibility increase the reliability of the redistribution structure. The flexibly-shaped metallization pattern 1204 and the flexible insulating layer 1202 (see FIG. 39A) may be referred to as stress buffer films as they provide a buffer to safely release the stress in the redistribution structure and the package structure.

In some embodiments, the conductive line 1204La comprises a first portion 1204La1 directly below the via 1208V, a third portion 1204La3 directly above the via 1204V, and a second portion 1204La2 connecting the first portion 1204La1 to the third portion 1204La3. The first and third portions 1204La1 and 1204La3 are the pad portions that are coupled to the overlying and underlying vias 1208V and 1204V, and the second portion 1204La2 has a curved or detour pattern and connects the first and third portions 1204La1 and 1204La3. The detour pattern of the second portion 1204La2 helps the conductive features of the metallization pattern 1204 to safely release the stress in the redistribution structure 3900 and/or the package structure.

In some embodiments, the pad portions 1204La1 and 1204La3 are wider, in a plan view, than the curved portion 1204La2. This allows for the pad portions 1204La1 and 1204La3 to make better connections to the overlying and underlying vias and to improve the reliability of the redistribution structure. Centers of the pad portions 1204La1 and 1204La3 are laterally shifted with respect to a center of the pad 3902, such that the center of the pad portion 1204La1 is shifted in a first direction and the center of the pad portion 1204La3 is shifted in a second direction different from the first direction. In some embodiments, the first direction is opposite to the second direction.

In some embodiments, the pad 3902 has a circular shape in a plan view. In other embodiments, the pad 3902 may have any desired shape based on design requirements. In some embodiments, the pad 3902 has a diameter less than about 60 µm. In some embodiments, the die connector 66 has a circular shape in a plan view. In other embodiments, the die connector 66 may have any desired shape based on design requirements. In some embodiments, the die connector 66 has a diameter less than about 20 µm. In some embodiments, the diameter of the pad 3902 is greater than the diameter of the die connector 66. The center of the die connector 66 is shifted with respect to the center of the pad 3902 in a first direction D1 in a plan view. In some embodiments, the die connector 66 fully overlaps with the via 1204V and partially overlaps with the via 1208V in a plan view. By forming the die connectors 66 and the pads 3902 having shapes and arrangements as described above, stress transmitted to the metallization patterns 1204, 1208, 1212, and 1216 of redistribution structure 3900 from the die connectors 66 due to CTE mismatch is reduced.

Figure 39C:
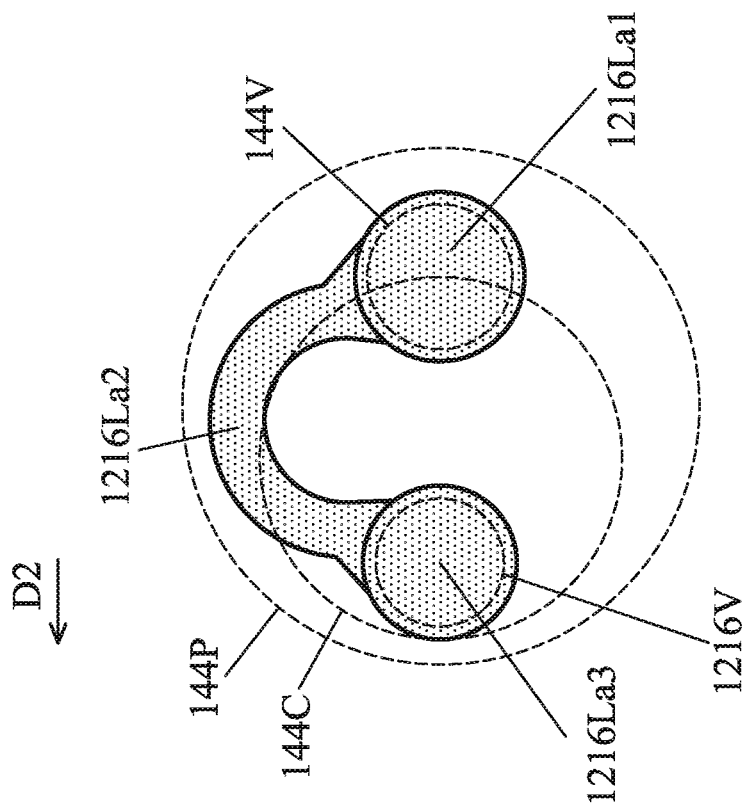
FIG. 39C is a plan view of conductive features in accordance with some embodiments.

FIG. 39C is a plan view of conductive features of the structure illustrated in FIG. 39A along a cross-section CC in accordance with some embodiments. In some embodiment, the conductive line 1216La has a curved, "C"-like or "U"-like shape in a plan view in which the UBM via 144V is located at a first end of the curved shape and the via 1216V is located at a second end of the curved shape. In some embodiments, the conductive line 1216La is disposed below the UBM pad 144P and within a perimeter of the UBM pad 144P in a plan view. The curved, "C"-like or "U"-like shape can act like a coil of a spring and flex and deform without breaking. Metallization patterns in redistribution structures may bend or deform due to CTE mismatch of materials in a semiconductor package. This CTE mismatch can cause the metallization patterns to endure high stress due to the bending and deformation. However, the disclosed shapes of the metallization patterns with the increased flexibility increase the reliability of the redistribution structure. The flexibly-shaped metallization pattern 1216 and the flexible insulating layer 1218 (see FIG. 39A) may be referred to as stress buffer films as they provide a buffer to safely release the stress in the redistribution structure and the package structure.

In some embodiments, the conductive line 1216La comprises a first portion 1216La1 directly below the UBM via 144V, a third portion 1216La3 directly above the via 1216V, and a second portion 1216La2 connecting the first portion 1216La1 to the third portion 1216La3. The first and third portions 1216La1 and 1216La3 are the pad portions that are coupled to the overlying and underlying vias 144V and 1216V, and the second portion 1216La2 has a curved or detour pattern and connects the first and third portions 1216La1 and 1216La3. The detour pattern of the second portion 1216La2 helps the conductive features of the metallization pattern 1216 to safely release the stress in the redistribution structure and/or the package structure.

In some embodiments, the pad portions 1216La1 and 1216La3 are wider, in a plan view, than the curved portion 1216La2. This allows for the pad portions 1216La1 and 1216La1 to make better connections to the overlying and underlying vias and to improve the reliability of the redistribution structure. Centers of the pad portions 1216La1 and 1216La3 are laterally shifted with respect to a center of the UBM pad 144P, such that the center of the pad portion 1216La1 is shifted in a first direction and the center of the pad portion 1216La3 is shifted in a second direction different from the first direction. In some embodiments, the first direction is opposite to the second direction.

In some embodiments, the UBM pad 144P has a circular shape in a plan view. In other embodiments, the UBM pad 144P may have any desired shape based on design requirements. In some embodiments, the UBM pad 144P has a diameter less than about 60 μm. In some embodiments, the UBM column 144C has a circular shape in a plan view. In other embodiments, the UBM column 144C may have any desired shape based on design requirements. In some embodiments, the UBM column 144C has a diameter less than about 60 μm. In some embodiments, the diameter of the UBM pad 144P is greater than the diameter of the UBM column 144C. The center of the UBM column 144C is shifted with respect to the center of the pad portion 144P of the UBM structure 144 in in a second direction D2 in a plan view. In some embodiments, the second direction D2 is different from the first direction D1 (see FIG. 39B). In some embodiments, the second direction D2 is opposite to the first direction D1 (see FIG. 39B). In some embodiments, the UBM column 144C fully covers the via 1216V and partially covers the UBM via 144V in a plan view.

By forming UBM structures 144 comprising UBM vias 144V, UBM pads 144P, and UBM columns 144C with shapes and arrangements as described above, stress transmitted to the metallization patterns 1204, 1208, 1212, and 1216 of redistribution structures 3900 from conductive connectors 146 bonded to the UBM structures 144 due to CTE mismatch of materials in a semiconductor package is reduced.

Figure 40:
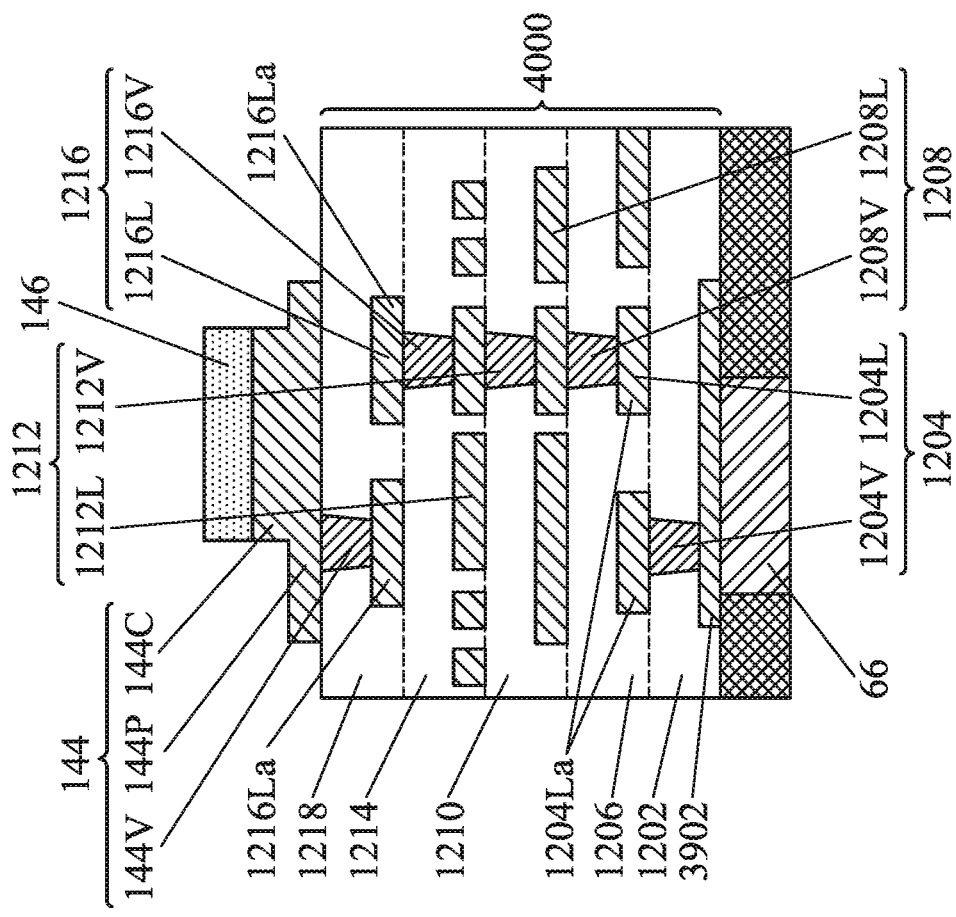
FIG. 40 is a cross-sectional view of redistribution and under-bump metallization structures in accordance with some embodiments.

FIG. 40 is a cross-sectional view a region 214 of the package component 300 (see FIG. 38) in accordance with some embodiments. In the illustrated embodiment, the redistribution structure 4000 is implemented as the redistribution structure 130 of the package component 300 (see FIG. 38). The structure of FIG. 40 is similar to the structure of FIG. 39A, with similar features being labeled with similar numerical references, and descriptions of the similar features are not repeated herein. The redistribution structure 4000 includes insulating layers 1202, 1206, 1210, 1214 and 1218; and metallization patterns 1204, 1208, 1212 and 1216. In some embodiments, the redistribution structure 4000 may be formed in a similar manner as the redistribution structure 3900 described above with reference to FIG. 39A, and the description is not repeated herein. The metallization patterns 1204, 1208, 1212 and 1216 of the redistribution structure 4000, the UBM via 144V, the UBM pad 144P, the UBM column 144C, and the pad 3902 are arranged such that the structure of FIG. 40 is a mirror image of the structure of FIG. 39A.

Figures 41, 42:
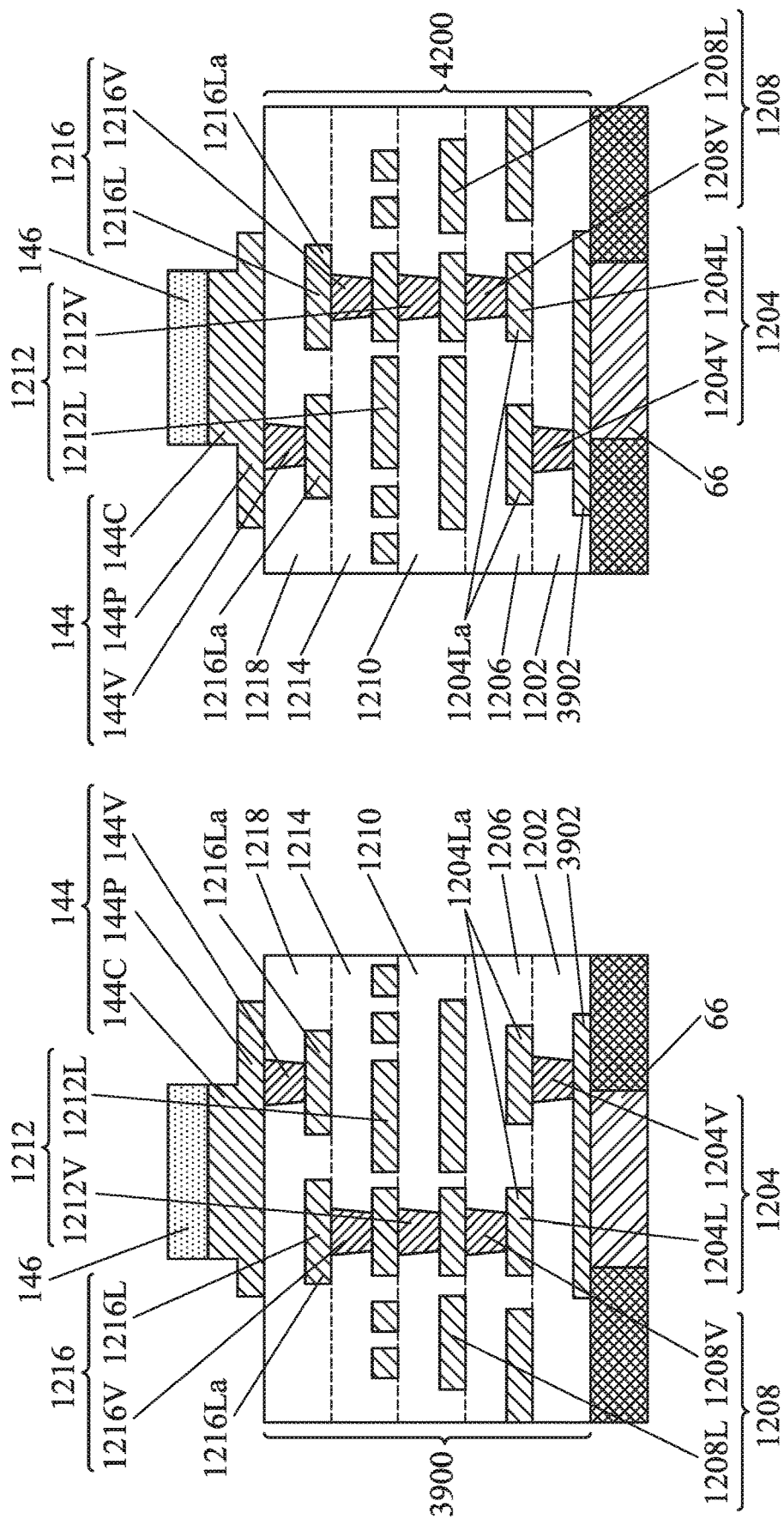
FIG. 41 is a cross-sectional view of redistribution and under-bump metallization structures in accordance with some embodiments.
FIG. 42 is a cross-sectional view of redistribution and under-bump metallization structures in accordance with some embodiments.

FIG. 41 is a cross-sectional view a region 214 of the package component 300 (see FIG. 38) in accordance with some embodiments. In the illustrated embodiment, the redistribution structure 3900 is implemented as the redistribution structure 130 of the package component 300 (see FIG. 38). The structure of FIG. 41 is similar to the structure of FIG. 39A, with similar features being labeled with similar numerical references, and descriptions of the similar features are not repeated herein. In some embodiments, the structure of FIG. 41 may be formed in a similar manner as the structure of FIG. 39A, and the description is not repeated herein. In distinction with the structure of FIG. 39A, centers of the die connector 66 and the UBM column 144C of the structure of FIG. 41 are shifted in a same direction with respect to centers of corresponding pads 3902 and 144P.

FIG. 42 is a cross-sectional view a region 214 of the package component 300 (see FIG. 38) in accordance with some embodiments. In the illustrated embodiment, the redistribution structure 4200 is implemented as the redistribution structure 130 of the package component 300 (see FIG. 38). The structure of FIG. 42 is similar to the structure of FIG. 41, with similar features being labeled with similar numerical references, and descriptions of the similar features are not repeated herein. The redistribution structure 4200 includes insulating layers 1202, 1206, 1210, 1214 and 1218; and metallization patterns 1204, 1208, 1212 and 1216. In some embodiments, the structure of FIG. 42 may be formed in a similar manner as the structure of FIG. 41, and the description is not repeated herein. The metallization patterns 1204, 1208, 1212 and 1216 of the redistribution structure 4200, the UBM via 144V, the UBM pad 144P, the UBM column 144C, and the pad 3902 are arranged such that the structure of FIG. 42 is a mirror image of the structure of FIG. 41.

Figure 43:
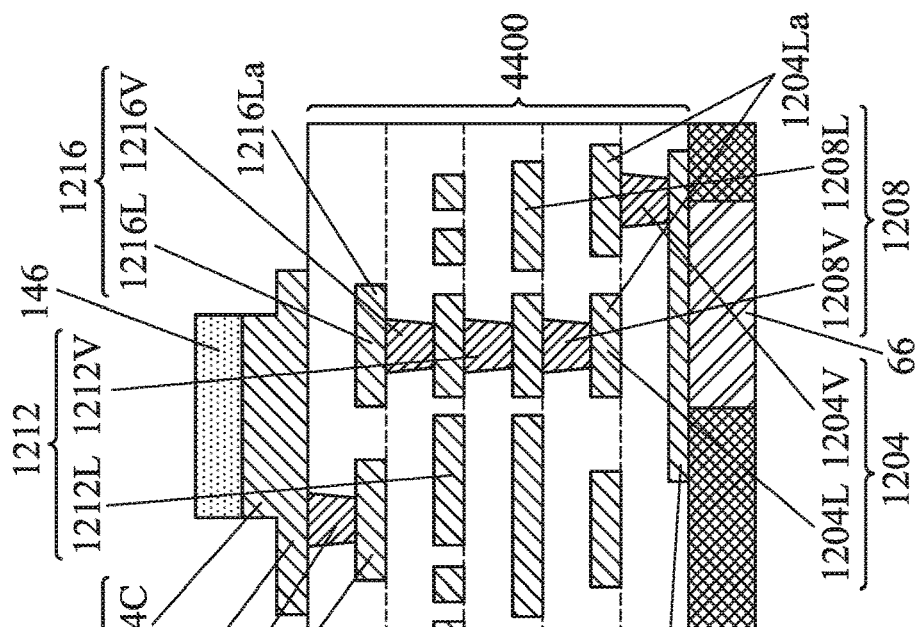
FIG. 43 is a cross-sectional view of redistribution and under-bump metallization structures in accordance with some embodiments.

FIG. 43 is a cross-sectional view a region 214 of the package component 300 (see FIG. 38) in accordance with some embodiments. In the illustrated embodiment, the redistribution structure 4300 is implemented as the redistribution structure 130 of the package component 300 (see FIG. 38). The structure of FIG. 43 is similar to the structure of FIG. 39A, with similar features being labeled with similar numerical references, and descriptions of the similar features are not repeated herein. The redistribution structure 4300 includes insulating layers 1202, 1206, 1210, 1214 and 1218; and metallization patterns 1204, 1208, 1212 and 1216. In some embodiments, the structure of FIG. 43 may be formed in a similar manner as the structure of FIG. 39A, and the description is not repeated herein. In distinction with the structure of FIG. 39A, the pad 3902 is laterally shifted with respect to the UBM pad 144P, such that the pad 3902 and the UBM pad 144P partially overlap in a plan view. Furthermore, the conductive line 1204La is laterally shifted with respect to the conductive line 1216La, such that the conductive line 1204La and the conductive line 1216La partially overlap in a plan view. In addition, the via 1204V and the UBM via 144V are laterally shifted with respect to stacked vias 1208V, 1212V, and 1216V, such that the stacked vias 1208V, 1212V, and 1216V are laterally interposed between the via 1204V and the UBM via 144V.

Figure 44:
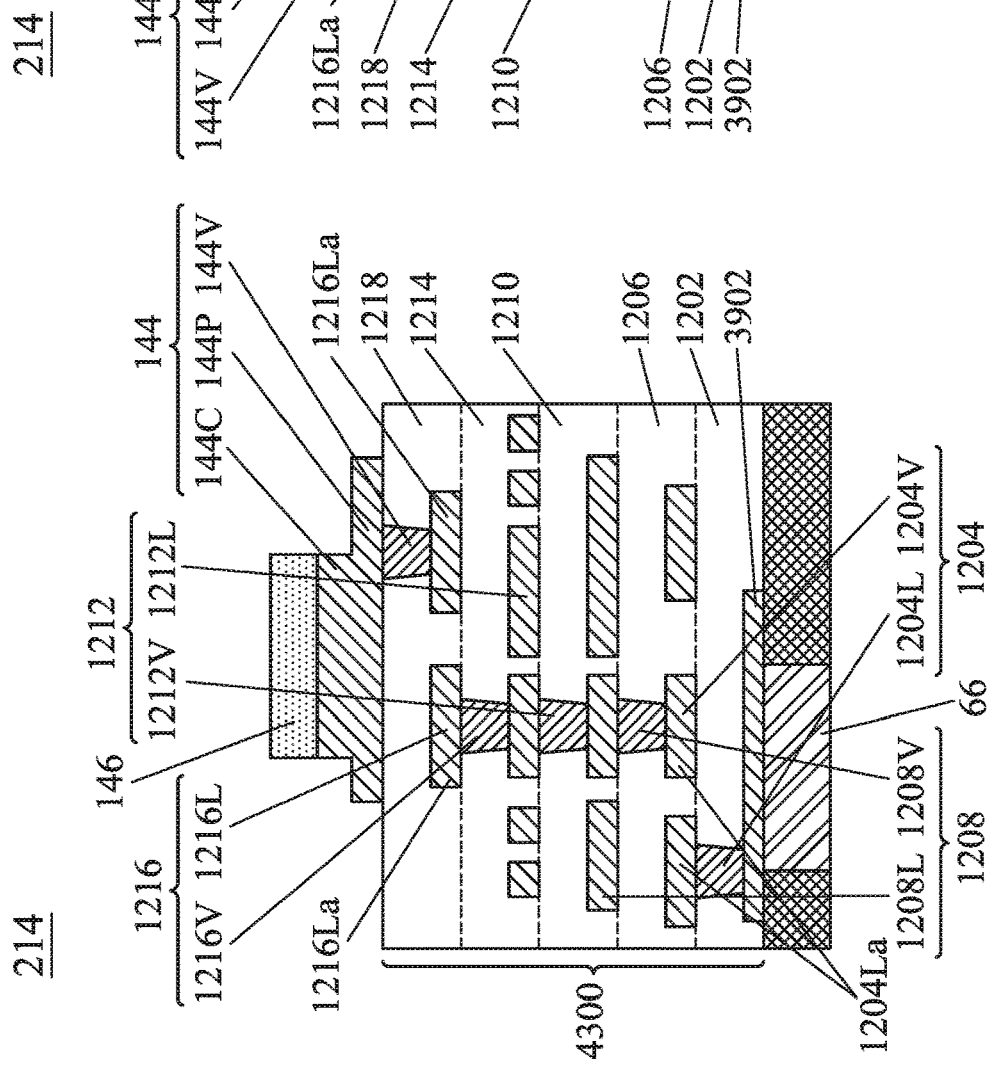
FIG. 44 is a cross-sectional view of redistribution and under-bump metallization structures in accordance with some embodiments.

FIG. 44 is a cross-sectional view a region 214 of the package component 300 (see FIG. 38) in accordance with some embodiments. In the illustrated embodiment, the redistribution structure 4400 is implemented as the redistribution structure 130 of the package component 300 (see FIG. 38). The structure of FIG. 44 is similar to the structure of FIG. 43, with similar features being labeled with similar numerical references, and descriptions of the similar features are not repeated herein. The redistribution structure 4400 includes insulating layers 1202, 1206, 1210, 1214 and 1218; and metallization patterns 1204, 1208, 1212 and 1216. In some embodiments, the structure of FIG. 44 may be formed in a similar manner as the structure of FIG. 43, and the description is not repeated herein. The metallization patterns 1204, 1208, 1212 and 1216 of the redistribution structure 4200, the UBM via 144V, the UBM pad 144P, the UBM column 144C, and the pad 3902 are arranged such that the structure of FIG. 44 is a mirror image of the structure of FIG. 43.

Figure 45:
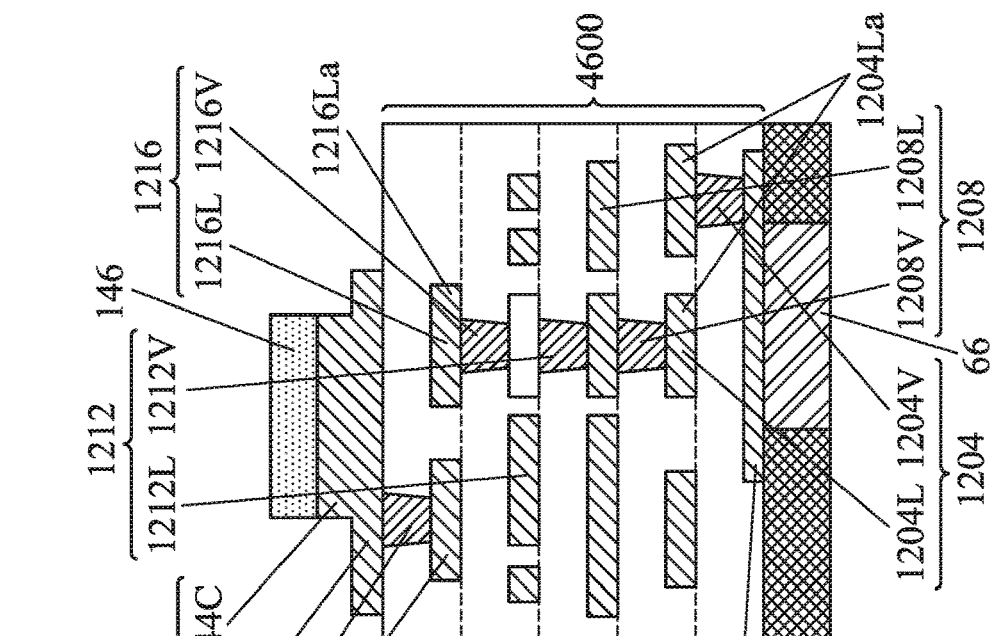
FIG. 45 is a cross-sectional view of redistribution and under-bump metallization structures in accordance with some embodiments.

FIG. 45 is a cross-sectional view a region 214 of the package component 300 (see FIG. 38) in accordance with some embodiments. In the illustrated embodiment, the redistribution structure 4300 is implemented as the redistribution structure 130 of the package component 300 (see FIG. 38). The structure of FIG. 45 is similar to the structure of FIG. 43, with similar features being labeled with similar numerical references, and descriptions of the similar features are not repeated herein. In some embodiments, the structure of FIG. 45 may be formed in a similar manner as the structure of FIG. 43, and the description is not repeated herein. In distinction with the structure of FIG. 43, centers of the die connector 66 and the UBM column 144C of the structure of FIG. 45 are shifted in a same direction with respect to centers of corresponding pads 3902 and 144P.

Figure 46:
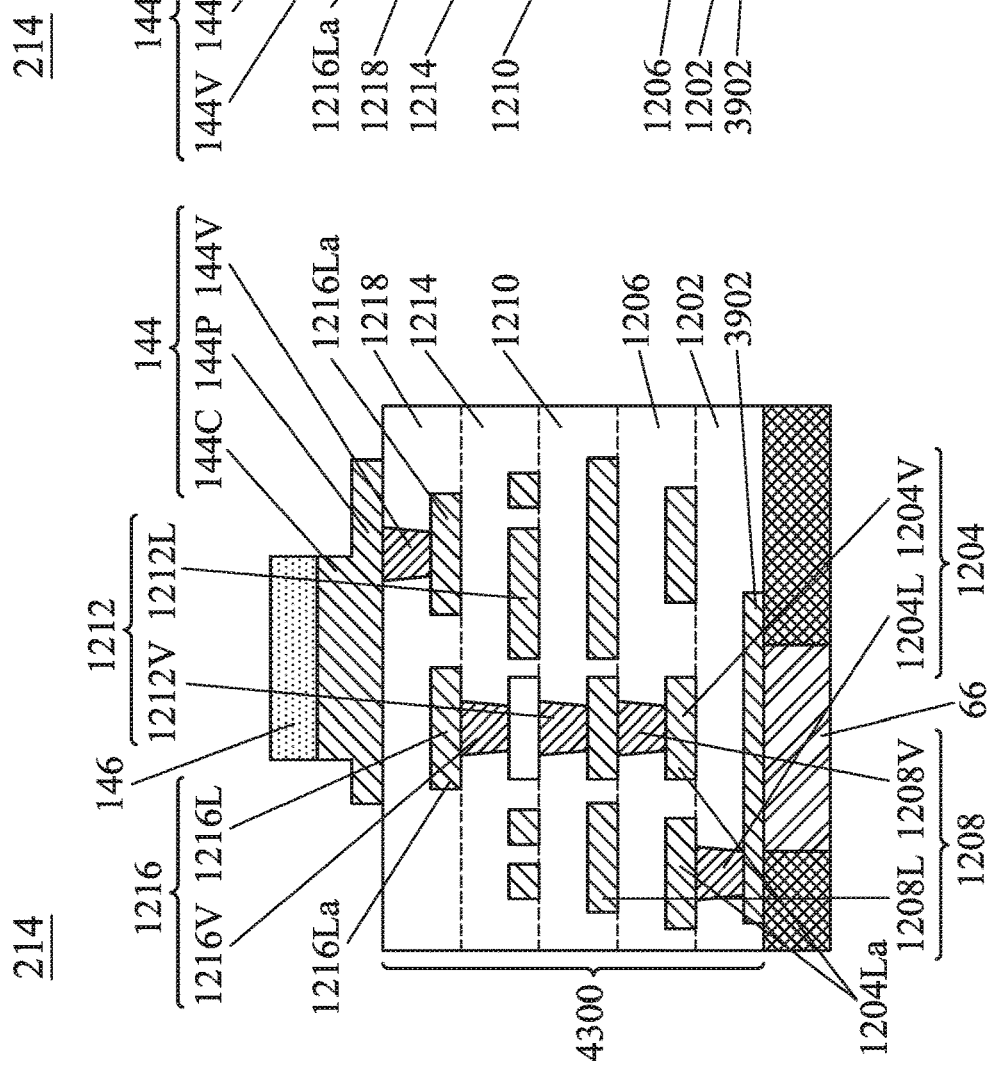
FIG. 46 is a cross-sectional view of redistribution and under-bump metallization structures in accordance with some embodiments.

FIG. 46 is a cross-sectional view a region 214 of the package component 300 (see FIG. 38) in accordance with some embodiments. In the illustrated embodiment, the redistribution structure 4600 is implemented as the redistribution structure 130 of the package component 300 (see FIG. 38). The structure of FIG. 46 is similar to the structure of FIG. 45, with similar features being labeled with similar numerical references, and descriptions of the similar features are not repeated herein. The redistribution structure 4600 includes insulating layers 1202, 1206, 1210, 1214 and 1218; and metallization patterns 1204, 1208, 1212 and 1216. In some embodiments, the structure of FIG. 46 may be formed in a similar manner as the structure of FIG. 45, and the description is not repeated herein. The metallization patterns 1204, 1208, 1212 and 1216 of the redistribution structure 4200, the UBM via 144V, the UBM pad 144P, the UBM column 144C, and the pad 3902 are arranged such that the structure of FIG. 46 is a mirror image of the structure of FIG. 45.

Figure 47:
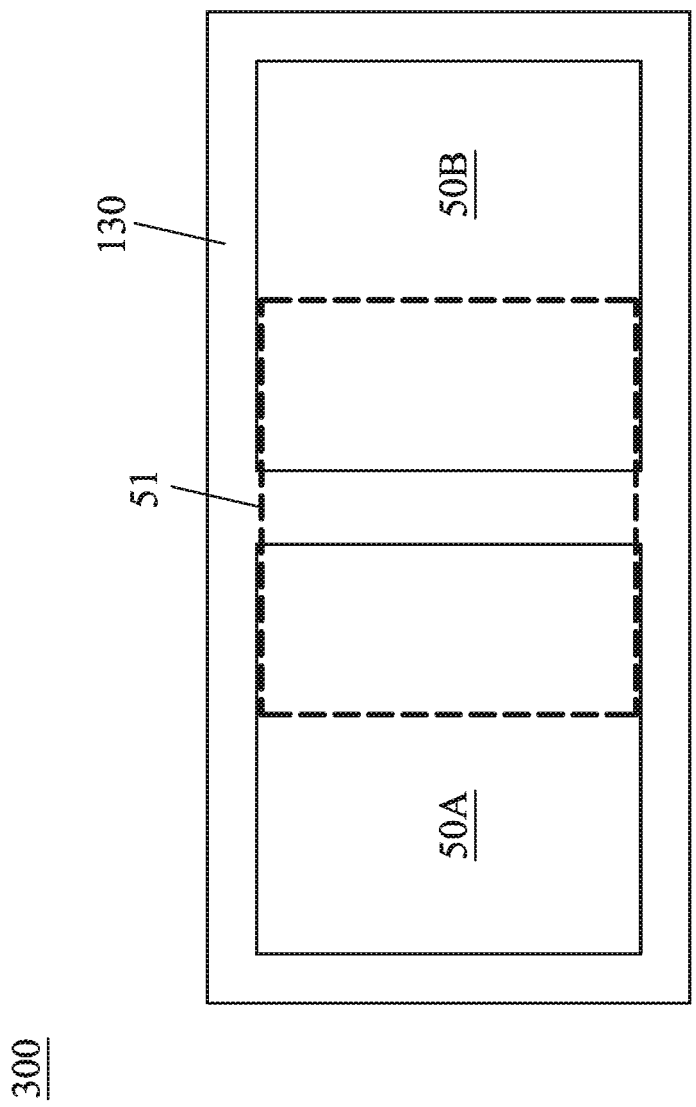
FIG. 47 is a plan view of a package component in accordance with some embodiments.

FIG. 47 is a plan view of a package component 300 (see FIG. 38) in accordance with some embodiments. In some embodiments, redistribution and UBM structures as described above with reference to FIGS. 39A and 40-46 may be formed between the interposer die 51 and respective overlapping portions of the integrating circuit dies 50A and 50B. In other embodiments, redistribution and UBM structures as described above with reference to FIGS. 39A and 40-46 may be also formed below portions of the integrating circuit dies 50A and 50B, which do not overlap with the interposer die 51 in a plan view.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or the 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. Redistribution and UBM structures and methods of forming the same are provided in accordance to some embodiments. In particular, the redistribution structures include metallization patterns with shapes that provide more flexibility for the metallization patterns to deal with bending and other deformations without breaking. Bending and other deformations may be due to stress caused by CTE mismatch of materials in a semiconductor package. For example, the metallization patterns can have a curved, "C"-like shape or a "U"-like shape in a plan view. These flexibly-shaped metallization patterns are surrounded by conforming dielectric layers, such as polymer layers. The combination of the flexibly-shaped metallization patterns and the surrounding conforming dielectric layers provide a buffer to release the stress in the redistribution structure and the package structure. Furthermore, UBM structures comprise via portions, pad portions and column portions that have shapes and arrangements to reduce stress transmitted to the metallization patterns of redistribution structures from, for example, bumps bonded to UBM structures due to CTE mismatch. For example, widths of the pad portions of UBM structures are greater than widths of corresponding pillar portions of UBM structures. In addition, centers of via portions and column portions of UBM structures are laterally shifted with respect to centers of corresponding pad portions of UBM structures in a plan view. Furthermore, redistribution structures can have stacked vias, such that centers of stacked vias are laterally shifted with respect to centers of corresponding pad portions of UBM structures in a plan view. The CTE mismatch can cause the metallization patterns to endure high stress due to the bending and deformation. However, the disclosed shapes of the metallization patterns, the disclosed arrangements of stacked vias, and the disclosed shapes and arrangements of various components of UBM structures increase the reliability of the redistribution structures.

In accordance with an embodiment, a package structure includes an integrated circuit die, a redistribution structure bonded to the integrated circuit die, and an under-bump metallization (UBM) structure between the integrated circuit die and the redistribution structure. The UBM structure electrically couples the integrated circuit die to the redistribution structure. The redistribution structure includes a first insulating layer, a second insulating layer interposed between the first insulating layer and the integrated circuit die, and a first metallization pattern in the first insulating layer and the second insulating layer. The first metallization pattern includes a first conductive line and a first conductive via coupled to the first conductive line. The first conductive line is in the second insulating layer. The first conductive via is in the first insulating layer. The first conductive line includes a first conductive pad coupled to the first conductive via, a second conductive pad, and a curved portion connecting the first conductive pad to the second conductive pad. The UBM structure includes a second conductive via extending trough the second insulating layer and being coupled to the second conductive pad, a third conductive pad coupled to the second conductive via, and a conductive column coupled to the third conductive pad. The third conductive pad is interposed between the second conductive via and the integrated circuit die. The conductive column is interposed between the third conductive pad and the integrated circuit die.

Embodiments may include one or more of the following features. The redistribution structure further includes a third insulating layer and a second metallization pattern in the first insulating layer and the third insulating layer. The first insulating layer is interposed between the third insulating layer and the second insulating layer. The second metallization pattern includes a second conductive line and a third conductive via coupled to the second conductive line. The second conductive line is in the first insulating layer. The third conductive via is in the third insulating layer. The third conductive via and the first conductive via are vertically stacked. The first conductive via and the second conductive via are disposed within a perimeter of the third conductive pad in a plan view. The conductive column is disposed within a perimeter of the third conductive pad in a plan view. A width of the conductive column is less than a width of the third conductive pad in a plan view. A center of the conductive column is shifted with respect to a center of the third conductive pad in a plan view. A center of the first conductive via is shifted with respect to a center of the third conductive pad in a plan view. A center of the second conductive via is shifted with respect to a center of the third conductive pad in a plan view. The first conductive via fully overlaps with the conductive column in a plan view. The second conductive via partially overlaps with the conductive column in a plan view.

In accordance with another embodiment, a package structure includes an interposer die, the interposer die including a die connector, a first conductive pad coupled to the die connector, and a redistribution structure bonded to first conductive pad. The redistribution structure includes a first insulating layer, a second insulating layer, a third insulating layer, and a first metallization pattern in the first insulating layer and the second insulating layer. The first insulating layer is interposed between the second insulating layer and the first conductive pad. The second insulating layer is interposed between the third insulating layer and the first insulating layer. The first metallization pattern includes a first conductive line and a first conductive via coupled to the first conductive line. The first conductive line is in the second insulating layer. The first conductive via extends through the first insulating layer and is coupled to the first conductive pad. The first conductive line includes a second conductive pad coupled to the first conductive via, a third conductive pad, and a curved portion connecting the second conductive pad to the third conductive pad. The redistribution structure further includes a second metallization pattern in the second insulating layer and the third insulating layer. The second metallization pattern includes a second conductive via. The second conductive via extends through the second insulating layer and is coupled to the third conductive pad of the first conductive line.

Embodiments may include one or more of the following features. The first conductive via and the second conductive via are disposed within a perimeter of the first conductive pad in a plan view. A width of the die connector is less than a width of the first conductive pad in a plan view. A center of the die connector is shifted with respect to a center of the first conductive pad in a plan view. A center of the first conductive via is shifted with respect to a center of the first conductive pad in a plan view. A center of the second conductive via is shifted with respect to a center of the first conductive pad in a plan view.

In accordance with yet another embodiment, a method includes forming a redistribution structure over a carrier substrate. Forming the redistribution structure includes forming a first insulating layer over the carrier substrate. A first metallization pattern is formed in and along an upper surface of the first insulating layer. The first metallization pattern includes a first conductive line and a first conductive via coupled to the first conductive line. The first conductive line extends along the upper surface of the first insulating layer. The first conductive via extends through the first insulating layer. The first conductive line includes a first conductive pad coupled to the first conductive via, a second conductive pad, and a curved portion connecting the first conductive pad to the second conductive pad. The method further includes forming a second insulating layer over the first insulating layer and the first metallization pattern, and forming an under-bump metallization (UBM) structure over the redistribution structure. Forming the UBM structure includes forming a second conductive via in the second insulating layer. The second conductive via is coupled to the second conductive pad. A third conductive pad is formed over the second conductive via. A conductive column is formed over the third conductive pad. The third conductive pad electrically couples the conductive column to the second conductive via.

Embodiments may include one or more of the following features. An integrated circuit die is bonded to the UBM structure using a conductive connector. A center of the conductive column is shifted with respect to a center of the third conductive pad in a plan view. A center of the first conductive via is shifted in a first direction with respect to a center of the third conductive pad in a plan view. A center of the second conductive via is shifted in a second direction with respect to the center of the third conductive pad in the plan view. The first direction is different from the second direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure comprising:
an integrated circuit die;
a redistribution structure bonded to the integrated circuit die, the redistribution structure comprising:
a first insulating layer;
a second insulating layer interposed between the first insulating layer and the integrated circuit die; and
a first metallization pattern in the first insulating layer and the second insulating layer, the first metallization pattern comprising a first conductive line and a first conductive via coupled to the first conductive line, the first conductive line being in the second insulating layer, the first conductive via being in the first insulating layer, the first conductive line comprising:
a first conductive pad coupled to the first conductive via;
a second conductive pad; and
a curved portion connecting the first conductive pad to the second conductive pad; and
an under-bump metallization (UBM) structure between the integrated circuit die and the redistribution structure, the UBM structure electrically coupling the integrated circuit die to the redistribution structure, the UBM structure comprising:
a second conductive via extending through the second insulating layer and being coupled to the second conductive pad;
a third conductive pad directly contacting the second conductive via, the third conductive pad being interposed between the second conductive via and the integrated circuit die, wherein the third conductive pad is circular in a plan view, wherein the first conductive line is disposed entirely within a perimeter of the third conductive pad in the plan view; and
a conductive column coupled to the third conductive pad, the conductive column being interposed between the third conductive pad and the integrated circuit die.

2. The package structure of claim 1, wherein the redistribution structure further comprises:
a third insulating layer, the first insulating layer being interposed between the third insulating layer and the second insulating layer; and
a second metallization pattern in the first insulating layer and the third insulating layer, the second metallization pattern comprising a second conductive line and a third conductive via coupled to the second conductive line, the second conductive line being in the first insulating layer, the third conductive via being in the third insulating layer, wherein the third conductive via and the first conductive via are vertically stacked.

3. The package structure of claim 1, wherein the conductive column is disposed within a perimeter of the third conductive pad in a plan view.

4. The package structure of claim 1, wherein a width of the conductive column is less than a width of the third conductive pad in a plan view.

5. The package structure of claim 1, wherein a center of the conductive column is offset from a center of the first conductive via and the second conductive via in a plan view.

6. The package structure of claim 1, wherein a center of the first conductive via is shifted with respect to a center of the third conductive pad in a plan view.

7. The package structure of claim 1, wherein a center of the second conductive via is shifted with respect to a center of the third conductive pad in a plan view.

8. The package structure of claim 1, wherein the first conductive via fully overlaps with the conductive column in a plan view.

9. The package structure of claim 1, wherein the second conductive via partially overlaps with the conductive column in a plan view.

10. The package structure of claim 1, wherein the conductive column only partially overlaps the second conductive via.

11. The package structure of claim 10, wherein the conductive column completely overlaps the first conductive via.

12. A package structure comprising:
an interposer die, the interposer die comprising a die connector;
a first conductive pad directly contacting the die connector, wherein the first conductive pad is circular in a plan view; and
a redistribution structure bonded to first conductive pad, the redistribution structure comprising:
a first insulating layer;
a second insulating layer, the first insulating layer being interposed between the second insulating layer and the first conductive pad;
a third insulating layer, the second insulating layer being interposed between the third insulating layer and the first insulating layer, wherein the first insulating layer is thicker than the second insulating layer and the third insulating layer;
a first metallization pattern in the first insulating layer and the second insulating layer, the first metallization pattern comprising a first conductive line and a first conductive via coupled to the first conductive line, the first conductive line being in the second insulating layer, the first conductive via extending through the first insulating layer and being coupled to the first conductive pad, the first conductive line comprising:
a second conductive pad coupled to the first conductive via;
a third conductive pad; and
a curved portion connecting the second conductive pad to the third conductive pad, wherein the second conductive pad, the third conductive pad, and the curved portion are completely within a perimeter of first conductive pad in a plan view; and
a second metallization pattern in the second insulating layer and the third insulating layer, the second metallization pattern comprising a second conductive via, the second conductive via extending through the second insulating layer and being coupled to the third conductive pad of the first conductive line.

13. The package structure of claim 12, wherein a width of the die connector is less than a width of the first conductive pad in the plan view.

14. The package structure of claim 12, wherein a center of the die connector is shifted with respect to a center of the first conductive pad in the plan view.

15. The package structure of claim 12, wherein a center of the first conductive via is shifted with respect to a center of the first conductive pad in the plan view.

16. The package structure of claim 12, wherein a center of the second conductive via is shifted with respect to a center of the first conductive pad in the plan view.

17. A package structure comprising:
a first die having a first conductive pad;
a second die having a second conductive pad; and
a redistribution structure having a first conductive pad on a first side and a second conductive pad on a second side, wherein the first side faces an opposite direction than the second side, wherein the first conductive pad of the first die is electrically coupled to the first conductive pad on the first side of the redistribution structure, wherein the second conductive pad of the second die is electrically coupled to the second conductive pad on the second side of the redistribution structure, wherein the redistribution structure is between the first die and the second die, wherein the redistribution structure comprises:

one or more stacked vias between the first side and the second side; and a first metallization pattern electrically interposed between the one or more stacked vias and the first die, wherein the first metallization pattern has a first C-shape in a plan view, the first C-shape having a first pad portion, a second pad portion, and a line portion connecting the first pad portion to the second pad portion, first pad portion of the first C-shape being electrically coupled to a first one of the one or more stacked vias; and a first under-bump metallization electrically coupled to the second pad portion of the first C-shape with a via directly contacting the first under-bump metallization and the second pad portion, wherein the first under-bump metallization is circular, wherein the one or more stacked vias, the first metallization pattern, and the first under-bump metallization electrically connect the first conductive pad of the first die to the second conductive pad of the second die, wherein the first C-shape is completely within a perimeter of first under-bump metallization in a plan view.

18. The package structure of claim 17, wherein the redistribution structure further comprises:

a second metallization pattern electrically interposed between the one or more stacked vias and the second die, wherein the second metallization pattern has a second C-shape in the plan view, the second C-shape having a first pad portion, a second pad portion, and a line portion connecting the first pad portion of the second C-shape to the second pad portion of the second C-shape.

19. The package structure of claim 18, wherein the first conductive pad of the first die overlaps the first pad portion of the first C-shape and the second pad portion of the first C-shape in the plan view.

20. The package structure of claim 18, wherein the redistribution structure further comprises a conductive landing pad between the one or more stacked vias and the second conductive pad of the second die, wherein the conductive landing pad completely overlaps the second C-shape in a plan view.

* * * * *